(12) United States Patent
Kodama et al.

(10) Patent No.: US 7,273,690 B2
(45) Date of Patent: Sep. 25, 2007

(54) POSITIVE RESIST COMPOSITION FOR IMMERSION EXPOSURE AND METHOD OF PATTERN FORMATION WITH THE SAME

(75) Inventors: Kunihiko Kodama, Shizuoka (JP); Hiromi Kanda, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/060,530

(22) Filed: Feb. 18, 2005

(65) Prior Publication Data

US 2005/0186505 A1    Aug. 25, 2005

(30) Foreign Application Priority Data

Feb. 20, 2004    (JP) ............... P.2004-043990

(51) Int. Cl.
*G03F 7/00*    (2006.01)
*G03F 7/004*    (2006.01)

(52) U.S. Cl. .................... 430/270.1; 430/311
(58) Field of Classification Search ............. 430/270.1, 430/311
See application file for complete search history.

(56) References Cited

U.S. PATENT DOCUMENTS

| | | | |
|---|---|---|---|
| 4,480,910 A | | 11/1984 | Takanashi et al. |
| 6,268,106 B1 * | | 7/2001 | Park et al. ............... 430/270.1 |
| 6,280,898 B1 * | | 8/2001 | Hasegawa et al. ........ 430/270.1 |
| 6,593,056 B2 * | | 7/2003 | Takeda et al. .............. 430/170 |
| 6,677,419 B1 * | | 1/2004 | Brock et al. ................ 526/281 |
| 6,781,670 B2 * | | 8/2004 | Krautschik ................... 355/53 |
| 6,788,477 B2 * | | 9/2004 | Lin .............................. 359/820 |
| 6,841,331 B2 * | | 1/2005 | Barclay et al. ........... 430/270.1 |
| 6,849,381 B2 * | | 2/2005 | Barclay et al. ........... 430/270.1 |
| 6,878,501 B2 * | | 4/2005 | Hatakeyama et al. .... 430/270.1 |
| 6,897,005 B2 * | | 5/2005 | Choi et al. ................ 430/270.1 |
| 2004/0146802 A1 * | | 7/2004 | Yamamoto et al. ....... 430/270.1 |
| 2005/0019689 A1 * | | 1/2005 | Kodama .................. 430/270.1 |

FOREIGN PATENT DOCUMENTS

| | | | |
|---|---|---|---|
| EP | 1500977 A1 * | 1/2005 |
| JP | 57-153433 A | 9/1982 |
| JP | 7-220990 A | 8/1995 |
| JP | 10-303114 A | 11/1998 |
| JP | 2004233661 A * | 8/2004 |

OTHER PUBLICATIONS

B.J. Lin, "Semiconductor Foundry, Lithography, and Partners", Proceedings of SPIE, vol. 4688, 2002, pp. 11-24.
J. A. Hoffnagle, et al. "Liquid immersion deep-ultraviolet interferometric lithography", J. Vac. Sci. Technol. B, vol. 17, No. 6, Nov./Dec. 1999, pp. 3306-3309.

* cited by examiner

*Primary Examiner*—Amanda Walke
(74) *Attorney, Agent, or Firm*—Sughrue Mion PLLC.

(57) ABSTRACT

A positive resist composition for immersion exposure which comprises (A) a resin which enhances its solubility in an alkaline developer by the action of an acid and (B) at least one compound which generates an acid upon irradiation with an actinic ray or a radiation, the compound being selected from the following (Ba) to (Bc): (Ba) a sulfonium salt compound having a specific alkyl or cycloalkyl residue in the cation part, (Bb) a sulfonium salt compound having a specific alkyl or cycloalkyl residue in the cation part, and (Bc) a sulfonium salt compound having a specific alkyl or cycloalkyl residue in the anion part; and a method of pattern formation with the composition.

20 Claims, 1 Drawing Sheet

POSITIVE RESIST COMPOSITION FOR IMMERSION EXPOSURE AND METHOD OF PATTERN FORMATION WITH THE SAME

BACKGROUND OF THE INVENTION

1. Field of the Invention

The present invention relates to a positive resist composition for use in lithographic steps in the production of semiconductors, e.g., IC's, in the production of circuit boards for liquid crystals, thermal heads, etc., and in other photofabrication processes, and further relates to a method of pattern formation with the same, In particular, the invention relates to a positive resist composition suitable for exposure with an immersion exposure type projection exposure apparatus employing far ultraviolet rays having a wavelength of 300 nm or shorter as an exposure light, and to a method of pattern formation with the composition.

2. Description of the Related Art

With the trend toward size reduction in semiconductor elements, the wavelengths of exposure lights are decreasing and the numerical apertures (NA) of projection lenses are increasing. An exposure apparatus which has an NA of 0.84 and employs an ArF excimer laser having a wavelength of 193 nm as a light source has been developed so far. As is generally well known, resolution and focal depth can be expressed by the following equations:

(Resolution)=$k_1 \cdot (\lambda/NA)$ (Focal depth)=$\pm k_2 \cdot \lambda/NA^2$ wherein $\lambda$ is the wavelength of the exposure light, NA is the numerical aperture of the projection lens; and $k_1$ and $k_2$ are coefficients relating to the process.

An exposure apparatus employing an $F_2$ excimer laser having a wavelength of 157 nm as a light source is being investigated for the purpose of enhancing resolution by using a shorter wavelength. However, use of this apparatus is disadvantageous in that materials for the lens to be used in the exposure apparatus and materials for resists are considerably limited due to the use of such a shorter wavelength. Because of this, the cost of apparatus and material production is high and it is exceedingly difficult to stabilize quality. There is hence a possibility that an exposure apparatus and a resist which have sufficient performances and stability might be not available in a desired period.

The so-called immersion method has been known as a technique for enhancing resolution in examinations with optical microscopes. In this method, the space between the projection lens and the sample is filled with a liquid having a high refractive index (hereinafter referred to also as "immersion liquid").

This "immersion" has the following effects. In the immersion, the resolution and the focal depth can be expressed by the following equations on the assumption that $NA_0=\sin \theta$:

(Resolution)=$k_1 \cdot (\lambda_0/n)/NA_0$ (Focal depth)=$\pm k_2 \cdot (\lambda_0/n)/NA_0^2$ wherein $\lambda_0$ is the wavelength of the exposure light in air; n is the refractive index of the immersion liquid relative to that of air; and $\theta$ is the convergence half angle of the light.

Namely, the immersion produces the same effect as the use of an exposure light having a wavelength reduced to 1/n. In other words, in the case of an optical projection system having the same NA, the focal depth can be increased to n times by the immersion. This is effective in all pattern shapes and can be used in combination with a super resolution technique such as the phase shift method or the deformation illumination method.

Examples of apparatus in which this effect is applied to the transfer of fine circuit patterns for semiconductor elements are described in JP-A-57-153433, JP-A-7-220990, etc. However, no resist suitable for the immersion exposure technique is discussed therein.

JP-A-10-303114 points out that a change in refractive index of the immersion liquid causes deterioration of projected images due to the wave surface aberration for the exposure apparatus and, hence, it is important to regulate the refractive index of the immersion liquid. To regulate the temperature coefficient of refractive index of an immersion liquid to a value within a certain range is disclosed in this document. Water containing an additive which serves to lower surface tension or heighten surface activity is also disclosed therein as a preferred immersion liquid. However, in this document also, additives are not specifically disclosed and no resist suitable for the immersion exposure technique is discussed.

JP-B-63-49893, a pattern forming method based on the liquid immersion process is disclosed.

WO 2004/068242A1 specification, there is disclosed a resist composition, which is used for a resist pattern formation method including a liquid immersion exposure step, characterized by that the increment in film thickness when immersed in water does not exceed 1.0 nm.

WO 2004/074937A1 specification, materials are disclosed for forming a resist-protecting film suited for the liquid immersion exposure process to be provided on a resist film.

Recent progress in the immersion exposure technique is reported in *SPIE Proc*, 4688, 11(2002), *J. Vac. Sci. Technol.*, B 17(1999), etc. In the case where an ArF excimer laser is used as a light source, pure water (refractive index at 193 nm, 1.44) is thought to be most promising from the standpoints of safety in handling and transmittance and refractive index at 193 nm. Although solutions containing fluorine are being investigated for use in the case of using an $F_2$ excimer laser as a light source from the standpoint of a balance between transmittance and refractive index at 157 nm, no immersion liquid has been found which is sufficient from the standpoints of environmental safety and refractive index. In view of the degree of the effect of the immersion and the degree of completion of resists, the technique of immersion exposure is thought to be employed first in ArF exposure apparatus.

Since the advent of resists for KrF excimer lasers (248 nm), the technique of image formation called chemical amplification has been used as a resist image formation method for compensating for a sensitivity decrease caused by light absorption. For example, the chemical amplification type method for forming a positive image comprises exposing a resist film to light to thereby cause an acid generator in the exposed areas to decompose and generate an acid, subjecting the resist film to post-exposure bake (PEB) to utilize the resultant acid as a reaction catalyst to convert alkali-insoluble groups into alkali-soluble groups, and removing the exposed areas by alkali development.

When a chemical amplification type resist is applied to the technique of immersion exposure, the acid which has generated upon exposure and is present in the resist surface moves to the immersion liquid to change the acid concentration in the surface of the exposed areas. This is thought to be considerably akin to the acid deactivation in exposed-area surfaces which is caused by basic contaminants which have come from the environment in an exceedingly slight amount on the order of ppb during a time delay between the exposure and PEB (PED: post-exposure time delay); the acid deactivation was a serious problem in the initial stage of the development of chemical amplification type positive resists. However, influences of immersion exposure on the resist and the mechanism thereof have not been elucidated.

In immersion exposure, the space between the resist film and the optical lens is filled with an immersion liquid (hereinafter sometimes referred to as an "immersion liquid") and the resist film in this state is exposed to light through a photomask to thereby transfer the pattern of the photomask to the resist film. It is expected that the immersion liquid infiltrates into inner parts of the resist film to thereby influence the chemical reactions to be induced in the resist during or after the exposure (acid-catalyzed protection-eliminating reaction and development reaction). However, the degree and mechanism of this influence also have not been elucidated.

For example, when a chemical amplification type resist showing satisfactory PED stability in ordinary exposure is used in immersion exposure, then resist pattern falling and profile deterioration occur as a result of a time delay between exposure and PEB. An improvement in this point has been required.

SUMMARY OF THE INVENTION

An object of the invention, in view of those problems of related-art techniques, is to provide a positive resist composition suitable for immersion exposure and improved in the resist pattern falling and profile deterioration caused by a time delay between exposure and PEB in the immersion exposure method. Another object of the invention is to provide a method of pattern formation with the composition.

The invention provides a positive resist composition for immersion exposure which has the following constitutions and a method of pattern formation with the same. Those objects of the invention are accomplished with these.

(1) A positive resist composition for immersion exposure comprising: (A) a resin which enhances a solubility of the resin in an alkaline developer by an action of an acid; and (B) at least one compound which generates an acid upon irradiation with one of an actinic ray and a radiation, the compound (B) being selected from (Ba) to (Bc), (Ba) a sulfonium salt compound having in its cation part an alkyl or cycloalkyl residue which has 2 or more carbon atoms and has not been substituted by fluorine, (Bb) a sulfonium salt compound having in its cation part a fluorine-substituted alkyl or cycloalkyl residue having 1 or more carbon atoms, and (Bc) a sulfonium salt compound having in its anion part an alkyl or cycloalkyl residue which has 2 or more carbon atoms and has not been substituted by fluorine.

(2) The positive resist composition for immersion exposure as described in (1), wherein the resin (A) has a repeating unit having a group which is dissociable with an acid and is represented by general formula (I):

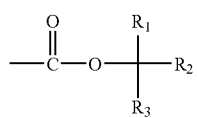

wherein
$R_1$ to $R_3$ each independently represents an alkyl group, a cycloalkyl group, or an alkenyl group, and at least two of $R_1$ to $R_3$ may be bonded to each other to form a ring.

(3) The positive resist composition for immersion exposure as described in (1) wherein the compound (Ba) is a triphenylsulfonium salt compound substituted by an alkyl or cycloalkyl group which has 2 or more carbon atoms and has not been substituted by fluorine.

(4) The positive resist composition for immersion exposure as described in (1), wherein the anion part of the compound (Bc) is an alkanesulfonic acid anion in which an α-position of a sulfonic acid is substituted by fluorine, the alkanesulfonic acid anion comprising at its end an alkyl or cycloalkyl residue which has 2 or more carbon atoms and has not been substituted by fluorine.

(5) A positive resist composition for liquid immersion exposure as described in one of (1) to (4) wherein a content of the compound (B) is from 1 to 7% by mass in a total solid content of the positive resist composition.

(6) A method of pattern formation which comprises: forming a resist film with a positive resist composition for immersion exposure as described in any one of (1) to (5); exposing the resist film to light through an immersion liquid, so as to form an exposed resist film; and developing the exposed resist film.

In the following, preferable embodiments for practicing the present invention are cited.

(7) A positive resist composition for liquid immersion exposure as described in one of (1), (2), (4) and (5), which comprises at least one kind of the sulfonium salt compound (Bc).

(8) A positive resist composition for liquid immersion exposure as described in one of (1) to (5) and (7), further comprising a nitrogen-containing compound (Ca) which has no oxygen atom.

(9) A positive resist composition for liquid immersion exposure as described in one of (1) to (5), (7) and (8), further comprising a fluorochemical nonionic surfactant (Da).

DETAILED DESCRIPTION OF THE INVENTION

Figure 1:
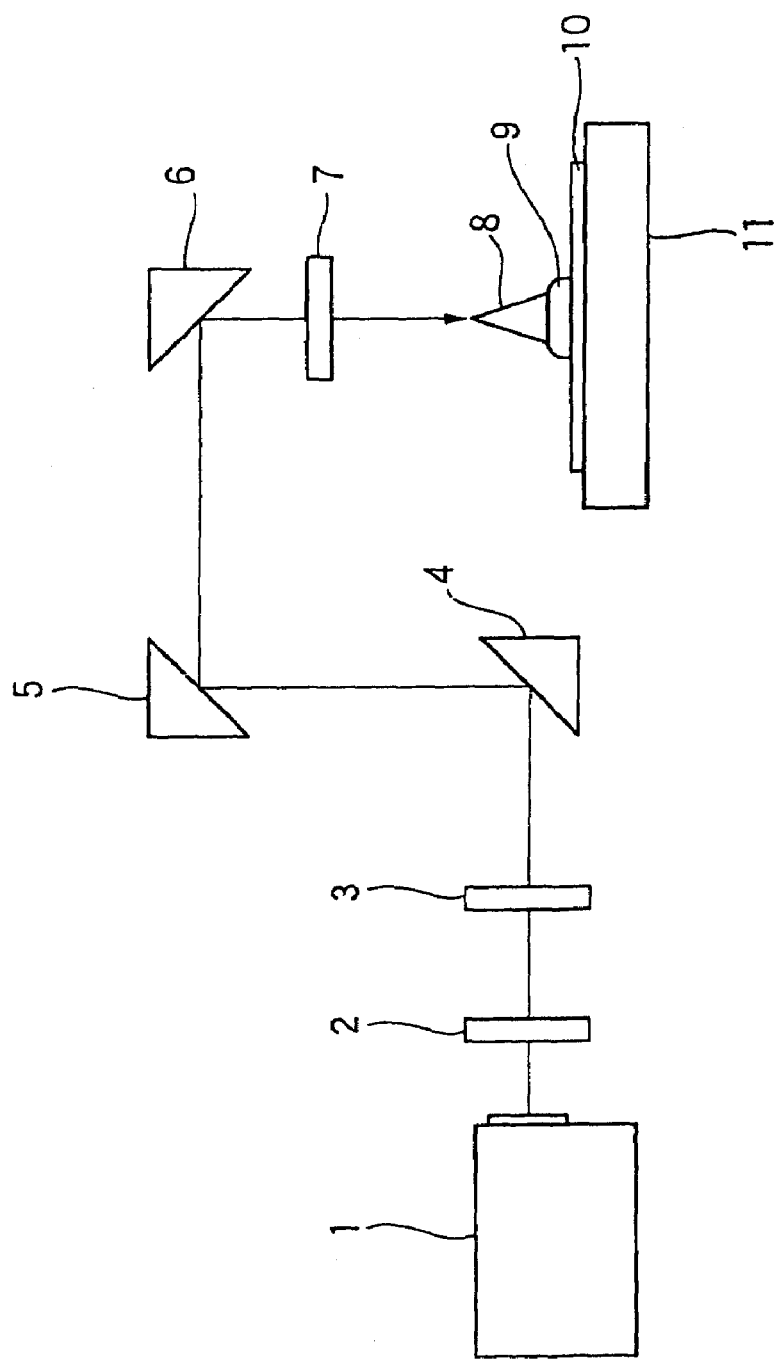
FIG. 1 is a diagrammatic view of a two-beam interference exposure experiment apparatus.

The invention will be explained below in detail.

With respect to expressions of groups (atomic groups) in this specification, the expressions which include no statement as to whether the groups are substituted or unsubstituted imply both of groups having no substituents and groups having one or more substituents. For example, the term "alkyl group" implies not only an alkyl group having no substituents (unsubstituted alkyl group) but also an alkyl group having one or more substituents (substituted alkyl group).

(A) Resin which Enhances Its Solubility in Alkaline developer by Action of Acid

The positive resist composition for immersion exposure of the invention contains a resin which enhances a solubility of the resin in an alkaline developer by an action of an acid (hereinafter referred to also as "acid-decomposable resin (A)").

The acid-decomposable resin (A) preferably is a resin having a repeating unit having a group which is dissociable with an acid and is represented by the following general formula (I).

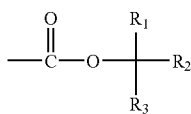

(I)

In general formula (I), $R_1$ to $R_3$ each independently represents an alkyl group, cycloalkyl group, or alkenyl group, provided that at least two of $R_1$ to $R_3$ may be bonded to each other to form a ring.

The alkyl groups represented by $R_1$ to $R_3$ preferably are alkyl groups having 1-8 carbon atoms. Examples thereof include methyl, ethyl, propyl, n-butyl, sec-butyl, 2-hexyl, and octyl.

The cycloalkyl groups represented by $R_1$ to $R_3$ may be monocyclic or polycyclic. Examples thereof include groups having a monocyclic, bicyclic, tricyclic, or tetracyclic structure having 5 or more carbon atoms, preferably 6-30 carbon atoms, especially preferably 7-25 carbon atoms.

Preferred examples of the cycloalkyl groups represented by $R_1$ to $R_3$ include adamantly, noradamantyl, decalin residues, tricyclodecanyl, tetracyclododecanyl, norbornyl, cedrol, cyclohexyl, cycloheptyl, cyclooctyl, cyclodecanyl, and cyclododecanyl. More preferred are adamantly, decalin residues, norbornyl, cedrol, cyclohexyl, cycloheptyl, cyclooctyl, cyclodecanyl, and cyclododecanyl. Part of the carbon atoms in each of these cycloalkyl groups may have been replaced by a heteroatom, e.g., oxygen atom.

The alkenyl groups represented by $R_1$ to $R_3$ preferably are alkenyl groups having 2-8 carbon atoms. Examples thereof include vinyl, allyl, butenyl, and cyclohexenyl.

The alkyl, cycloalkyl, and alkenyl groups represented by $R_1$ to $R_3$ may have substituents. Examples of the substituents include alkyl groups, halogen atoms, and hydroxy, alkoxy, carboxyl, alkoxycarbonyl, cyano, and ester groups. The alkyl groups preferably are lower alkyl groups such as methyl, ethyl, propyl, isopropyl, and butyl. More preferably are methyl, ethyl, propyl, and isopropyl. Examples of the alkoxy groups include ones having 1-4 carbon atoms, such as methoxy, ethoxy, propoxy, and butoxy. The alkyl groups and alkoxy groups may further have substituents. Examples of the substituents which may be possessed by the alkyl groups and alkoxy groups include hydroxy, halogen atoms, and alkoxy groups.

At least two of $R_1$ to $R_3$ may be bonded to each other to form a ring. In this case, these may be bonded through a heteroatom, e.g., oxygen atom.

The repeating unit having a group represented by general formula (I) may be any repeating unit. However, it is preferably a repeating unit represented by the following general formula (pA).

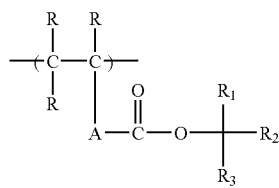

(pA)

In general formula (pA), R represents a hydrogen atom, a halogen atom, or a substituted or unsubstituted, linear or branched alkyl group having 1-4 carbon atoms. The R's may be the same or different.

Symbol A represents one member or a combination of two or more members selected from the group consisting of a single bond and alkylene, ether, thioether, carbonyl, ester, amide, sulfonamide, urethane, and urea groups. The alkylene groups may have substituents.

$R_1$ to $R_3$ have the same meaning as the $R_1$ to $R_3$ in general formula (I).

The repeating unit represented by general formula (pA) most preferably is a repeating unit derived from a 2-alkyl-2-adamantyl(meth)acrylate or a dialkyl(1-adamantyl)methyl (meth)acrylate.

Specific examples of the repeating unit represented by general formula (pA) are shown below.

(In the formulae, Rx is H, $CH_3$, or $CF_3$.)

1

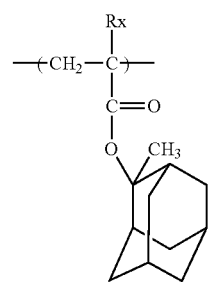

2

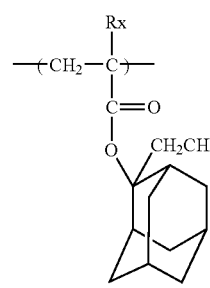

3

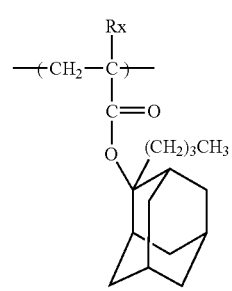

4

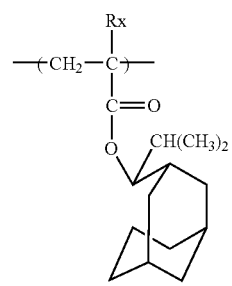

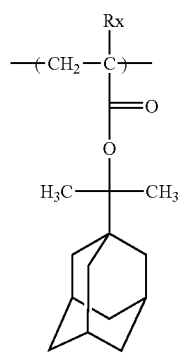
5
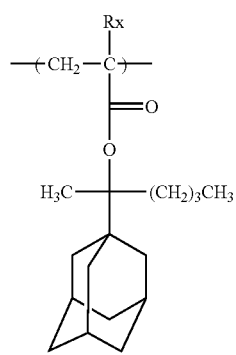
6
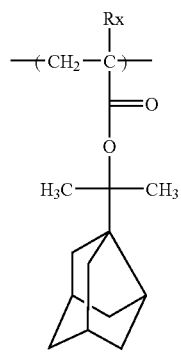
7
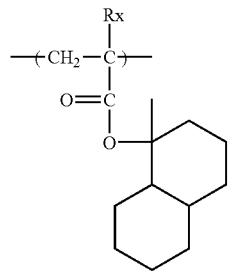
8
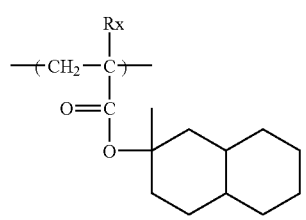
9
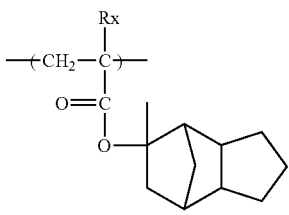
10
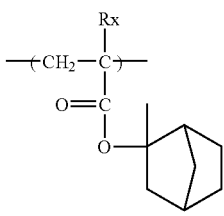
11
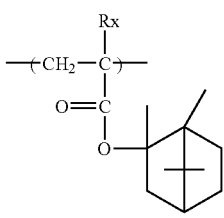
12
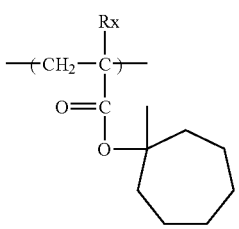
13
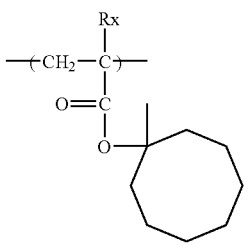
14
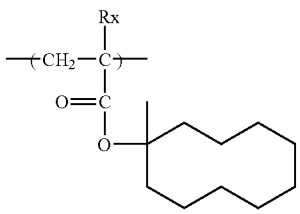
15
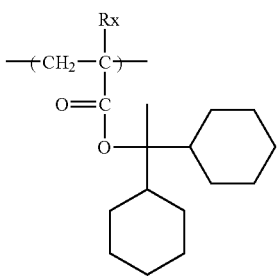
16

17

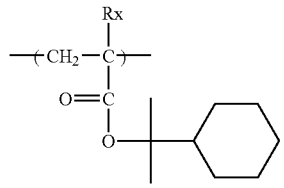

18

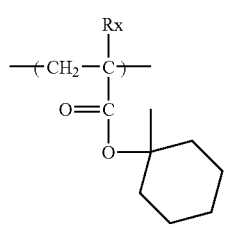

20

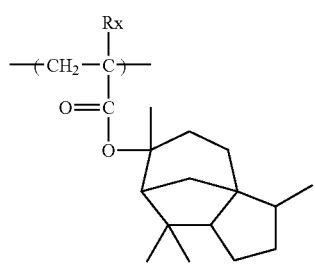

21

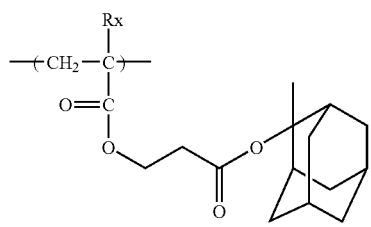

22

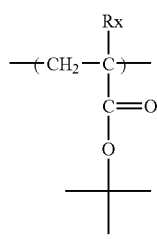

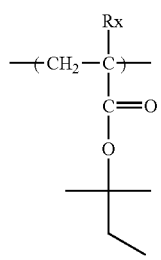

23

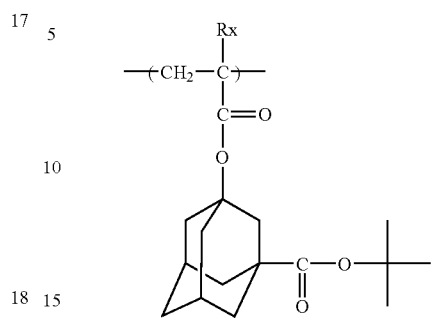

24

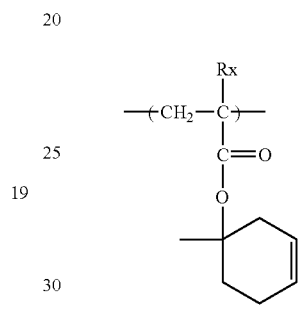

In the acid-decomposable resin (A), the content of the repeating units having a group represented by general formula (I) is preferably 10-60% by mole, more preferably 10-50% by mole, based on all repeating units.

The acid-decomposable resin (A) may have the group represented by general formula (I) as the only acid-dissociable group, or may have one or more other acid-dissociable groups in combination therewith.

Examples of the acid-dissociable groups which may be optionally possessed by the acid-decomposable resin include —O—C($R_{36}$)($R_{37}$)($R_{38}$), —O—C($R_{36}$)($R_{37}$)(O$R_{39}$), —O—C(=O)—O—C($R_{36}$)($R_{37}$)($R_{38}$), —O—C($R_{01}$)($R_{02}$)(O$R_{39}$), and —O—C($R_{01}$)($R_{02}$)—C(=O)—O—C($R_{36}$)($R_{37}$)($R_{38}$).

In the formulae, $R_{36}$ to $R_{39}$ each independently represents an alkyl, cycloalkyl, aryl, aralkyl, or alkenyl group, provided that $R_{36}$ may be bonded to $R_{37}$ or $R_{39}$ to form a ring.

$R_{01}$ and $R_{02}$ each independently represents a hydrogen atom or an alkyl, cycloalkyl, aryl, aralkyl, or alkenyl group.

Incidentally, —C($R_{36}$)($R_{37}$)($R_{38}$) means a group consisting of a carbon atom and groups $R_{36}$ to $R_{38}$ each bonded to the carbon atom through a single bond. The same applies hereinafter.

The acid-decomposable resin (A) preferably is one in which the total amount of all repeating units having an acid-dissociable group, including the repeating units having an acid-dissociable group represented by general formula (I) and repeating units having another acid-dissociable group, is preferably 10-70% by mole, more preferably 20-65% by mole, even more preferably 25-50% by mole, based on all repeating units.

The acid-decomposable resin (A) preferably has an alicyclic hydrocarbon structure which is monocyclic or polycyclic. It preferably contains at least one kind of repeating units selected from the group consisting of repeating units having a partial structure which includes an alicyclic hydrocarbon and is represented by any of the following general formulae (pI) to (pVI) and repeating units represented by the following general formula (II-AB).

First, the partial structures which include an alicyclic hydrocarbon and are represented by general formulae (pI) to (pVI) are explained.

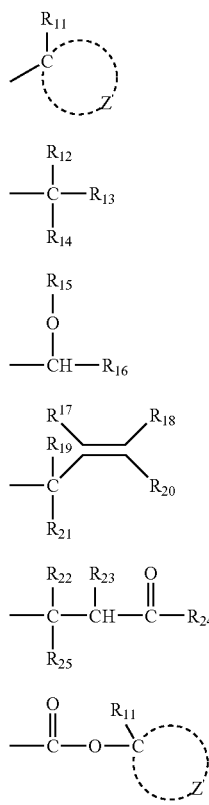

In the formulae, $R_{11}$ represents methyl, ethyl, n-propyl, isopropyl, n-butyl, isobutyl, or sec-butyl, and Z represents an atomic group necessary for forming an alicyclic hydrocarbon group in cooperation with the carbon atom.

$R_{12}$ to $R_{16}$ each independently represents a linear or branched alkyl group having 1-4 carbon atoms or an alicyclic hydrocarbon group, provided that at least one of $R_{12}$ to $R_{14}$ or either of $R_{15}$ and $R_{16}$ represents an alicyclic hydrocarbon group.

$R_{17}$ to $R_{21}$ each independently represents a hydrogen atom, a linear or branched alkyl group having 1-4 carbon atoms, or an alicyclic hydrocarbon group, provided that at least one of $R_{17}$ to $R_{21}$ represents an alicyclic hydrocarbon group and that either of $R_{19}$ and $R_{21}$ represents a linear or branched alkyl group having 1-4 carbon atoms or an alicyclic hydrocarbon group.

$R_{22}$ to $R_{25}$ each independently represents a hydrogen atom, a linear or branched alkyl group having 1-4 carbon atoms, or an alicyclic hydrocarbon group, provided that at least one of $R_{22}$ to $R_{25}$ represents an alicyclic hydrocarbon group and that $R_{23}$ and $R_{24}$ may be bonded to each other to form a ring.

In general formulae (pI) to (pVI), the alkyl groups represented by $R_{12}$ to $R_{25}$ are linear or branched alkyl groups having 1-4 carbon atoms. Examples of the alkyl groups include methyl, ethyl, n-propyl, isopropyl, n-butyl, isobutyl, sec-butyl, and t-butyl.

Examples of substituents which may be possessed by those alkyl groups include alkoxy groups having 1-4 carbon atoms, halogen atoms (fluorine, chlorine, bromine, and iodine atoms), and acyl, acyloxy, cyano, hydroxy, carboxy, alkoxycarbonyl, and nitro groups.

The alicyclic hydrocarbon groups represented by $R_{11}$ to $R_{25}$ and the alicyclic hydrocarbon group formed by Z and a carbon atom may be monocyclic or polycyclic. Examples thereof include groups having a monocyclic, bicyclic, tricyclic, or tetracyclic structure having 5 or more carbon atoms, preferably 6-30 carbon atoms, especially preferably 7-25 carbon atoms. These alicyclic hydrocarbon groups may have substituents.

Preferred examples of the alicyclic hydrocarbon groups include adamantly, noradamantyl, decalin residues, tricyclodecanyl, tetracyclododecanyl, norbornyl, cedrol, cyclohexyl, cycloheptyl, cyclooctyl, cyclodecanyl, and cyclododecanyl. More preferred are adamantly, decalin residues, norbornyl, cedrol, cyclohexyl, cycloheptyl, cyclooctyl, cyclodecanyl, and cyclododecanyl.

Examples of the substituents of those alicyclic hydrocarbon groups include alkyl groups, halogen atoms, and hydroxy, alkoxy, carboxyl, and alkoxycarbonyl groups. The alkyl groups preferably are lower alkyl groups such as methyl, ethyl, propyl, isopropyl, and butyl, and more preferably are selected from the group consisting of methyl, ethyl, propyl, and isopropyl. Examples of the alkoxy groups include ones having 1-4 carbon atoms such as methoxy, ethoxy, propoxy, and butoxy. Examples of substituents which may be possessed by those alkyl, alkoxy, and alkoxycarbonyl groups include hydoxy, halogen atoms, and alkoxy groups.

The structures represented by general formulae (pI) to (pVI) in the resin can be used for the protection of alkali-soluble groups. Examples of the alkali-soluble groups include various groups known in this technical field.

Examples thereof include carboxy, sulfo, phenol, and thiol groups. Preferred are carboxy and sulfo groups.

Preferred examples of the alkali-soluble groups protected by the structure represented by any of general formulae (pI) to (pVI) in the resin include the structure formed by replacing the hydrogen atom of a carboxyl group by the structure represented by any of general formulae (pI) to (pVI).

Examples of repeating units having the structure formed by replacing the hydrogen atom of a carboxyl group by the structure represented by any of general formulae (pI) to (pVI) include the same repeating units as those enumerated above as examples of the repeating units represented by general formula (pA).

Examples of the repeating units having an alicyclic hydrocarbon structure in a side chain farther include the following repeating units.

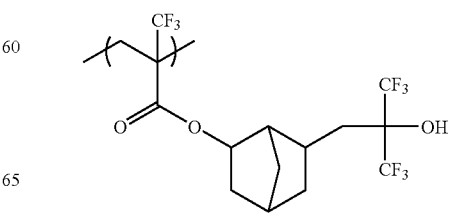

-continued

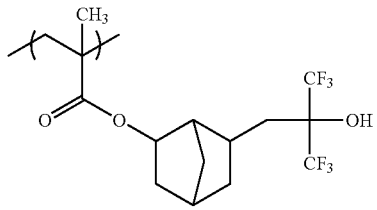

Next, the repeating units which have an alicyclic structure and are represented by general formula (II-AB) are explained.

The repeating units having an alicyclic structure and represented by general formula (II-AB) are as follows.

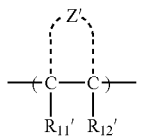

(II-AB)

In formula (II-AB), $R_{11}'$ and $R_{12}'$ each independently represents a hydrogen atom, cyano, halogen atom, or alkyl group; and Z' represents an atomic group which forms an alicyclic structure in cooperation with the two carbon atoms (C—C) bonded thereto.

The repeating units represented by general formula (II-AB) preferably are repeating units represented by the following general formula (II-A) or general formula (II-B).

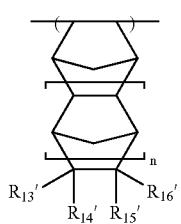

(II-A)

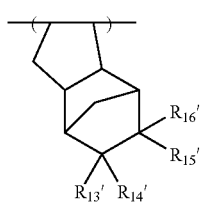

(II-B)

In formulae (II-A) and (II-B), $R_{13}'$ to $R_{16}'$ each independently represents a hydrogen atom, halogen atom, hydroxy, cyano, —COOH, —COOR$_5$, group which decomposes by the action of an acid, —C(=O)—X—A'—R$_{17}'$, alkyl group, or cyclic hydrocarbon group, at least two groups in $R_{13}'$ to $R_{16}'$ may connect together to form a ring, wherein R$_5$ represents an alkyl group, cyclic hydrocarbon group, or group —Y shown below, X represents an oxygen atom, sulfur atom, —NH—, —NHSO$_2$—, or —NHSO$_2$NH—, and A' represents a single bond or a divalent connecting group, provided that at least two of $R_{13}'$ to $R_{16}'$ may be bonded to each other form a ring; and n represents 0 or 1.

$R_{17}'$ represents —COOH, —COOR$_5$, —CN, hydroxy, alkoxy, —CO—NH—R$_6$, —CO—NH—SO$_2$—R$_6$, or group —Y shown below.

R$_6$ represents an alkyl group or a cyclic hydrocarbon group.

n represents 0 or 1.

Group —Y is as follows.

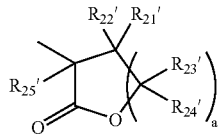 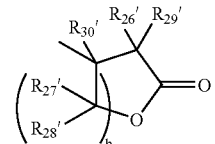

In group —Y, $R_{21}'$ to $R_{30}'$ each independently represents a hydrogen atom or an alkyl group; and a and b each represent 1 or 2.

Examples of the halogen atoms represented by $R_{11}'$ and $R_{12}'$ in general formula (II-AB) include chlorine, bromine, fluorine, and iodine atoms.

The alkyl groups represented by $R_{11}'$, $R_{12}'$, and $R_{21}'$ to $R_{30}'$ preferably are linear or branched alkyl groups having 1 to 10 carbon atoms, and more preferably are linear or branched alkyl groups having 1-6 carbon atoms. Even more preferably, the alkyl groups are methyl, ethyl, propyl, isopropyl, n-butyl, isobutyl, sec-butyl, or t-butyl.

Examples of substituents of those alkyl groups include hydroxy, halogen atoms, and carboxyl, alkoxy, acyl, cyano, and acyloxy groups. Examples of the halogen atoms include chlorine, bromine, fluorine, and iodine atoms. Examples of the alkoxy groups include ones having 1-4 carbon atoms, such as methoxy, ethoxy, propoxy, and butoxy. Examples of the acyl groups include formyl and acetyl. Examples of the acyloxy groups include acetoxy.

The atomic group represented by Z', which forms an alicyclic structure, is an atomic group which serves to form, in the resin, repeating units of an alicyclic hydrocarbon which may have one or more substituents. Especially preferred is an atomic group which forms a bridged alicyclic structure for forming bridged repeating units of an alicyclic hydrocarbon.

Examples of the framework of the alicyclic hydrocarbon to be formed include the same frameworks as those of the alicyclic hydrocarbon groups represented by $R_{11}$ to $R_{25}$ in general formulae (pI) to (pVI).

The framework of the alicyclic hydrocarbon may have one or more substituents. Examples of the substituents include $R_{13}'$ to $R_{16}'$ in general formula (II-A) or (II-B).

Of the repeating units having a bridged alicyclic hydrocarbon, repeating units represented by general formula (II-A) or (II-B) are more preferred.

In the repeating units represented by general formula (II-AB), the acid-dissociable group may be contained in the —C(=O)—X—A'—R$_{17}'$ or may be contained as a substituent possessed by the alicyclic structure formed by Z'.

The stricture of the acid-dissociable group can be expressed by —C(=O)—X$_1$—R$_0$.

Examples of R$_0$ in the formula include tertiary alkyl groups such as t-butyl and t-amyl, isobornyl, 1-alkoxyethyl groups such as 1-ethoxyethyl, 1-butoxyethyl, 1-isobutoxyethyl, and 1-cyclohexyloxyethyl, alkoxymethyl groups such as 1-methoxymethyl and 1-ethoxymethyl, 3-oxoalkyl groups, tetrahydropyranyl, tetrahydrofuranyl, trialkylsilyl ester groups, 3-oxocyclohexyl ester groups, 2-methyl-2-adamantyl, and mevalonolactone residues. $X_1$ has the same meaning as X described above.

Examples of the halogen atoms represented by $R_{13}'$ to $R_{16}'$ include chlorine, bromine, fluorine, and iodine atoms.

The alkyl groups represented by $R_5$, $R_6$, and $R_{13}'$ to $R_{16}'$ preferably are linear or branched alkyl groups having 1-10 carbon atoms, and more preferably are linear or branched alkyl groups having 1-6 carbon atoms. Even more preferably, the alkyl groups are methyl, ethyl, propyl, isopropyl, n-butyl, isobutyl, sec-butyl, or t-butyl.

Examples of the cyclic hydrocarbon groups represented by $R_5$, $R_6$, and $R_{13}'$ to $R_{16}'$ include cycloalkyl groups and bridged hydrocarbons. Specific examples thereof include cyclopropyl, cyclopentyl, cyclohexyl, adamantly, 2-methyl-2-adamantyl, norbornyl, bornyl, isobornyl, tricyclodecanyl, dicyclopentenyl, norbornene epoxy groups, menthyl, isomenthyl, neomenthyl, and tetracyclododecanyl.

Examples of the ring formed by the bonding of at least two of $R_{13}'$ to $R_{16}'$ include rings having 5-12 carbon atoms, such as cyclopentene, cyclohexene, cycloheptane, and cyclooctane.

Examples of the alkoxy group represented by $R_{17}'$ include ones having 1-4 carbon atoms, such as methoxy, ethoxy, propoxy, and butoxy.

Examples of substituents of those alkyl groups, cyclic hydrocarbon groups, and alkoxy groups include hydroxy, halogen atoms, and carboxyl, alkoxy, acyl, cyano, acyloxy, alkyl, and cyclic hydrocarbon groups. Examples of the halogen atoms include chlorine, bromine, fluorine, and iodine atoms. Examples of the alkoxy groups include ones having 1-4 carbon atoms, such as methoxy, ethoxy, propoxy, and butoxy. Examples of the acyl groups include formyl and acetyl. Examples of the acyloxy groups include acetoxy.

Examples of the alkyl groups and cyclic hydrocarbon groups include those enumerated above.

Examples of the divalent connecting group represented by A' include one group or a combination of two or more groups selected from the group consisting of alkylene, ether, thioether, carbonyl, ester, amide, sulfonamide, urethane, and urea groups.

Various substituents of $R_{13}'$ to $R_{16}'$ in general formula (II-A) or (II-B) serve as substituents of the atomic group forming an alicyclic structure in general formula (II-AB) or of the atomic group Z forming a bridged alicyclic structure in the formula.

Specific examples of the repeating units represented by general formula (II-A) or (II-B) include the following. However, the repeating units in the invention should not be construed as being limited to the following examples.

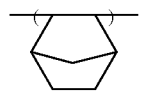
[II-1]

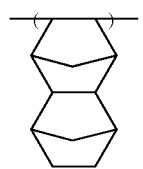
[II-2]

-continued

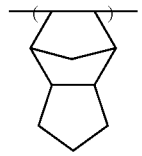
[II-3]

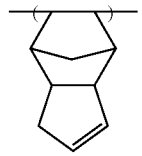
[II-4]

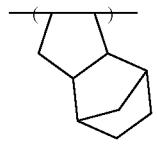
[II-5]

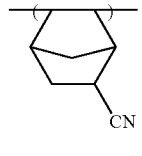
[II-6]

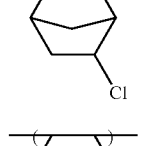
[II-7]

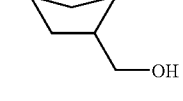
[II-8]

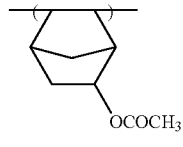
[II-9]

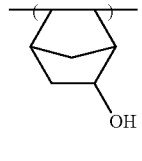
[II-10]

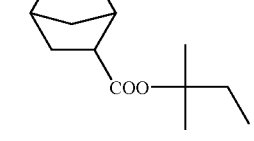
[II-11]

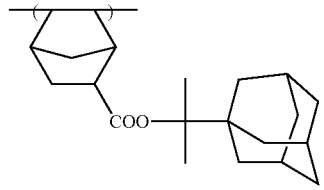
[II-12]

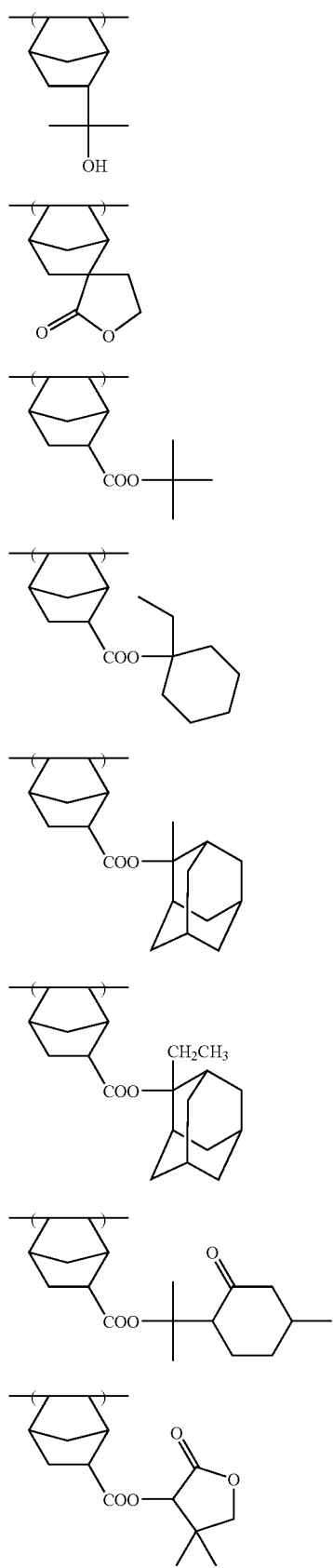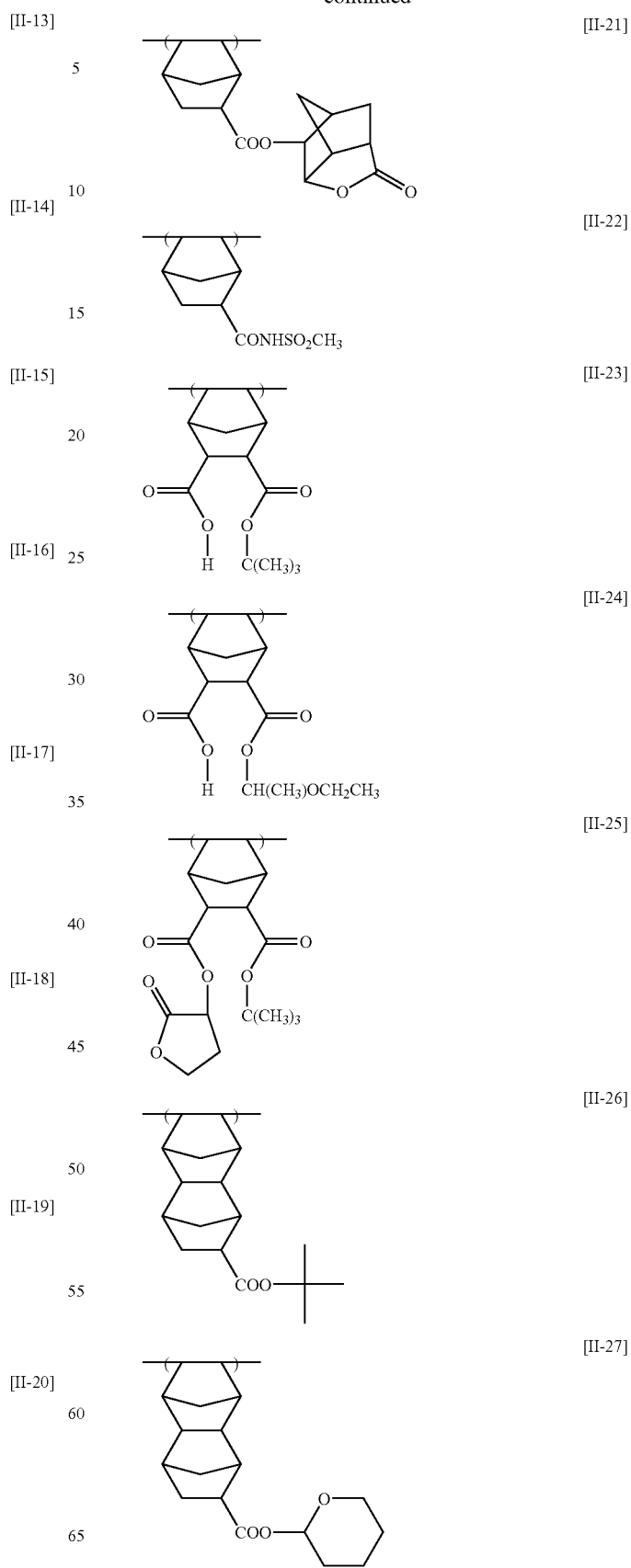

-continued

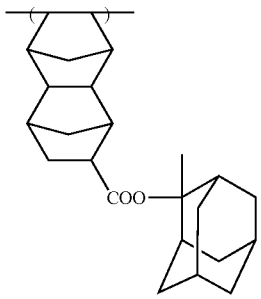
[II-28]

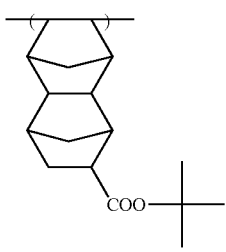
[II-29]

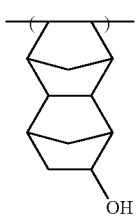
[II-30]

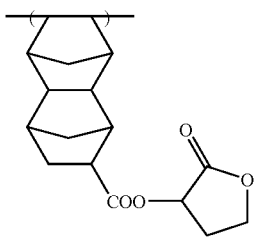
[II-31]

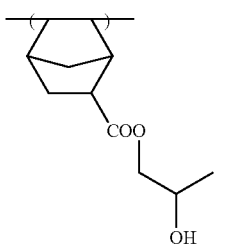
[II-32]

In the acid-decomposable resin (A), the content of the repeating units having a partial structure which includes an alicyclic hydrocarbon and is represented by any of general formulae (pI) to (pVI) is preferably 20-70% by mole, more preferably 24-65% by mole, even more preferably 28-60% by mole, based on all repeating structural units.

The content of the repeating units represented by general formula (II-AB) in the acid-decomposable resin (A) is preferably 10-60% by mole, more preferably 15-55% by mole, even more preferably 20-50% by mole, based on all repeating structural units.

In the acid-decomposable resin (A) having a monocyclic or polycyclic aliphatic hydrocarbon structure, the acid-dissociable group represented by general formula (I) and any other acid-dissociable group may be possessed by any of the repeating units having a partial structure which includes an alicyclic hydrocarbon and is represented by any of general formulae (pI) to (pVI), the repeating units represented by general formula (II-AB), and other repeating comonomer units such as those which will be described later.

The acid-decomposable resin (A) preferably has a lactone group, and more preferably has repeating units having a lactone structure represented by the following general formula (Lc) or any of the following general formulae (III-1) to (III-5). The resin may have groups having a lactone structure which have been directly bonded to the main chain.

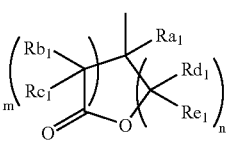
(Lc)

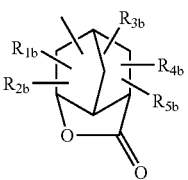
(III-1)

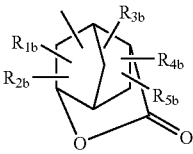
(III-2)

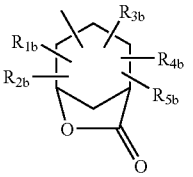
(III-3)

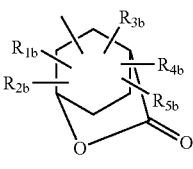
(III-4)

-continued

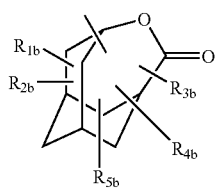
(III-5)

Ra$_1$, Rb$_1$, Rc$_1$, Rd$_1$, and Re$_1$ in general formula (Lc) each independently represents a hydrogen atom or an alkyl group. Symbols m and n each independently represents an integer of 0 to 3, provided that m+n is from 2 to 6.

In general formulae (III-1) to (III-5), R$_{1b}$ to R$_{5b}$ each independently represents a hydrocarbon atom or an alkyl, cycloalkyl, alkoxy, alkoxycarbonyl, alkylsulfonylamino, or alkenyl group, provided that two of R$_{1b}$ to R$_{5b}$ may be bonded to each other to form a ring.

Examples of the alkyl groups represented by Ra$_1$ to Re$_1$ in general formula (Lc) and of the alkyl groups in the alkyl, alkoxy, alkoxycarbonyl, and alkylsulfonylimino groups represented by R$_{1b}$ to R$_{5b}$ in general formulae (III-1) to (III-5) include linear or branched alkyl groups which may have substituents.

Preferred examples of the substituents include alkoxy groups having 1-4 carbon atoms, halogen atoms (fluorine, chlorine, bromine, and iodine atoms), acyl groups having 2-5 carbon atoms, acyloxy groups having 2-5 carbon atoms, cyano, hydroxy, carboxy, alkoxycarbonyl groups having 2-5 carbon atoms, and nitro.

Examples of the repeating units having a group having a lactone structure represented by general formula (Lc) or any of general formulae (III-1) to (III-5) include: repeating units represented by general formula (II-A) or (II-B) in which at least one of R$_{13}$' to R$_{16}$' has a group represented by general formula (Lc) or any of general formulae (III-1) to (III-5) (e.g., units in which the R$_5$ in —COOR$_5$ is a group represented by general formula (Lc) or any of general formulae (III-1) to (III-5)); and repeating units represented by the following general formula (AI).

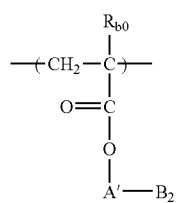
(AI)

In general formula (AI), R$_{b0}$ represents a hydrogen atom, halogen atom, or alkyl group having 1-4 carbon atoms. Preferred examples of substituents which may be possessed by the alkyl group represented by R$_{b0}$ include the substituents enumerated above as preferred substituents which may be possessed by the alkyl group represented by R$_{1b}$ in general formulae (III-1) to (III-5).

Examples of the halogen atom represented by R$_{b0}$ include fluorine, chlorine, bromine, and iodine atoms. R$_{b0}$ preferably is a hydrogen atom.

A' represents a single bond, an ether, ester, carbonyl, or alkylene group, or a divalent group consisting of a combination of two or more of these.

B$_2$ represents a group represented by general formula (Lc) or any of general formulae (III-1) to (III-5).

Specific examples of the repeating units having a group having a lactone structure are shown below, but the repeating units in the invention should not be construed as being limited to the following examples.

(In the formulae, Rx is H, CH$_3$, or CF$_3$.)

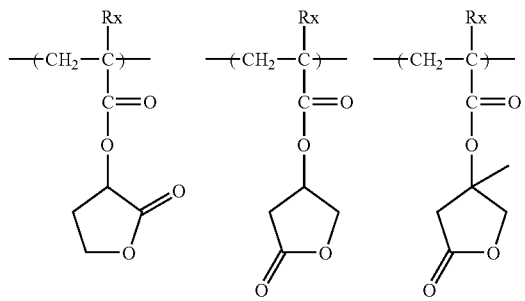

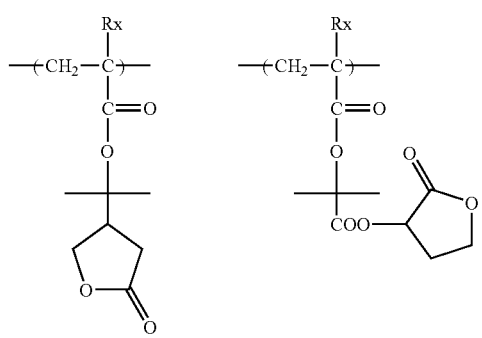

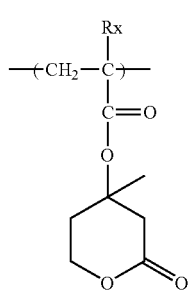
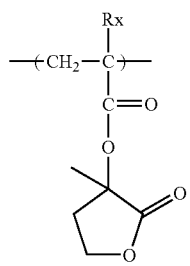

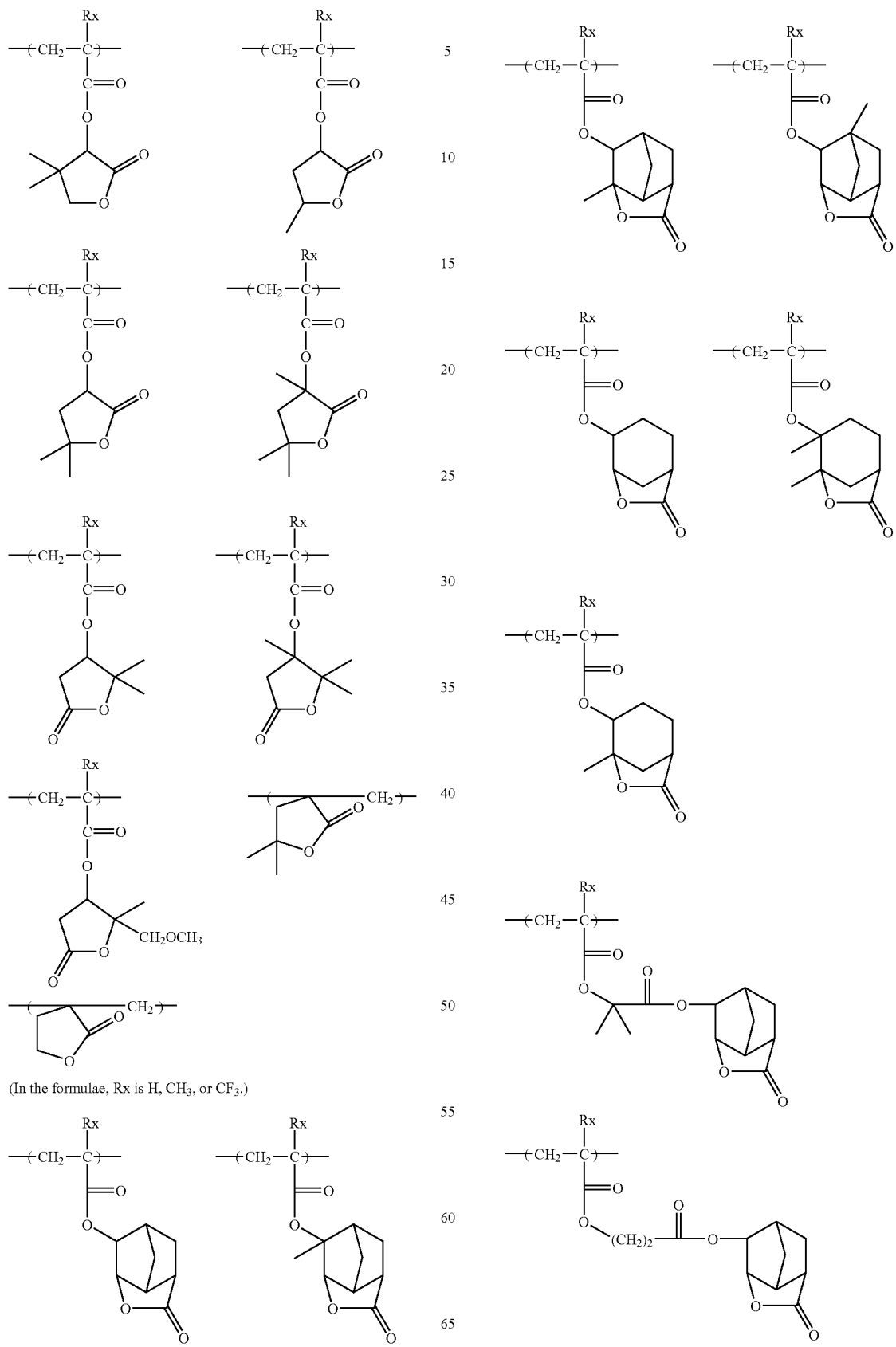
(In the formulae, Rx is H, CH₃, or CF₃.)

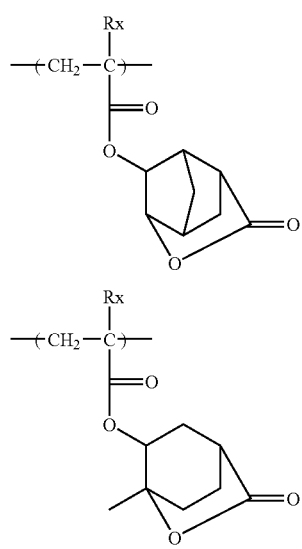
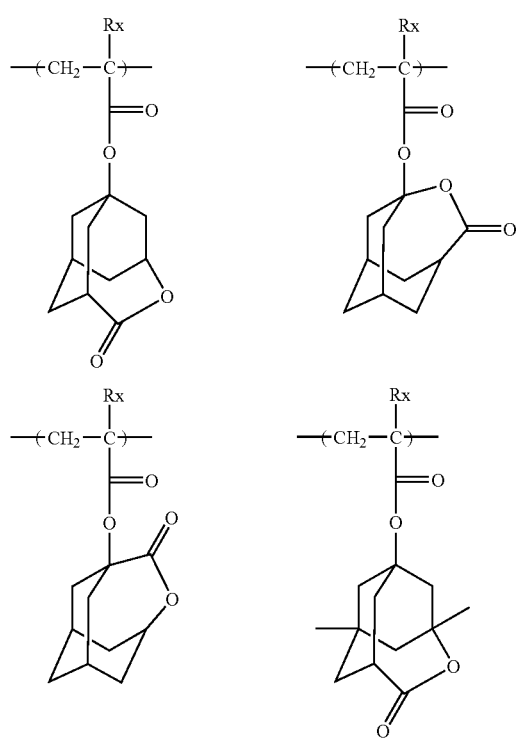
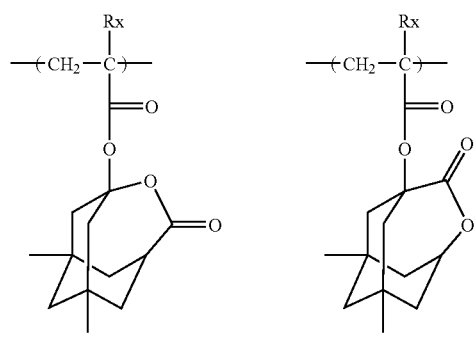
(In the formulae, Rx is H, CH₃, or CF₃.)
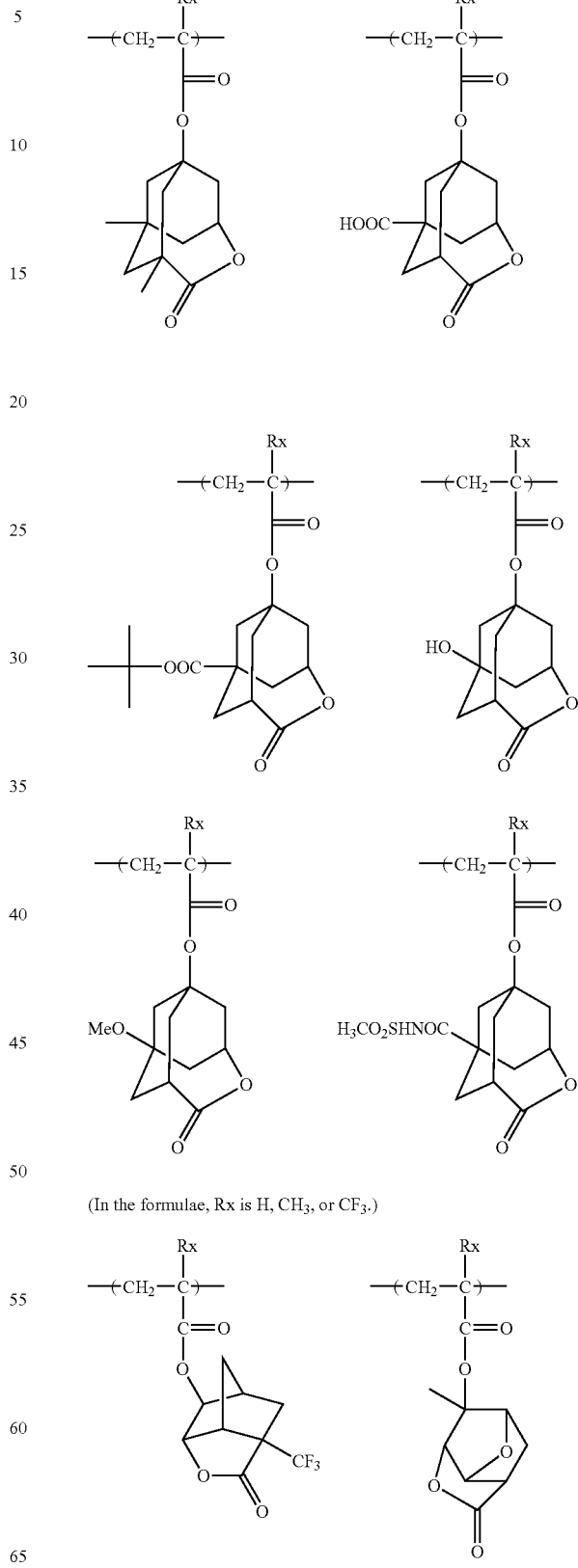
(In the formulae, Rx is H, CH₃, or CF₃.)

-continued

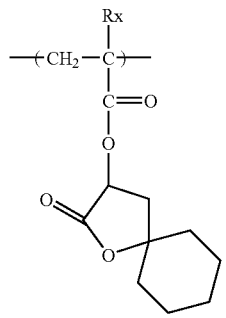 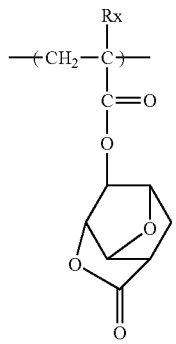 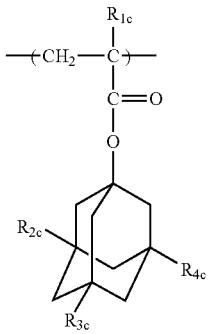

(AII)

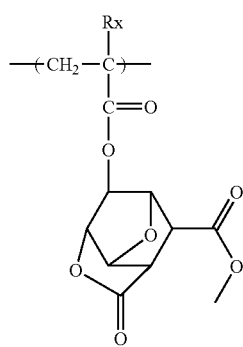 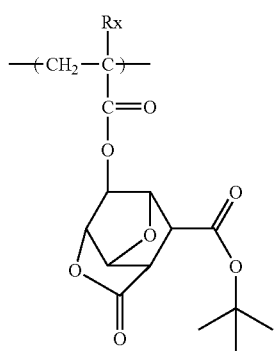

The acid-decomposable resin (A) may contain repeating units having a group represented by the following general formula (IV).

(IV)

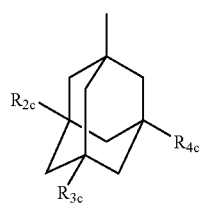

In general formula (IV), $R_{2c}$ to $R_{4c}$ each independently represents a hydrogen atom or hydroxy, provided that at least one of $R_{2c}$ to $R_{4c}$ represents hydroxy.

The group represented by general formula (IV) preferably is a group having two hydroxy groups or one hydroxy group, and more preferably is a group having two hydroxy groups.

Examples of the repeating units having a group represented by general formula (IV) include: repeating units represented by general formula (II-A) or (II-B) in which at least one of $R_{13}'$ to $R_{16}'$ has a group represented by general formula (IV); units in which the $R_5$ in —$COOR_5$ is a group represented by general formula (IV) (e.g., units in which the $R_5$ in —COOR$_5$ is a group represented by general formula (IV)); and repeating units represented by the following general formula (AII).

In general formula (AII), $R_{1c}$ represents a hydrogen atom or methyl.

$R_{2c}$ to $R_{4c}$ each independently represents a hydrogen atom or hydroxy, provided that at least one of $R_{2c}$ to $R_{4c}$ represents hydroxy. The repeating units preferably are ones in which two of $R_{2c}$ to $R_{4c}$ are hydroxy.

Specific examples of the repeating units represented by general formula (AII) are shown below, but the repeating units should not be construed as being limited to the following examples.

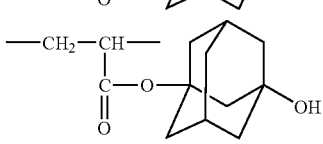
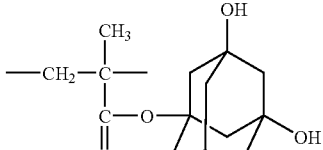

The acid-decomposable resin (A) may contain repeating units represented by the following general formula (V).

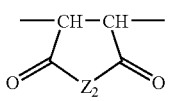

(V)

In general formula (V), $Z_2$ represents —O— or —N($R_{41}$)—. $R_{41}$ represents a hydrogen atom, hydroxy, alkyl group, or —OSO$_2$—$R_{42}$. $R_{42}$ represents an alkyl group, cycloalkyl group, or camphor residue. The alkyl group, cycloalkyl group, and camphor residue represented by $R_{41}$ or $R_{42}$ may be substituted by a halogen atom (preferably fluorine atom), etc.

Specific examples of the repeating units represented by general formula (V) include the following, but the repeating units should not be construed as being limited to these examples.

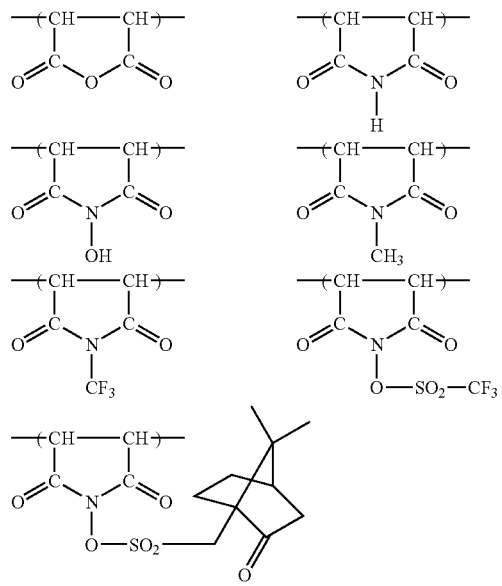

The acid-decomposable resin (A) having a group represented by general formula (I) is less influenced by immersion liquids and can hence attain a reduction in the change in resist film thickness through immersion exposure. The change in film thickness is preferably 10% or smaller, more preferably 5% or smaller, based on the thickness of the resist film as measured before the immersion exposure. The thickness of a resist film can be measured by variable-angle spectroscopic ellipsometry.

The acid-decomposable resin (A) can contain various repeating structural units besides the repeating structural units described above for the purpose of regulating dry etching resistance, suitability for standard developing solutions, adhesion to substrates, resist profile, and general properties required of resists, such as resolution, heat resistance, sensitivity, etc.

Examples of such repeating structural units include the repeating structural units corresponding to the monomers shown below, but the optional units should not be construed as being limited to these.

Thus, performances required of the resin as ingredient (A), in particular, (1) solubility in solvent for application,
(2) film-forming properties (glass transition point),
(3) alkali developability,
(4) resist loss (hydrophilicity/hydrophobicity, selection of alkali-soluble group),
(5) adhesion of unexposed areas to substrate,
(6) dry etching resistance, and the like can be delicately regulated.

Examples of such monomers include compounds having one addition-polymerizable unsaturated bond, such as acrylic esters, methacrylic esters, acrylamide and analogues thereof, methacrylamide and analogues thereof, allyl compounds, vinyl ethers, and vinyl esters.

Besides such monomers corresponding to those various repeating structural units, any addition-polymerizable unsaturated compound copolymerizable with those monomers may have been copolymerized.

In the acid-decomposable resin (A), the molar proportion of each kind of repeating structural units to be contained is suitably determined in order to regulate resist properties including dry etching resistance, suitability for standard developing solutions, adhesion to substrates, and resist profile and general performances required of resists, such as resolution, heat resistance, and sensitivity.

The content of the repeating structural units derived from those optionally usable comonomers in the resin also can be suitably determined according to the desired resist performances. In general, however, the content thereof is preferably 99% by mole or lower, more preferably 90% by mole or lower, even more preferably 80% by mole or lower, based on the total mole amount of the repeating structural units having a partial structure which includes an alicyclic hydrocarbon and is represented by any of the general formulae (pI) to (pVI) and the repeating units represented by general formula (II-AB).

In particular, the content of repeating units having a group having the lactone structure described above and that of repeating units having a group represented by general formula (IV) (hydroxyadamantane structure) are as follows.

The content of the repeating units having a group having the lactone structure is preferably 1-70% by mole, more preferably 10-70% by mole, and the content of the repeating units having a group represented by general formula (IV) is preferably 1-70% by mole, more preferably 1-50% by mole, based on the total mole amount of the repeating structural units having a partial structure which includes an alicyclic hydrocarbon and is represented by any of the general formulae (pI) to (pVI) and the repeating units represented by general formula (II-AB).

In the case where the composition of the invention is to be used for ArF exposure, the resin preferably has no aromatic group from the standpoint of transparency to ArF light.

The acid-decomposable resin (A) can be synthesized by ordinary methods (e.g., radical polymerization). For example, a general synthesis method is as follows. Monomers are charged into a reaction vessel at a time or in the course of reaction. According to need, the monomers are dissolved in a reaction solvent, e.g., an ether such as tetrahydrofuran, 1,4-dioxane, or diisopropyl ether, a ketone such as methyl ethyl ketone or methyl isobutyl ketone, an ester solvent such as ethyl acetate, or a solvent capable of dissolving the composition of the invention therein, such as those enumerated later, e.g., propylene glycol monomethyl ether acetate, to prepare a homogeneous solution. Thereafter, polymerization of the reaction mixture is initiated with a commercial free-radical initiator (e.g., azo initiator or peroxide) in an inert gas atmosphere such as nitrogen or argon optionally with heating. The initiator may be added additionally or in portions according to need. After completion of the reaction, the reaction mixture is poured into a solvent and the target polymer is recovered as a powder, solid, etc. The reactant concentration is generally 20% by mass or higher, preferably 30% by mass or higher, more preferably 40% by mass or higher. The reaction temperature is generally 10-150° C., preferably 30-120° C., more preferably 50-100° C. "% by mass" means weight % in this specification.

Each kind of repeating structural units described above may be ones derived from one monomer used alone or ones derived from two or more monomers used as a mixture. In the invention, one resin only may be used or a combination of two or more resins may be used.

The weight-average molecular weight of the acid-decomposable resin (A) is preferably 1,000-200,000, more preferably 3,000-20,000, in terms of weight-average molecular weight determined through measurement by GPC and calculation for standard polystyrene. By regulating the weight-average molecular weight of the resin so as to be 1,000 or higher, heat resistance and dry etching resistance can be improved. By regulating the weight-average molecular weight thereof so as to be 200,000 or lower, not only developability can be improved but also film-forming properties can be improved because of a reduced viscosity.

The molecular-weight distribution (Mw/Mn; also called dispersity ratio) of the resin to be used is in the range of generally 1-5, preferably 1-4, more preferably 1-3. Molecular-weight distributions of 5 or smaller are preferred from the standpoints of resolution, resist shape, resist pattern side walls, non-roughness properties, etc.

In the positive resist composition of the invention, the amount of the acid-decomposable resin incorporated is preferably 40-99.99% by mass, more preferably 50-99.97% by mass, based on all solid components of the resist.

(B) Compound Generating Acid upon Irradiation with Actinic Ray or Radiation

The compound which generates an acid upon irradiation with an actinic ray or a radiation (hereinafter often referred to as "acid generator") to be used in the positive resist composition for immersion exposure of the invention will be explained below.

The positive resist composition for immersion exposure of the invention contains at least one compound selected from the following (Ba) to (Bc) as a compound which generates an acid upon irradiation with an actinic ray or a radiation:

(Ba) a sulfonium salt compound having in the cation part an alkyl or cycloalkyl residue which has 2 or more carbon atoms and has not been substituted by fluorine (hereinafter referred to also as "Ya group"), (Bb) a sulfonium salt compound having in the cation part a fluorine-substituted alkyl or cycloalkyl residue having 1 or more carbon atoms (hereinafter referred to also as "Yb group"), and (Bc) a sulfonium salt compound having in the anion part an alkyl or cycloalkyl residue which has 2 or more carbon atoms and has not been substituted by fluorine (hereinafter referred to also as "Yc group").

The term "alkyl or cycloalkyl residue" herein means a group having either a linear or branched alkyl structure or a cycloalkyl structure. Examples thereof include alkyl, cycloalkyl, alkoxy, alkoxycarbonyl, alkylthio, cycloalkylthio, acylamino, oxoalkyl, oxocycloalkyl, alkylsulfonyloxy, cycloalkylsulfonyloxy, alkylsulfonyl, cycloalkylsulfonyl, alkylsulfonylamino, cycloalkylsulfonylamino, alkylaminosulfonyl, and cycloalkylaminosulfonyl groups. Divalent or trivalent connecting groups formed by removing one or two hydrogen atoms from any of those alkyl or cycloalkyl residues are also included in the alkyl or cycloalkyl residue.

Examples of the alkyl or cycloalkyl residue which has 2 or more carbon atoms and has not been substituted by fluorine (Ya group) include alkyl or cycloalkyl groups such as ethyl, isopropyl, n-butyl, isobutyl, t-butyl, n-pentyl, cyclopentyl, neopentyl, t-amyl, n-hexyl, cyclohexyl, n-octyl, n-dodecyl, n-hexadecyl, n-octadecyl, 2-ethylhexyl, adamantly, norbornyl, menthyl, adamantylmethyl, adamantylethyl, and cyclohexylethyl;

alkoxy groups such as ethoxy, isopropoxy, n-butoxy, isobutoxy, t-butoxy, n-pentyloxy, cyclopentyloxy, neopentyloxy, t-amyloxy, n-hexyloxy, cyclohexyloxy, n-octyloxy, n-dodecyloxy, n-hexadecyloxy, n-octadecyloxy, 2-ethylhexyloxy, adamantyloxy, norbornyloxy, menthyloxy, adamantylmethoxy, adamantylethoxy, and cyclohexylethoxy;

the alkoxycarbonyl groups formed by bonding those alkoxy groups to a carbonyl group;

the alkylthio or cycloalkylthio groups formed by replacing the oxygen atom of each of those alkoxy groups by a sulfur atom;

oxoalkyl or oxocycloalkyl groups formed by substituting those alkyl or cycloalkyl groups by an oxo group in any position;

acylamino groups formed by bonding those alkyl or cycloalkyl gropes to a —C(=O)N($Rx_1$)— group (wherein $Rx_1$ represents a hydrogen atom or an alkyl or cycloalkyl group);

the alkylsulfonyloxy or cycloalkylsulfonyloxy groups formed by bonding those alkyl or cycloalkyl groups to an —$SO_2O$— group;

the alkylsulfonyl or cycloalkylsulfonyl groups formed by bonding those alkyl or cycloalkyl groups to an —$SO_2$— group;

alkylsulfonylamino or cycloalkylsulfonylamino groups formed by bonding those alkyl or cycloalkyl groups to an —$SO_2N(Rx_1)$— group; and alkylaminosulfonyl or cycloalkylaminosulfonyl groups represented by $(Rx_1)(Rx_2)NSO_2$— (wherein $Rx_2$ represents an alkyl or cycloalkyl group which has 2 or more carbon atoms and has not been substituted by fluorine, provided that $Rx_1$ and $Rx_2$ may be bonded to each other to form a monocyclic or polycyclic ring structure).

Examples of the Yb group include groups formed by partly or wholly replacing the hydrogen atoms of each of the alkyl or cycloalkyl residues enumerated above as examples of the Ya group by fluorine. The number of fluorine atoms in the Yb group is preferably 1-20, more preferably 2-15, even more preferably 3-9.

Examples of the Yc group include the groups enumerated above as examples of the Ya group.

Preferred examples of ingredient (B) include sulfonium salt compounds each comprising a sulfonium cation represented by the following general formula (B-1) and an anion represented by the following general formula (B-2) or (B-3).

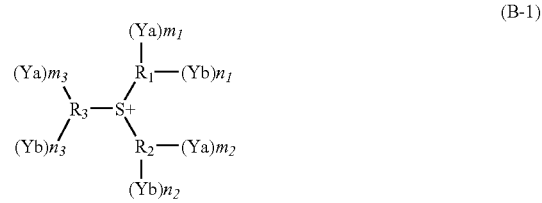

(B-1)

(B-2)

In general formulae (B-1) and (B-2), $R_1$, $R_2$, and $R_3$ each independently represents a single bond or an alkyl, cycloalkyl, oxoalkyl, oxocycloalkyl, aryl, aralkyl, phenacyl, naphthylacyl, alkenyl, or oxoalkenyl;

Yx represents an alkyl, cycloalkyl, or aryl group;

Ya, Yb, and Yc represent the Ya group, Yb group, and Yc group, respectively;

$m_1$ to $m_3$ each independently represents an integer of 0-2;

$n_1$ to $n_3$ each independently represents an integer of 0-2; and k represents an integer of 0-2, provided that $m_1+m_2+m_3+n_1+n_2+n_3+k=1$ to 6.

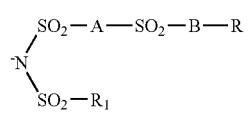
(B-3)

In general formula (B-3), A represents a divalent connecting group.

B represents a sigle bond, an oxygen atom or —N(Rx)—. Rx represents a hydrogen atom, an aryl group, alkyl group or a cycloalkyl group.

R represents a monovalent organic group.

When B is —N(Rx)—, R and Rx may be bonded to each other form a ring.

$R_1$ represents a monovalent organic group.

Preferably, at least one of A, Rx, R and $R_1$ has Yc group.

$R_1$, $R_2$, $R_3$, and Yx in the general formulae (B-1) and (B-2) may have substituents. Examples of the substituents which may be possessed by $R_1$, $R_2$, $R_3$, and Yx include halogen atoms, hydroxy, and alkyl, cycloalkyl, alkoxy, nitro, and cyano groups.

Preferred examples of the cation represented by general formula (B-1) include sulfonium cations selected from the following (1) to (3).

(1) Triarylsulfonium salts in which $R_1$ to $R_3$ each are an optionally substituted aryl group, more preferably, triphenylsulfonium salts in which $R_1$ to $R_3$ each are optionally substituted phenyl.

(2) Phenacylsulfonium salts in which $R_1$ is an optionally substituted arylcarbonylmethyl group and $R_2$ and $R_3$ each are an alkyl, cycloalkyl, or aryl group, more preferably, $R_1$ is optionally substituted phenacyl. $R_2$ and $R_3$ may be bonded to each other to form a ring.

(3) Aryldialkylsulfonium salts or aryldicycloalkylsulfonium salts in which $R_1$ is an optionally substituted aryl group and $R_2$ and $R_3$ each are an alkyl or cycloalkyl group. $R_2$ and $R_3$ may be bonded to each other to form a ring.

Preferred examples of the anion represented by general formula (B-2) include alkanesulfonic acid anions in which Yx is a fluorine-substituted alkyl group (preferably a perfluoroalkyl group) and benzenesulfonic acid anions in which Yx is phenyl substituted by one or more fluorine atoms or fluoroalkyl groups.

More preferred examples of the anion represented by general formula (B-2) include sulfonic acid anions represented by the following general formula (B-2a) or (B-2b).

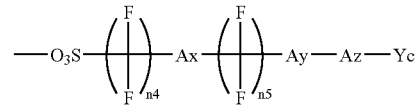
(B-2a)

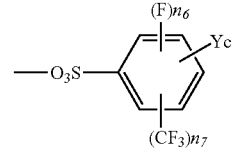
(B-2b)

In general formulae (B-2a) and (B-2b),

Ax represents a single bond or an oxygen atom;

Ay represents a single bond, —$SO_2$—, —$SO_3$—, —$SO_2N(R_4)$—, —$CO_2$—, oxygen atom, —C(=O)—, —C(=O)N($R_4$)—, or alkylene group;

$R_4$ represents a hydrogen atom or an alkyl group (preferably having 1-12 carbon atoms);

Az represents a single bond or an aryl group;

Yc represents the Yc group, provided that Yc may be bonded to $R_4$ to form a ring;

n4 represents an integer of 1-4; n5 represents an integer of 1-4; n6 represents an integer of 0-4; and n7 represents an integer of 0-4, provided that n6+n7 represents an integer of 1-4.

The anion in the general formula (B-3) preferably includes an anion represented by the following general formula (B-3a).

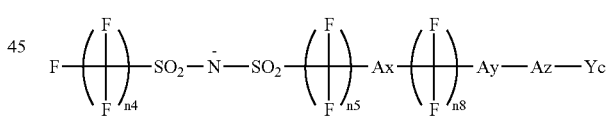
(B-3a)

Ax, Ay, Az, Yc, n4 and n5 in the formula (B-3a) are same as those in the formula (B-2a).

n8 represents an integer of 1-4.

Preferred examples of the sulfonium cation in (Ba) include the following cations.

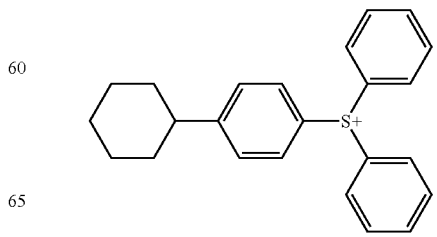

-continued
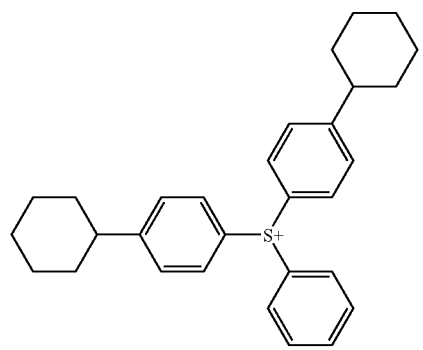
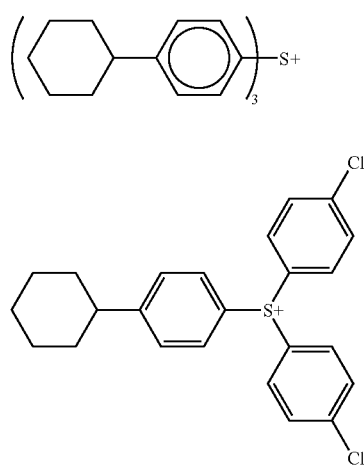
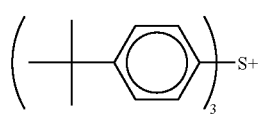
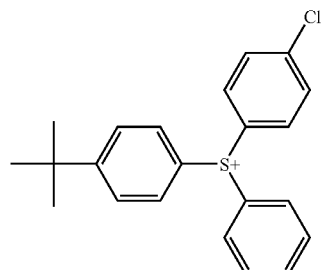
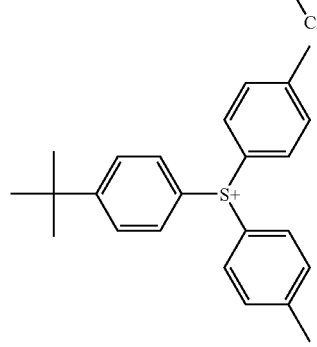
-continued
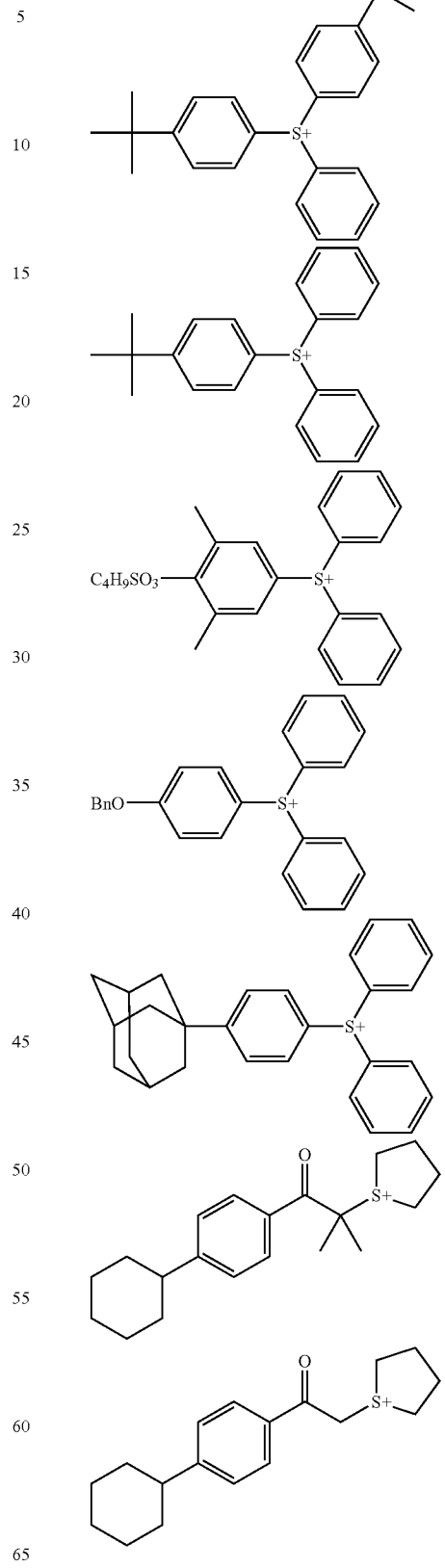

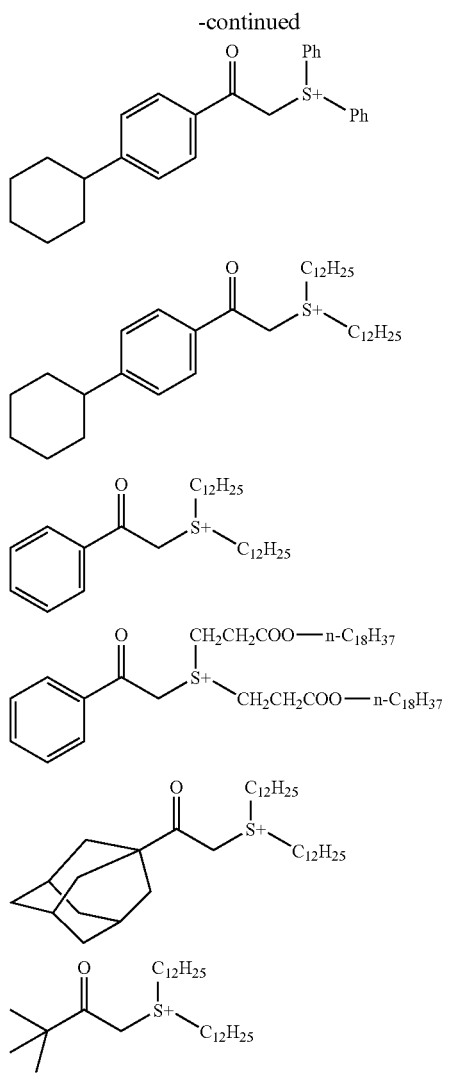
Preferred examples of the sulfonium cation in (Bb) include the following cations.
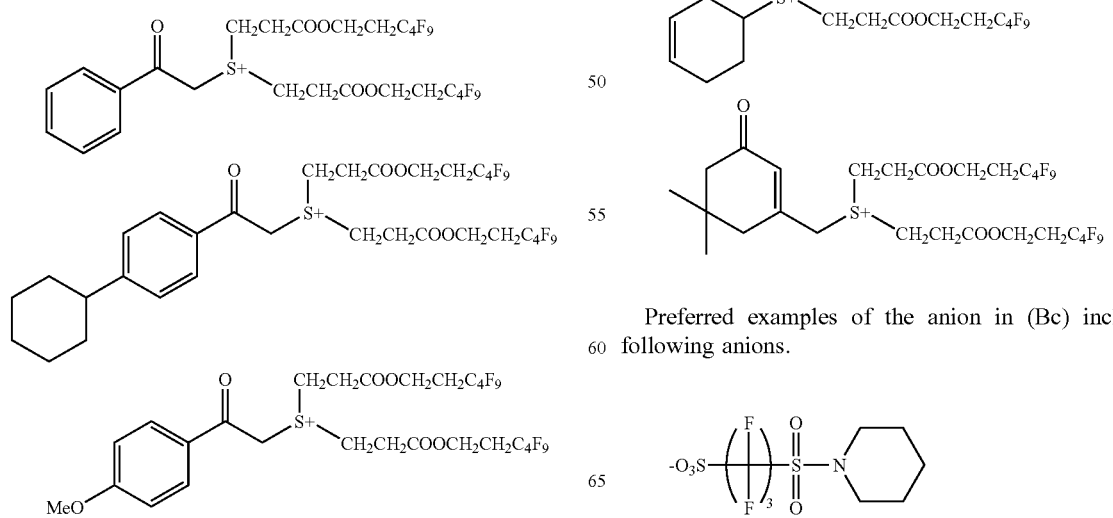
Preferred examples of the anion in (Bc) include the following anions.
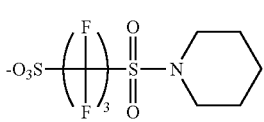

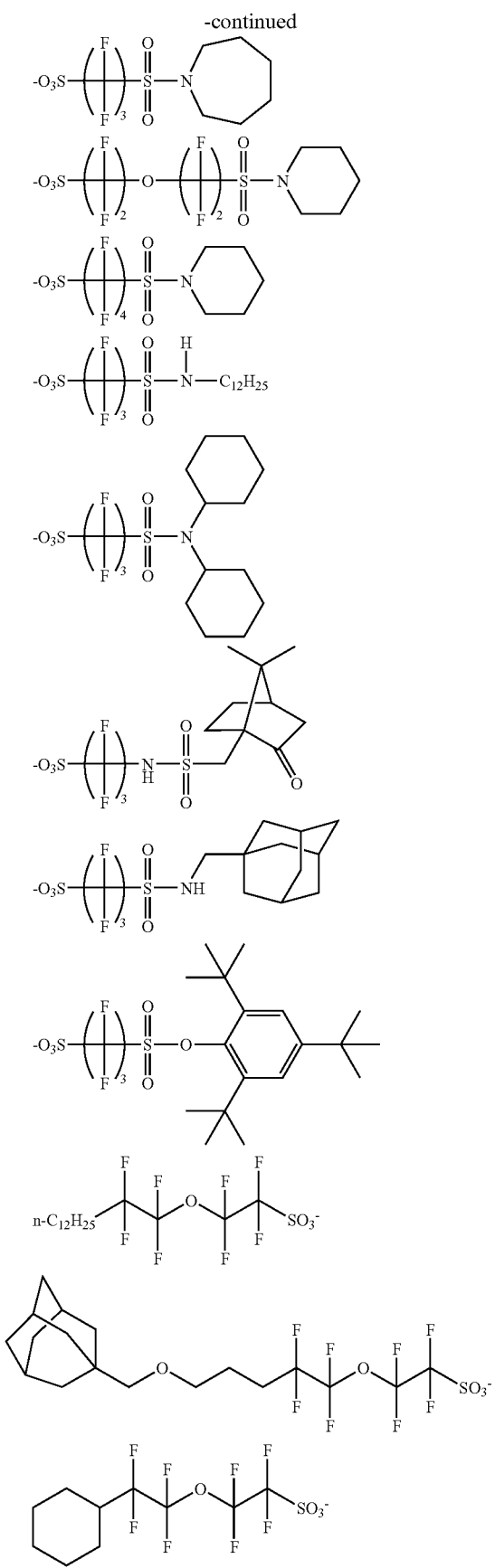
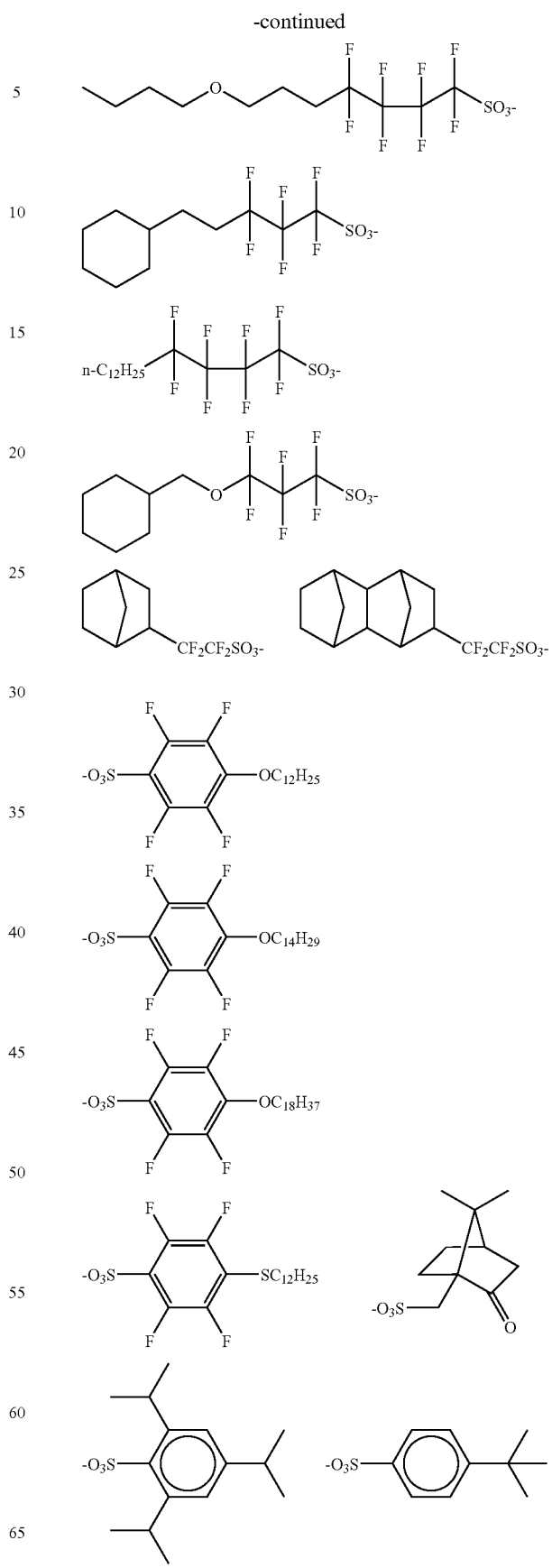

-continued
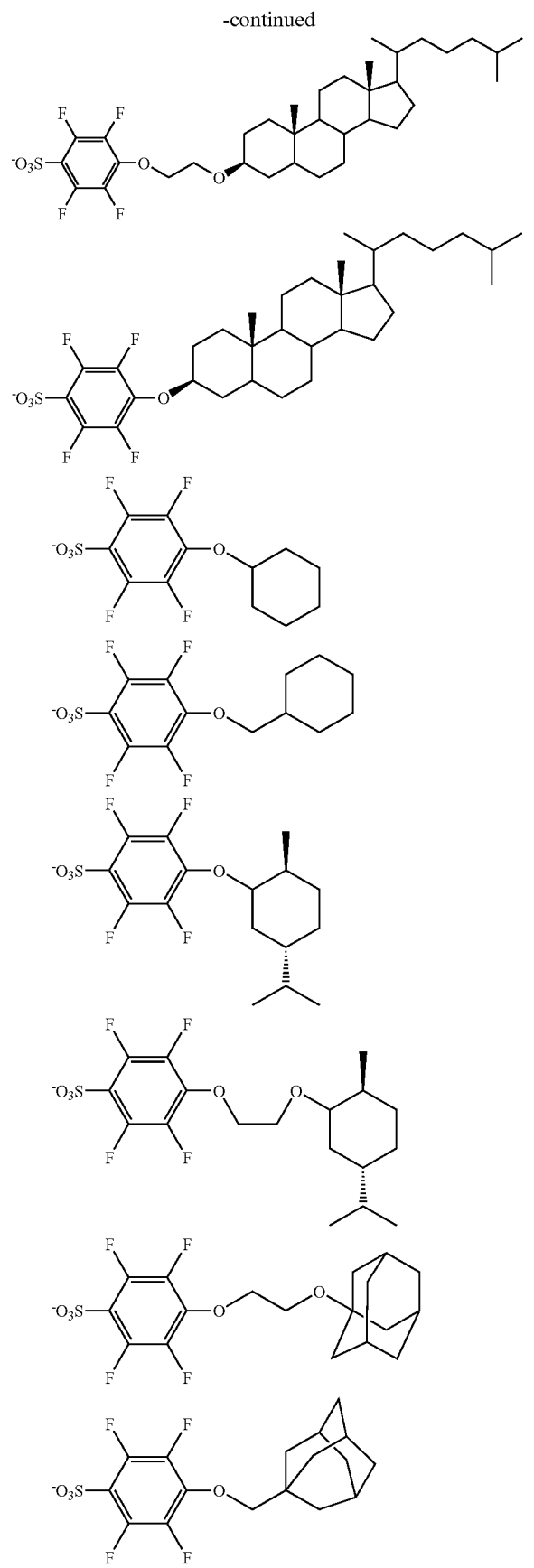
-continued
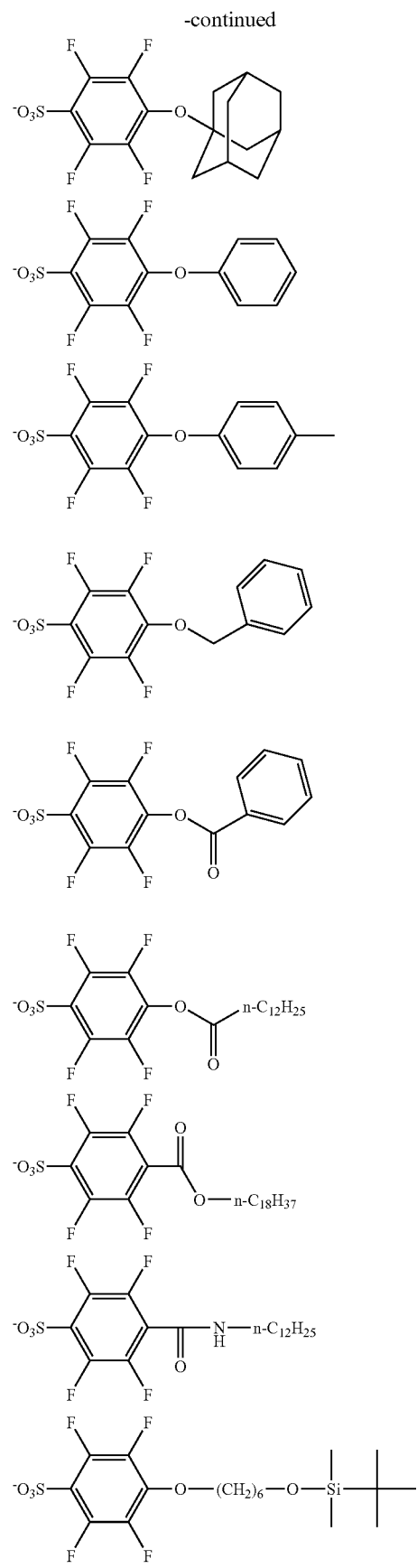

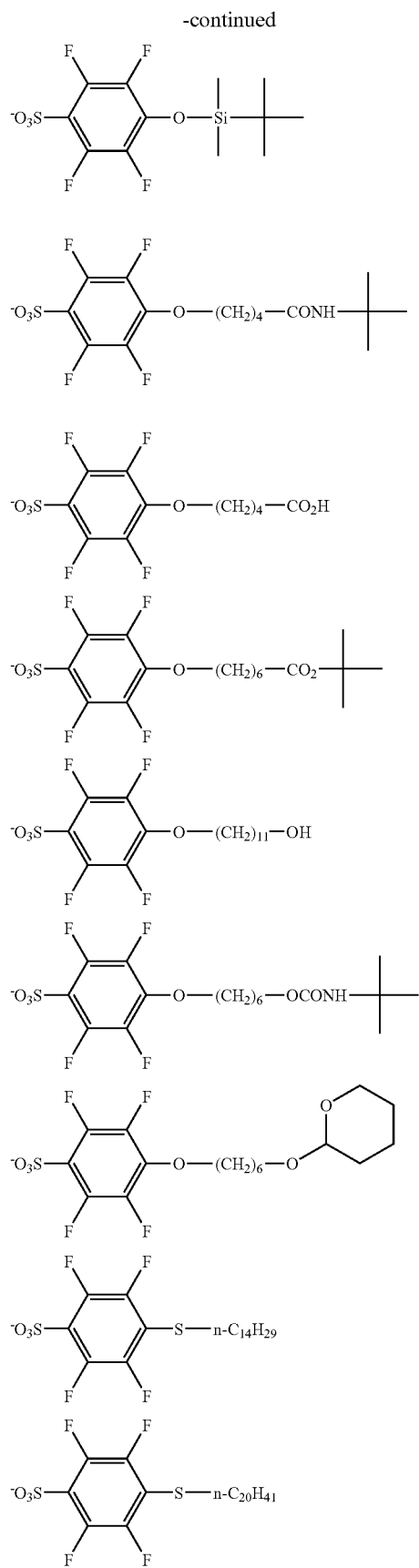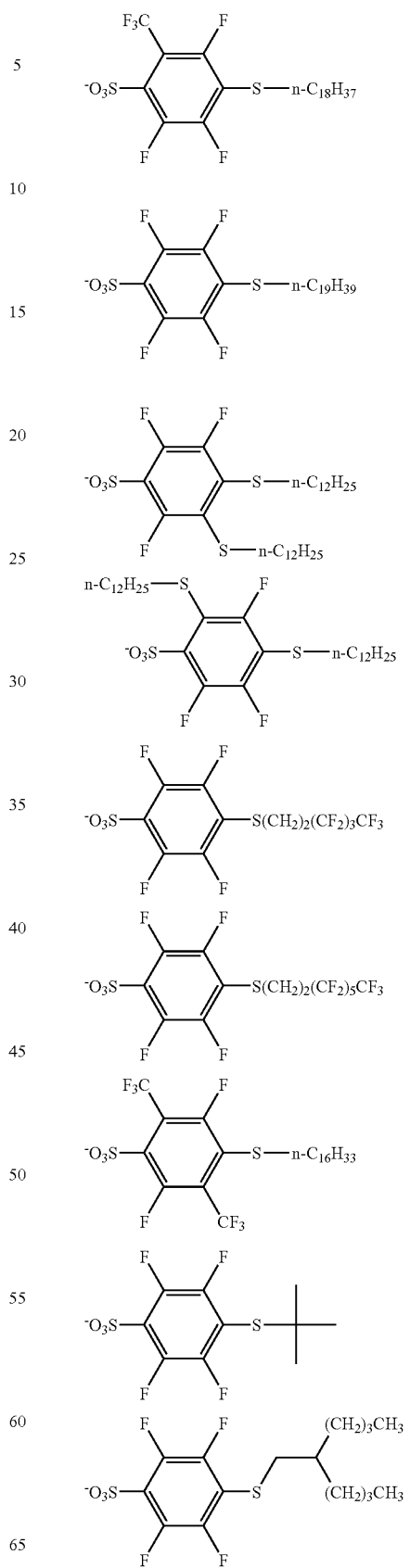

-continued
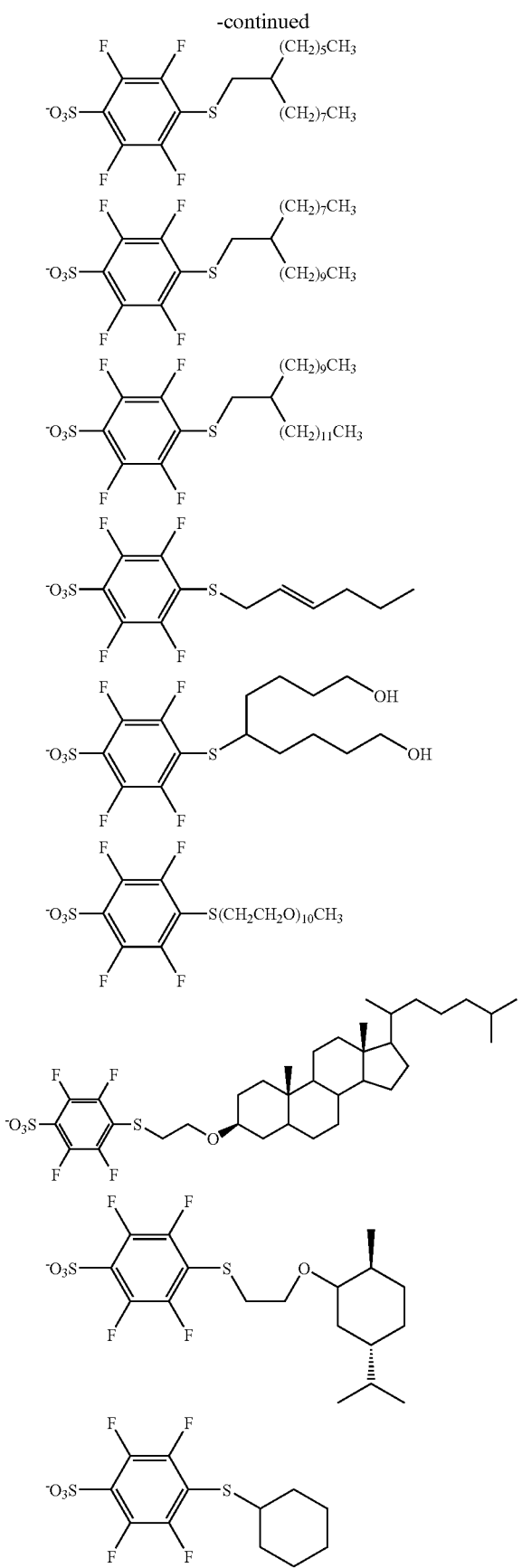
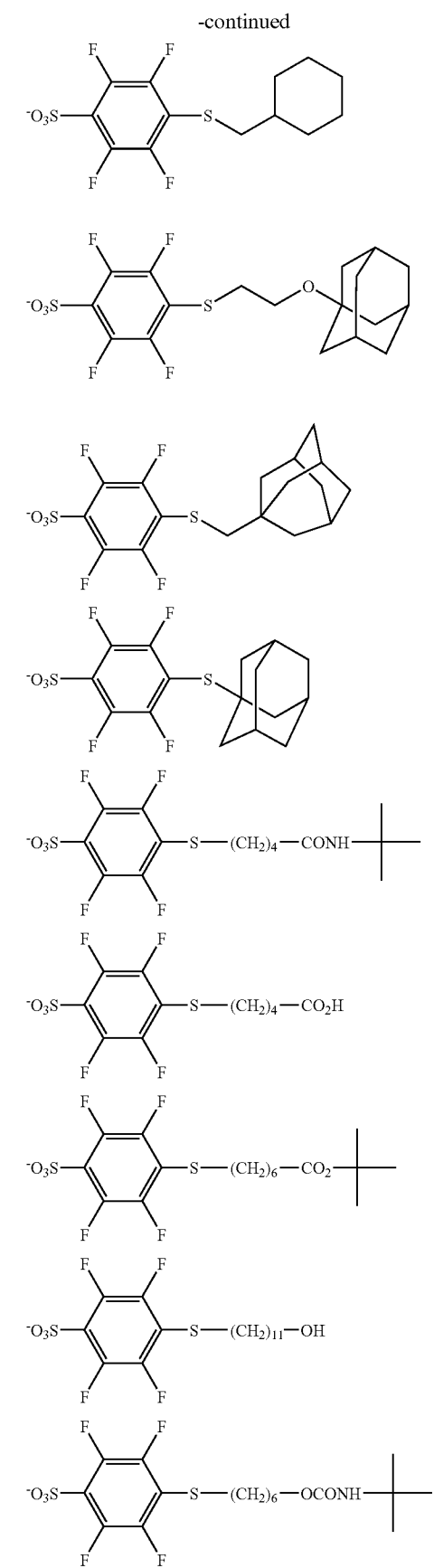

-continued
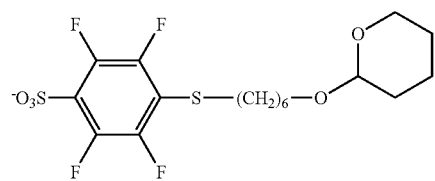
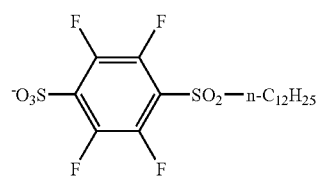
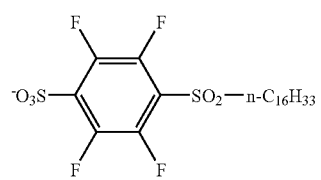
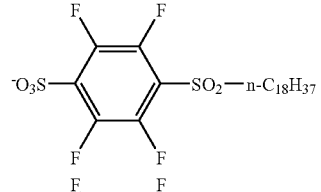
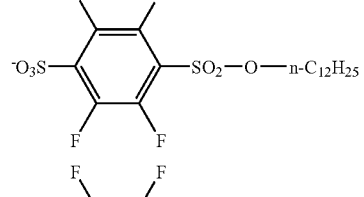
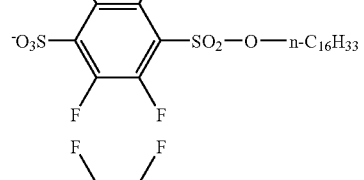
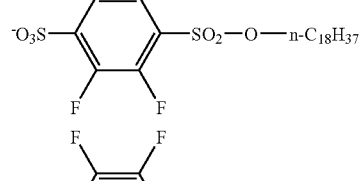
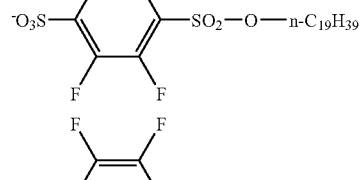
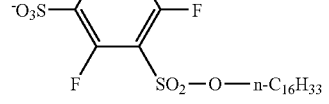
-continued
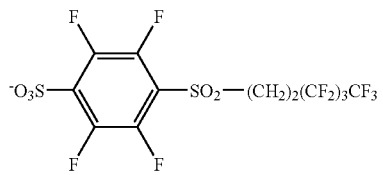
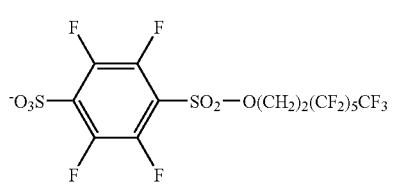
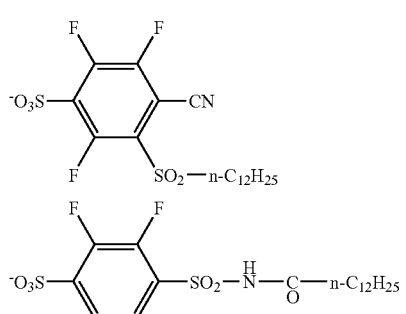
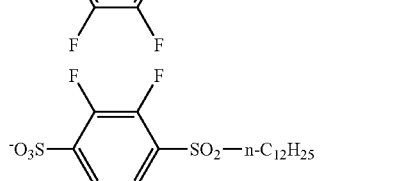
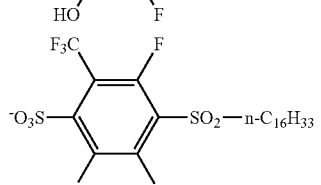
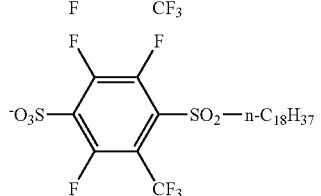
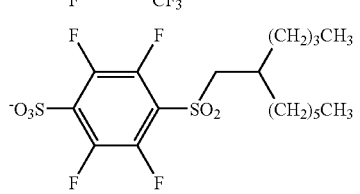
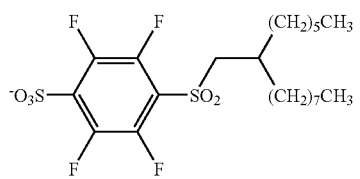

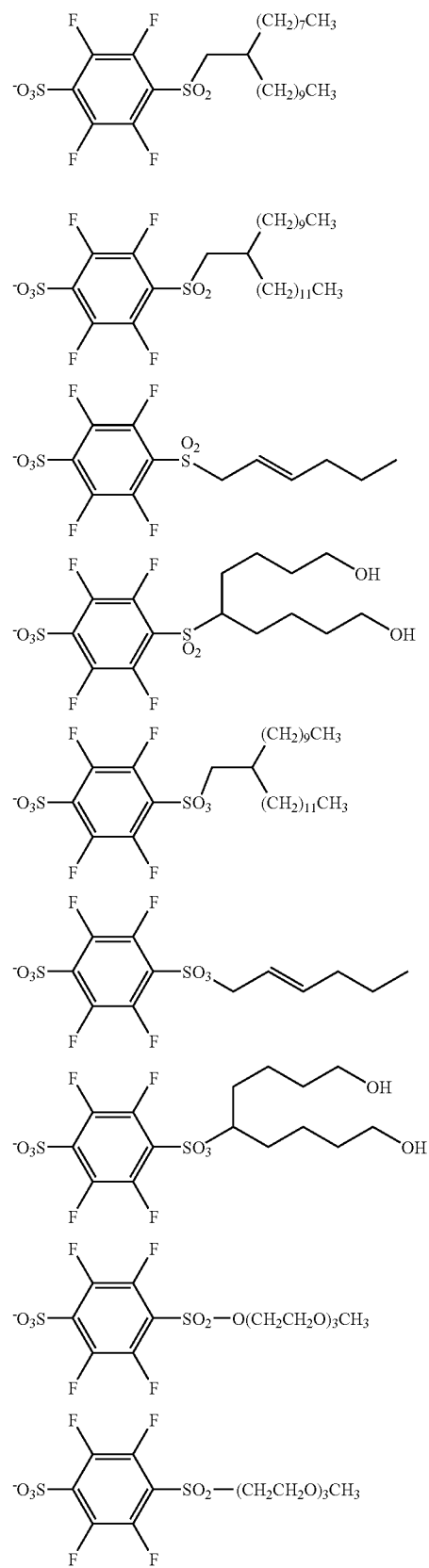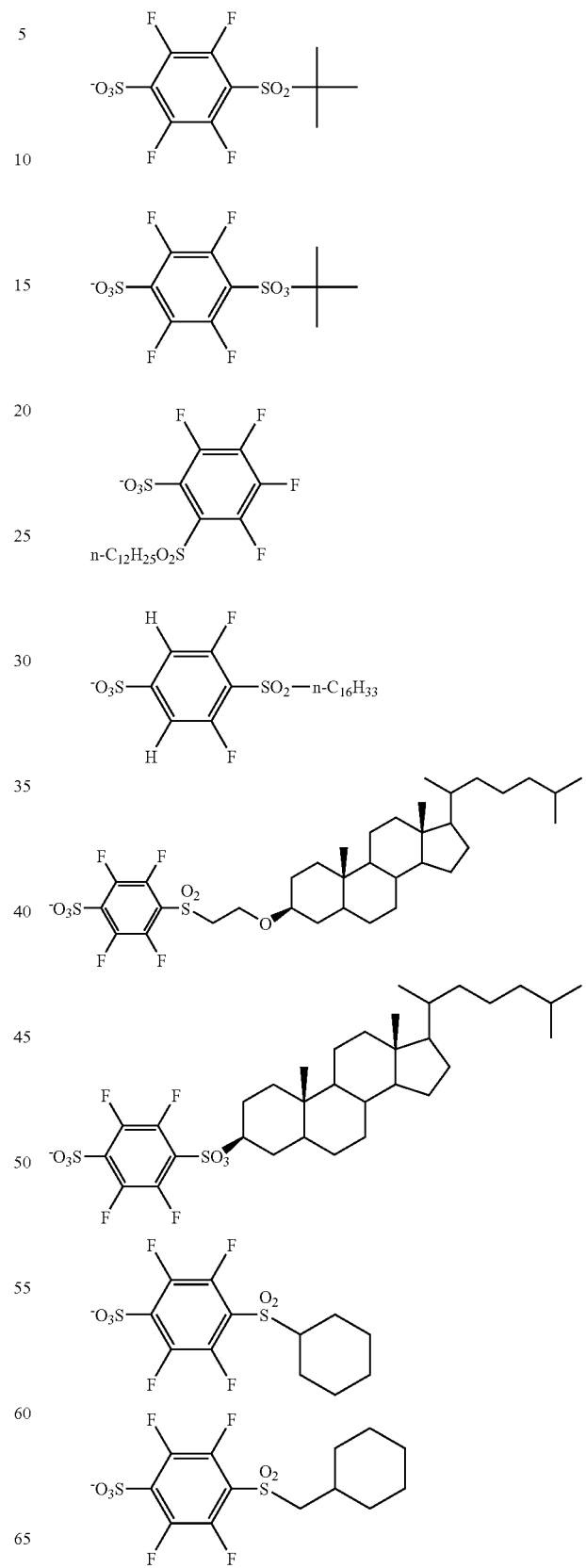

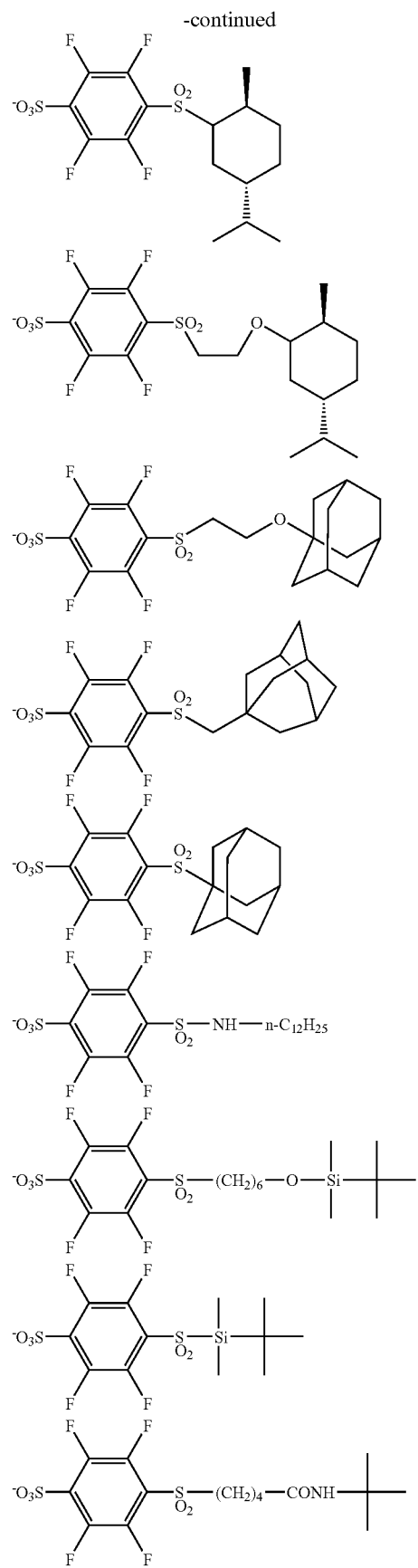
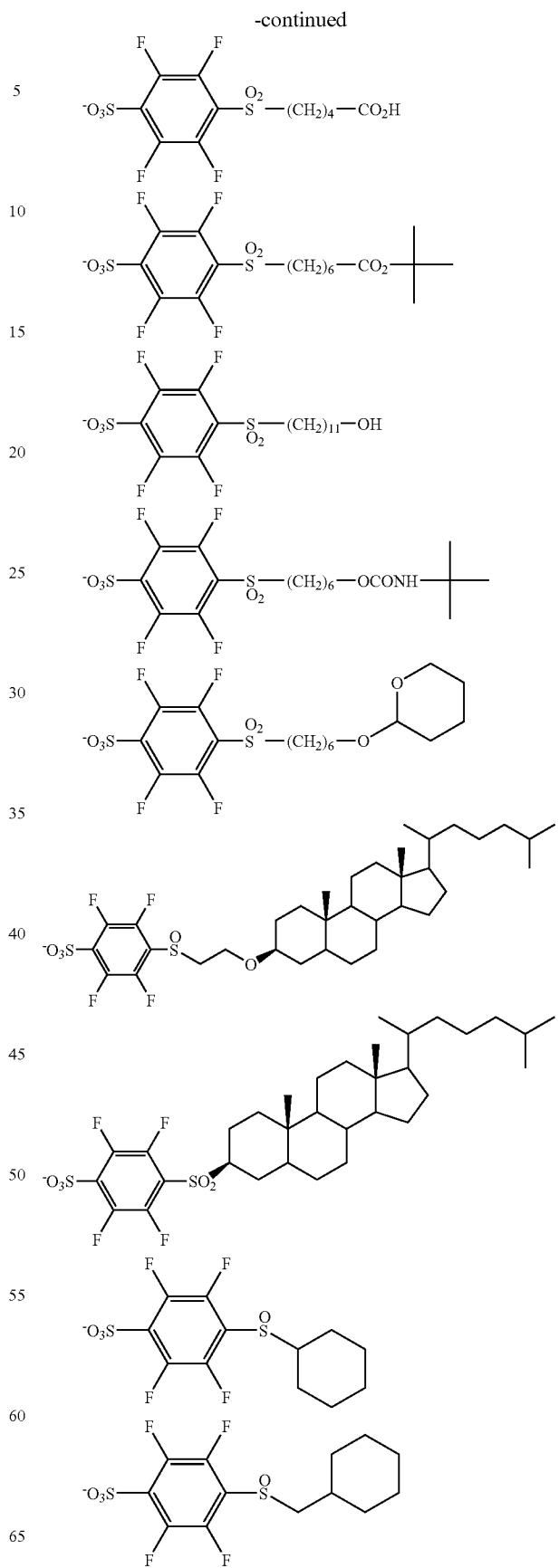

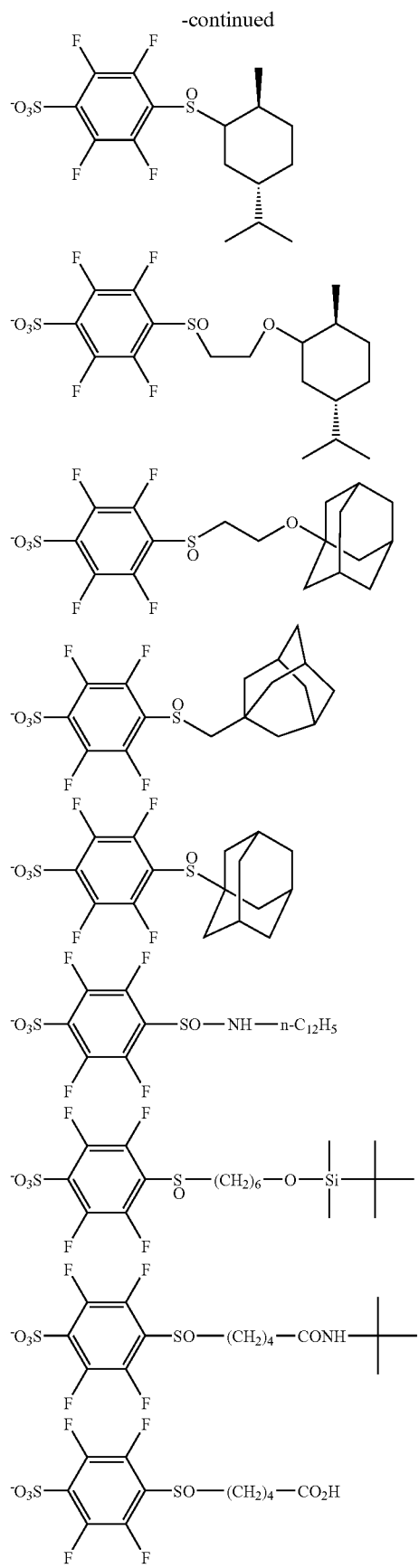
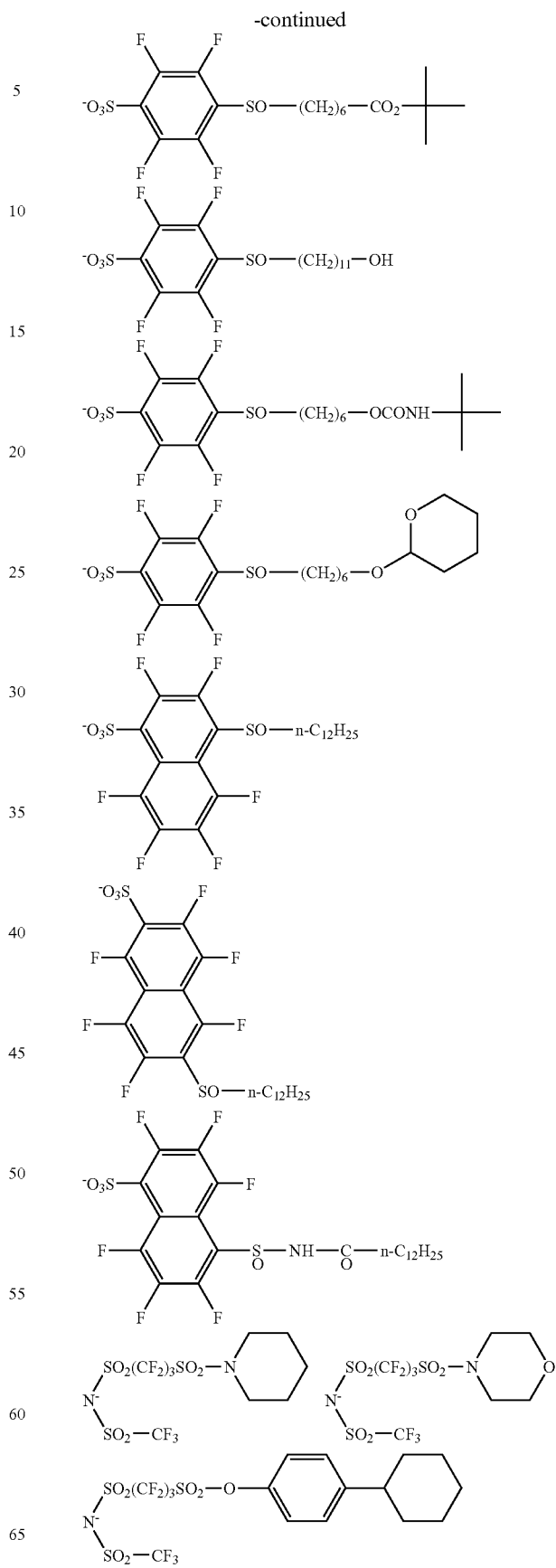

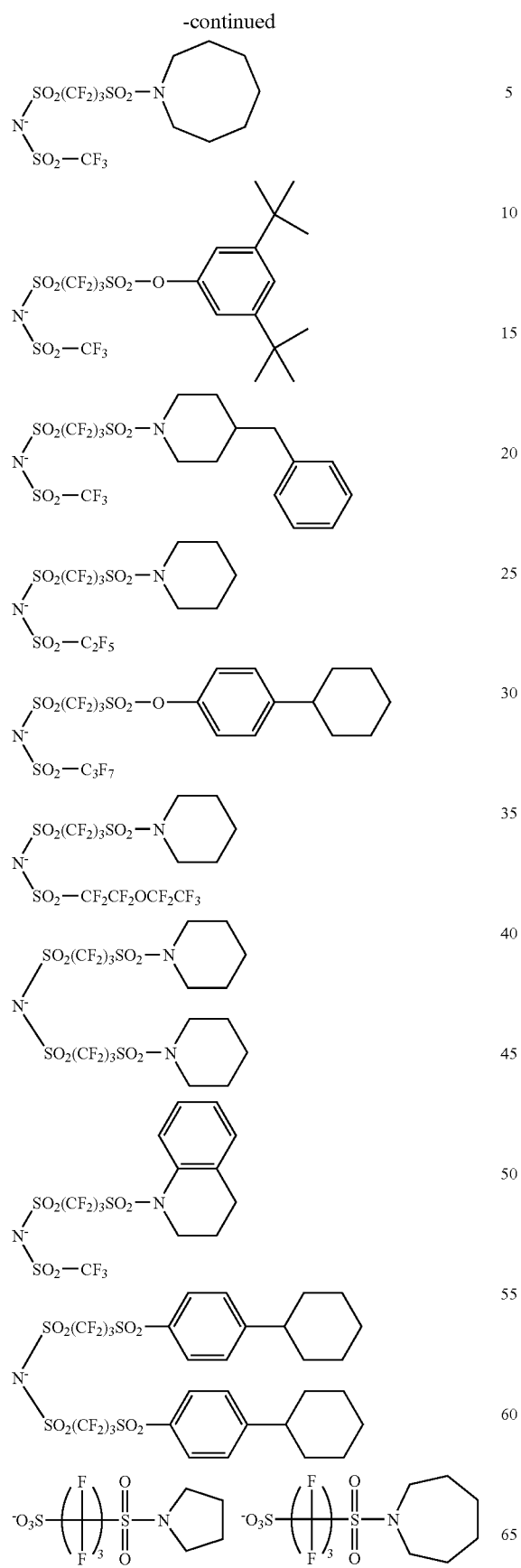

-continued
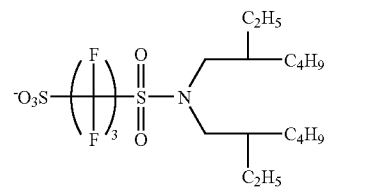
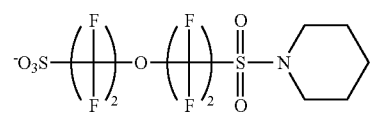
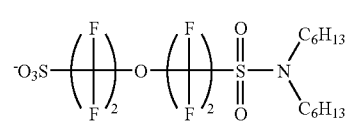
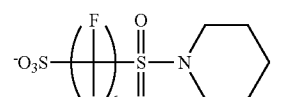
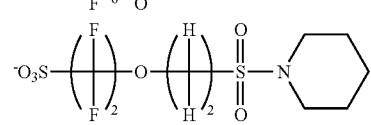
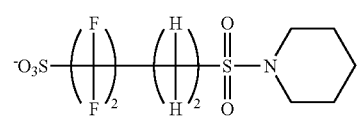
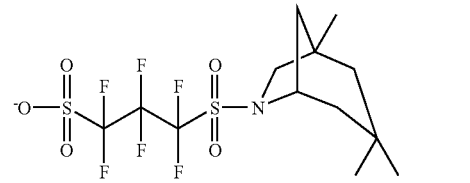
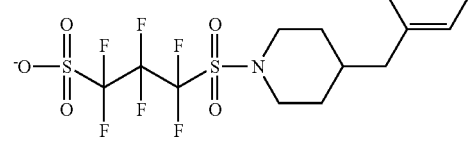
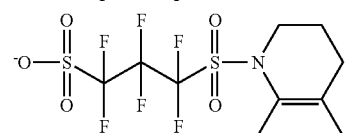
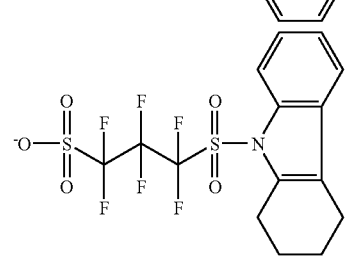
-continued
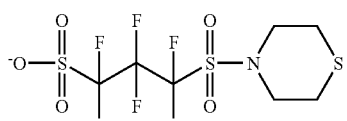
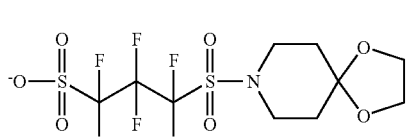
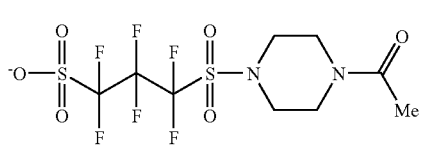
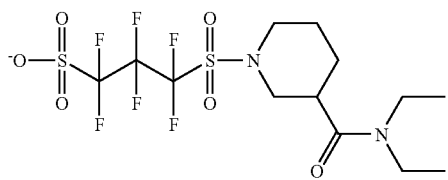
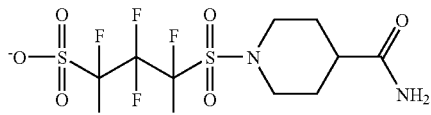
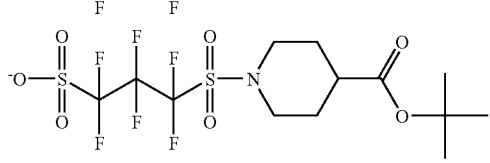
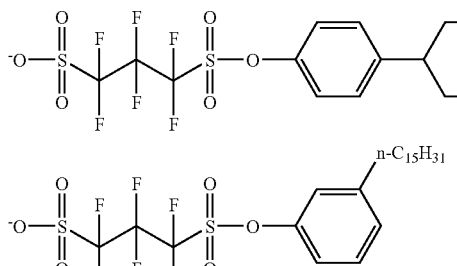
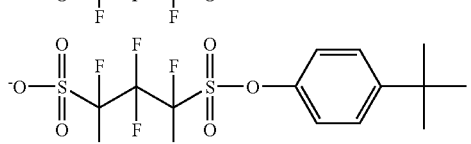
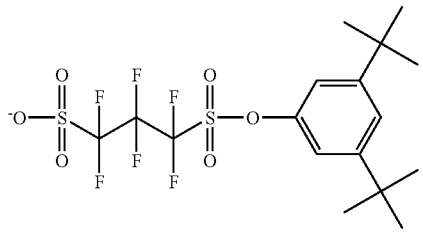

Specific examples of preferred compounds for use as ingredient (B) are shown below.
Specific examples of compounds (Ba):
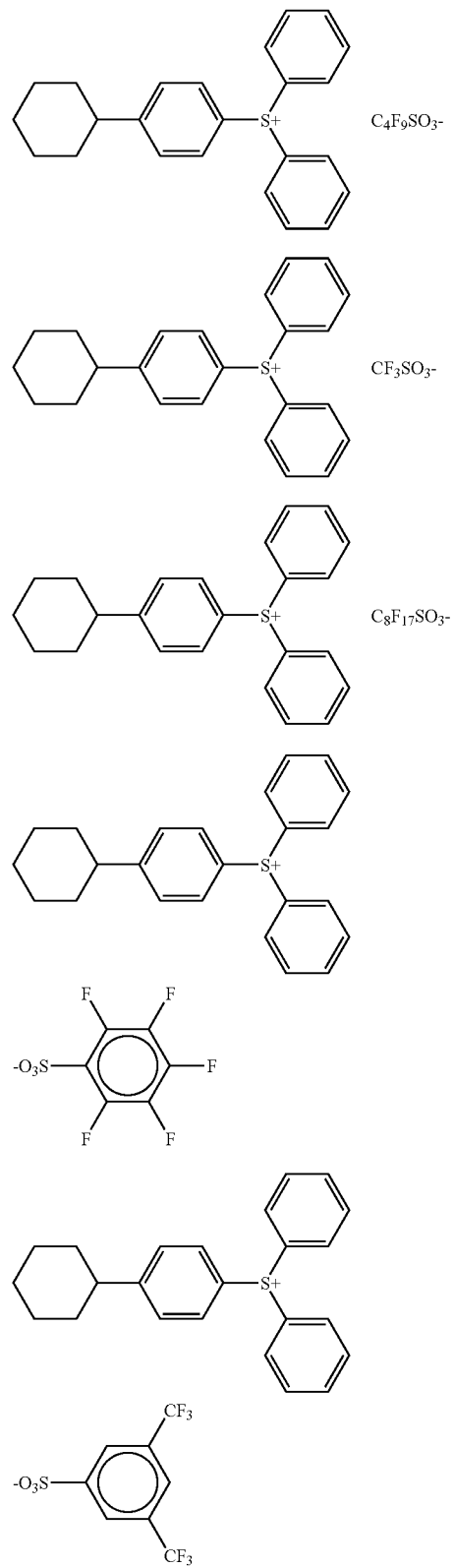
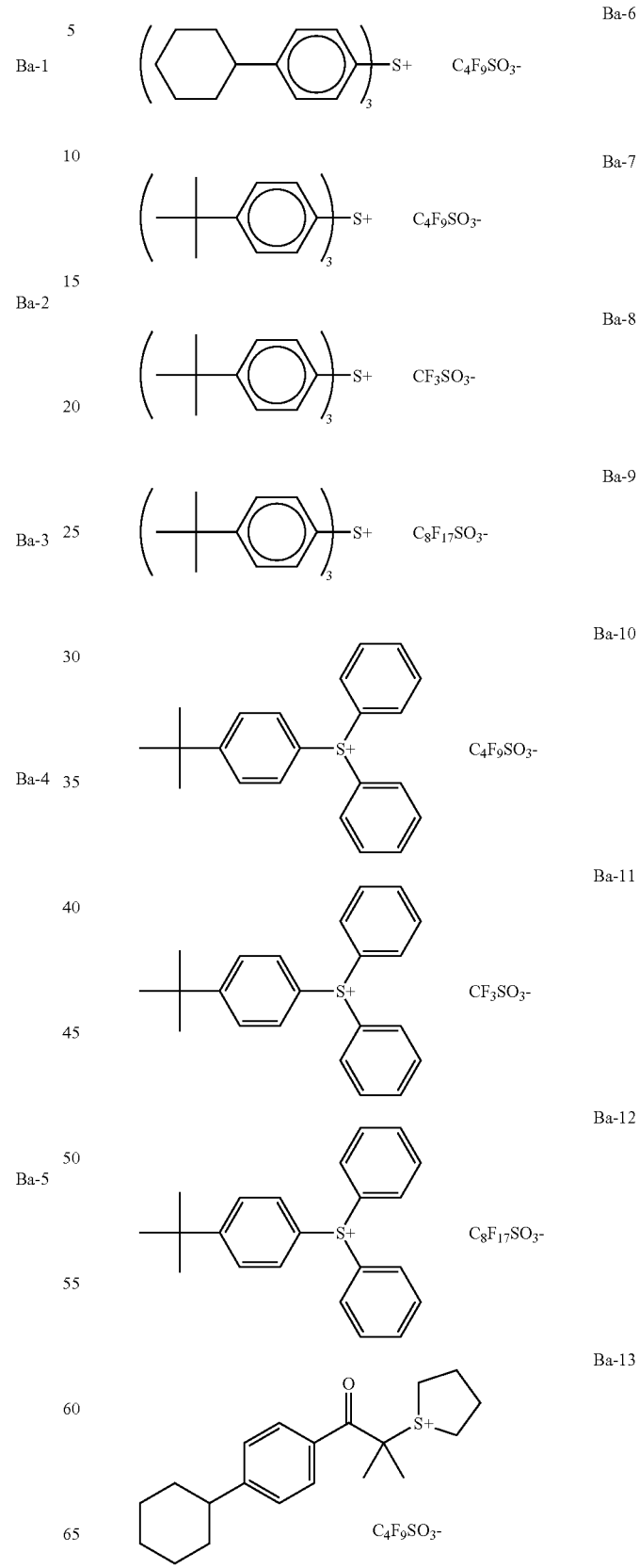

Ba-14
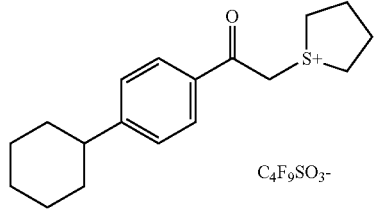
Ba-15
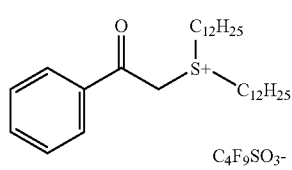
Ba-16
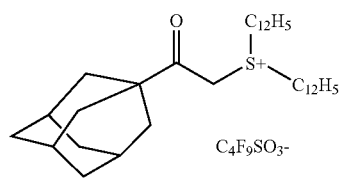
Ba-17
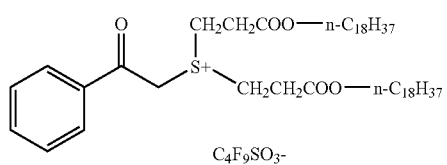
Ba-18
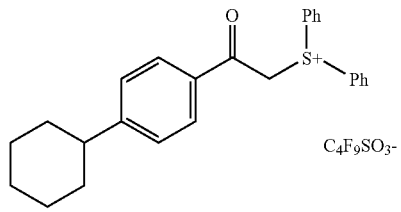
Ba-19
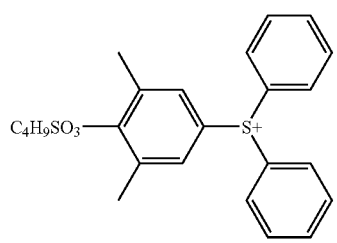
Ba-20
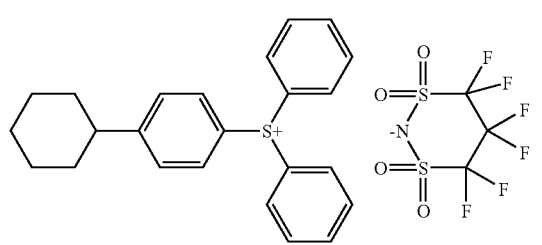
Ba-21
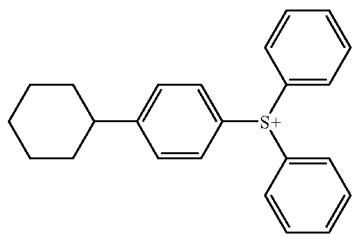
Specific examples of compounds (Bb):
Bb-1
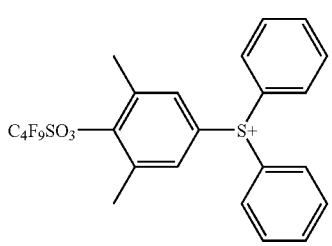 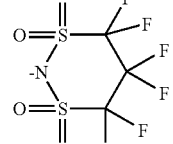
Bb-2
Bb-3
Bb-4
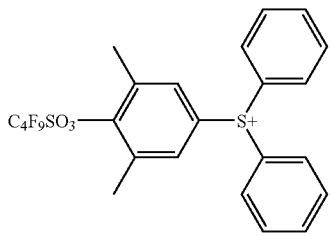
Bb-5
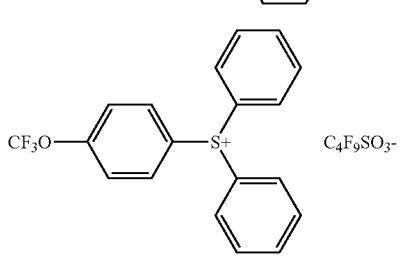

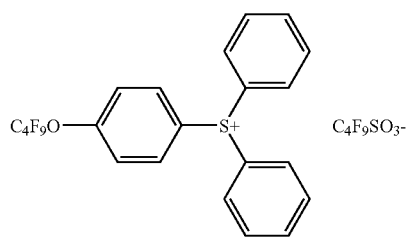
Bb-6
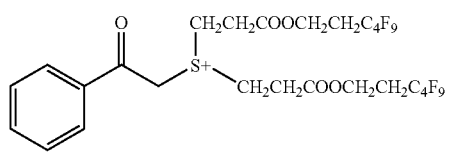
Bb-7
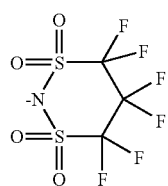
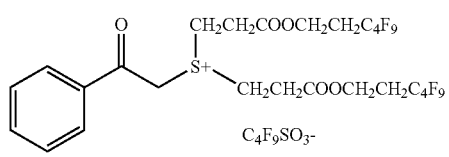
Bb-8
Specific examples of compounds (Bc):
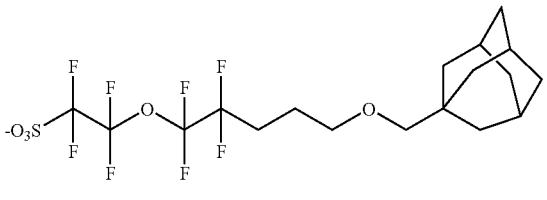
Bc-5
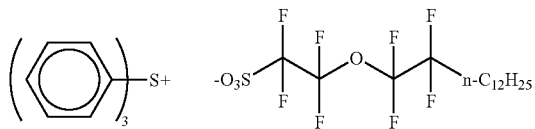
Bc-6
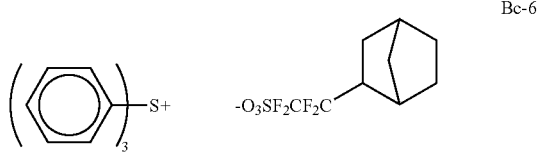
Bc-7
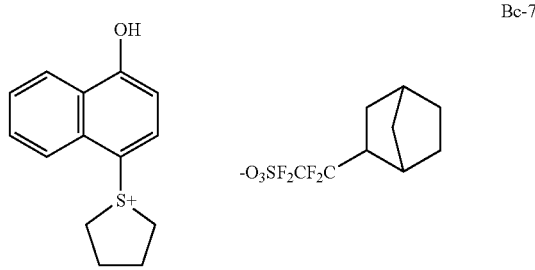
Bc-8
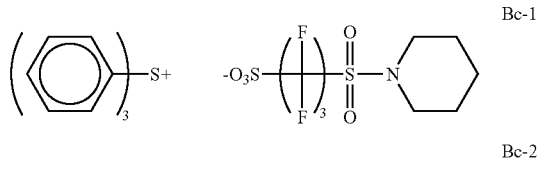
Bc-1
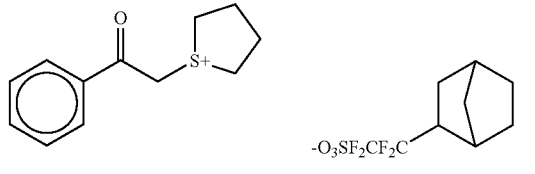
Bc-9
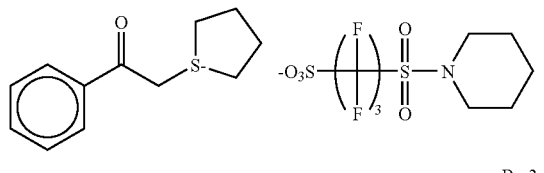
Bc-2
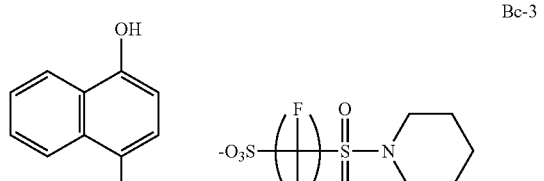
Bc-3
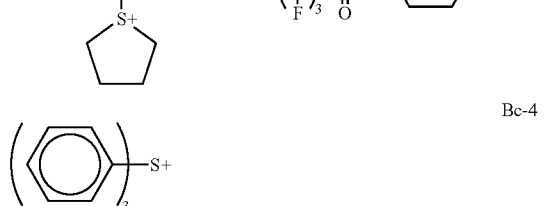
Bc-4
Bc-10

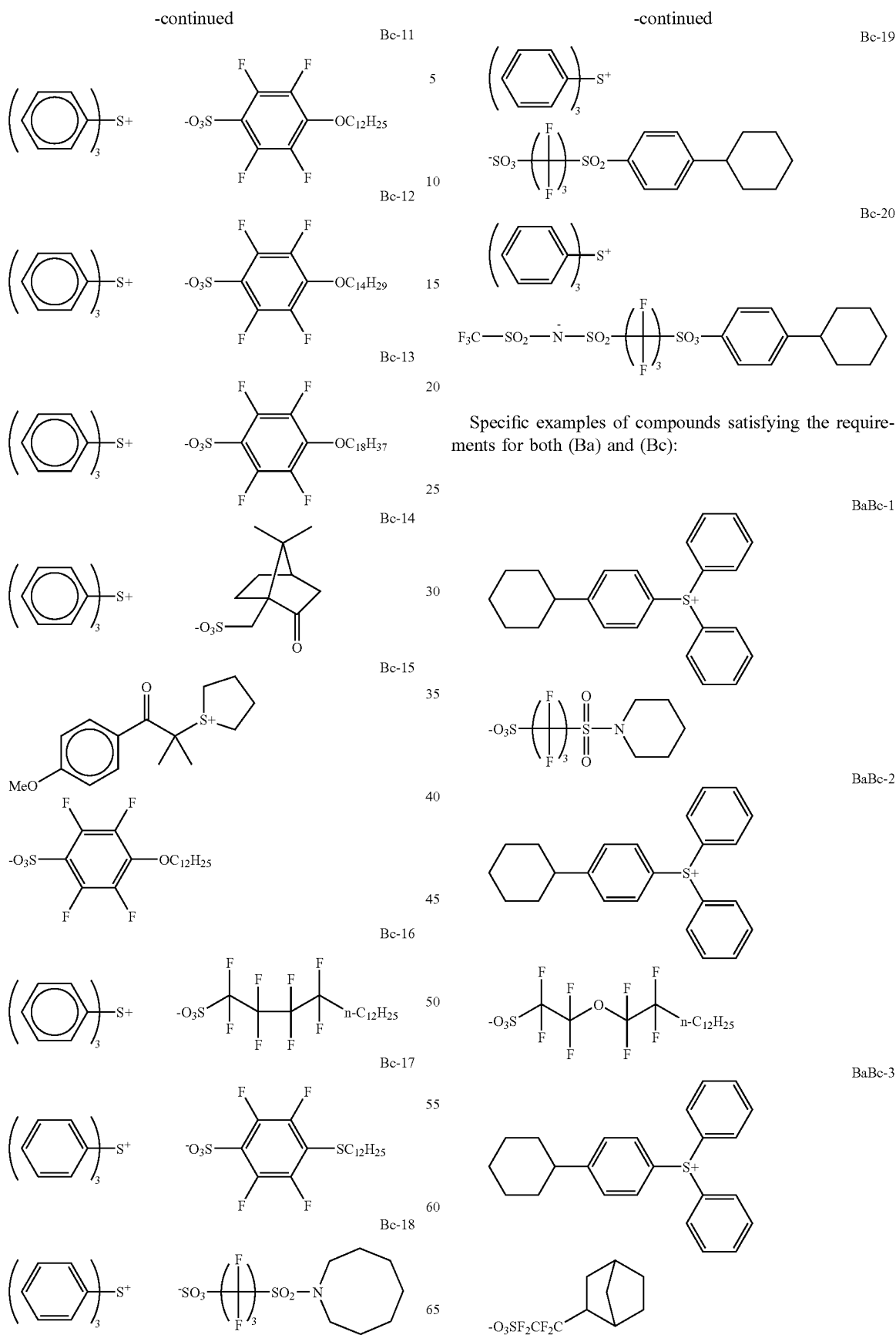
Specific examples of compounds satisfying the requirements for both (Ba) and (Bc):

-continued
BaBc-4
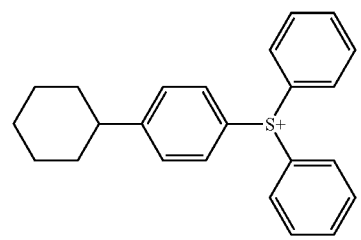
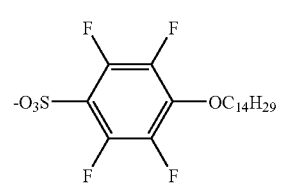
BaBc-5
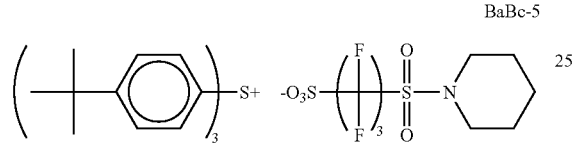
BaBc-6
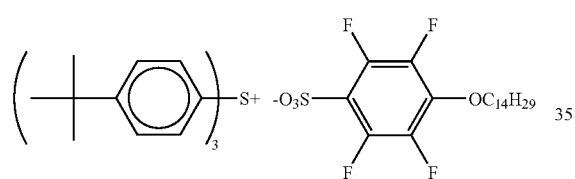
BaBc-7
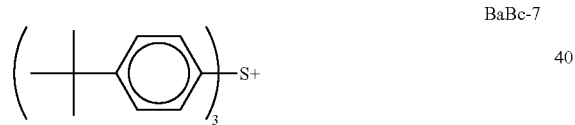
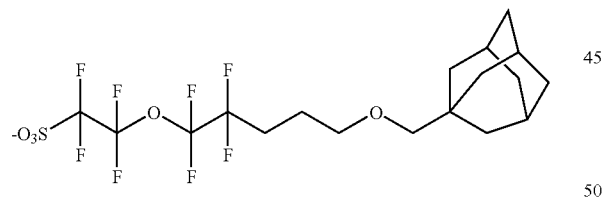
BaBc-8
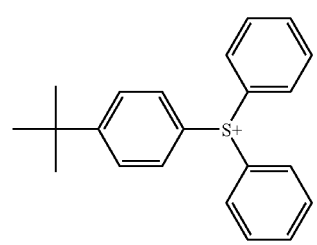
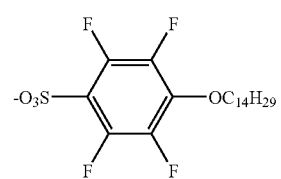
-continued
BaBc-9
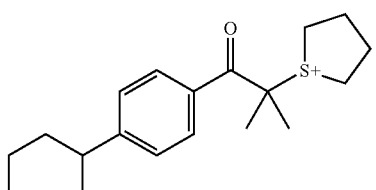
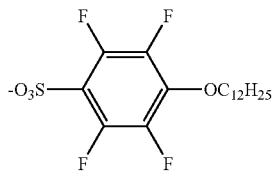
BaBc-10
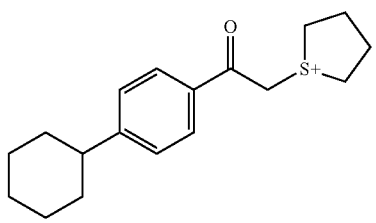
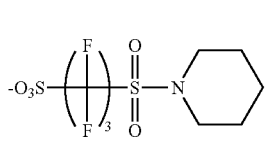
BaBc-11
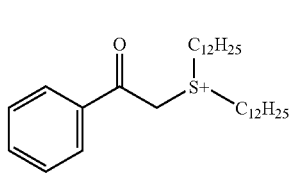
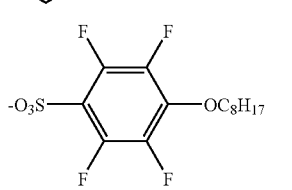
BaBc-12
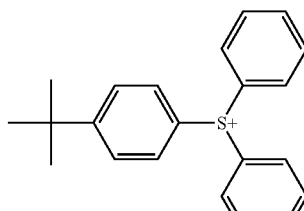
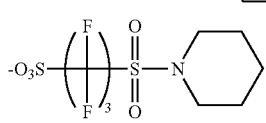

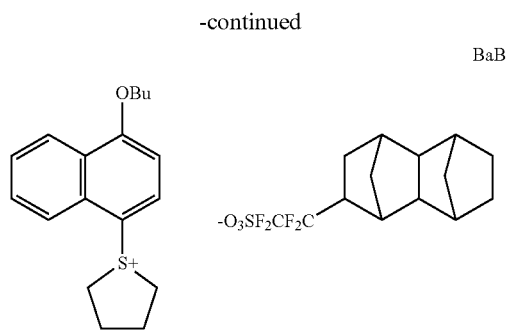
BaBc-13
Specific examples of compounds satisfying the requirements for both (Bb) and (Bc):
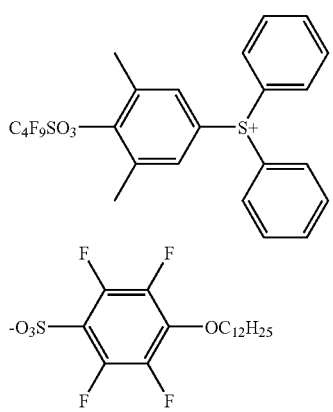
BbBc-1
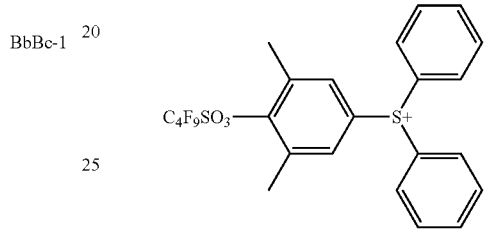
BbBc-2
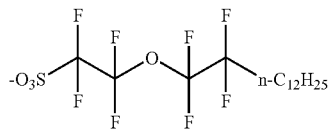
BbBc-3
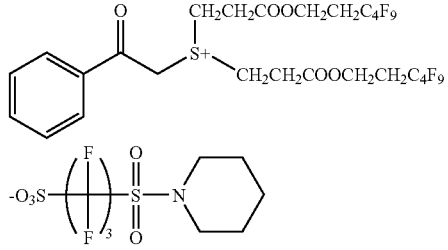
BbBc-4
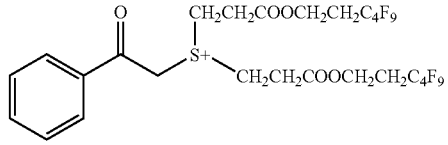
BbBc-5
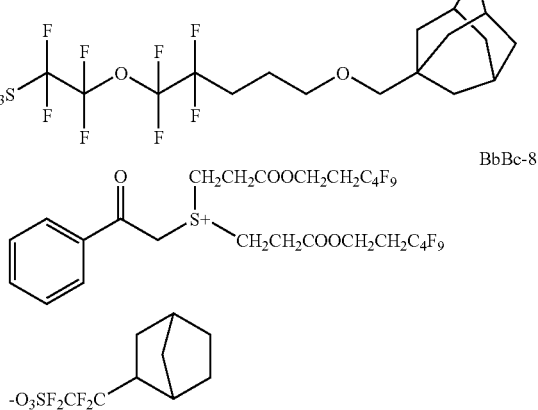
BbBc-6
BbBc-7
BbBc-8

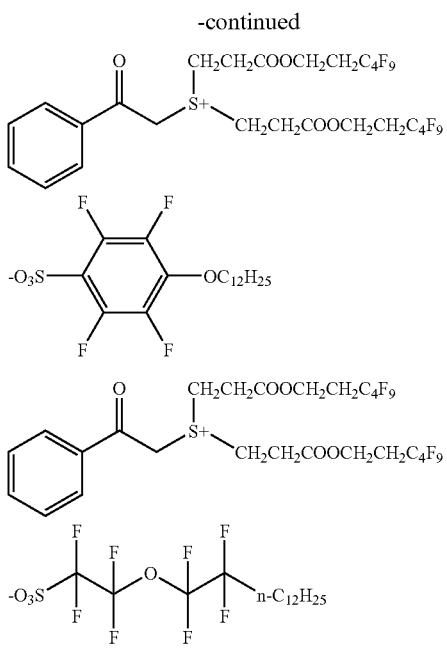

BbBc-9

BbBc-10

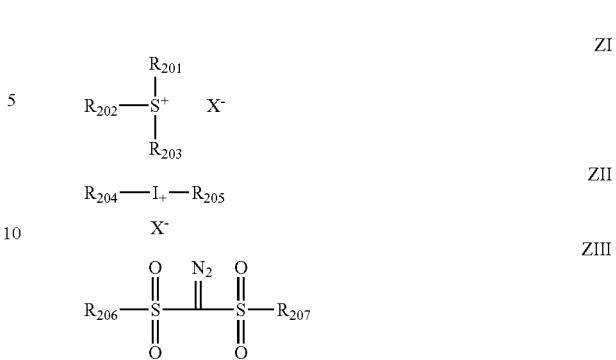

ZI

ZII

ZIII

In the invention, one or more compounds as ingredient (B) may be used in combination with other compound(s) capable of generating an acid upon irradiation with an actinic ray or a radiation. The amount of such an acid generator which can be optionally used is generally from 100/0 to 10/90, preferably from 100/0 to 30/70, more preferably from 100/0 to 50/50, in terms of molar ratio (ingredient (B)/optional acid generator).

Such an acid generator may be any acid generator other than the acid generator according to the invention, and can be selected from compounds generally used as acid generators.

Namely, the acid generator to be optionally used can be suitably selected from photoinitiators for cationic photopolymerization, photoinitiators for radical photopolymerization, photodecolorants or optical color changers for dyes, known compounds used in microresist formation or the like which generate an acid upon irradiation with an actinic ray or a radiation, and mixtures of two or more thereof Examples thereof include diazonium salts, phosphonium salts, sulfonium salts, iodonium salts, imidesulfonates, oximesulfonates, diazodisulfones, disulfones, and o-nitrobenzyl sulfonates.

Also usable are compounds obtained by incorporating any of those groups or compounds which generate an acid upon irradiation with an actinic ray or a radiation into the main chain or side chains of a polymer. Examples thereof are given in, e.g., U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are those compounds generating an acid by the action of light which are described in U.S. Pat. No. 3,779,778, European Patent 126,712, etc.

Examples of the optionally usable compounds which decompose upon irradiation with an actinic ray or a radiation to generate an acid include compounds represented by the following general formulae (ZI), (ZII), and (ZIII).

In general formula (ZI), $R_{201}$, $R_{202}$, and $R_{203}$ each independently represents an organic group.

$X^-$ represents a non-nucleophilic anion.

A non-nucleophilic anion is an anion the ability of which to cause a nucleophilic reaction is exceedingly low and which can be inhibited from being decomposed by an intramolecular nucleophilic reaction with the lapse of time. This anion improves the long-term stability of resists.

The non-nucleophilic anion represented by $X^-$ can be any non-nucleophilic anion other than the anions possessed by the compounds (Bc) according to the invention. Examples thereof include a sulfonic acid anion, carboxylic acid anion, sulfonylimide anion, bis(alkylsulfonyl)imide anion, and tris (alkylsulfonyl)methyl anion.

Examples of the sulfonic acid anion include aliphatic sulfonic acid anions and aromatic sulfonic acid anions. Preferred are a perfluoroalkanesuulfonic acid anion in which the alkyl chain has 1-8 carbon atoms and may contain an oxygen atom therein and a benzenesulfonic acid anion substituted by one or more fluorine atoms or fluoroalkyl groups.

Examples of the carboxylic acid anion include aliphatic carboxylic acid anions, aromatic carboxylic acid anions, and aralkylcarboxylic acid anions.

The alkyl, cycloalkyl, and aryl groups in the aliphatic sulfonic acid anions, aromatic sulfonic acid anions, aliphatic carboxylic acid anions, and aromatic carboxylic acid anions may have substituents.

Examples of the sulfonylimide anion include a saccharin anion.

The alkyl groups in the bis(alkylsulfonyl)imide anion and tris(alkylsulfonyl)methyl anion preferably are alkyl groups having 1-5 carbon atoms. Examples thereof include methyl, ethyl, propyl, isopropyl, n-butyl, isobutyl, sec-butyl, pentyl, and neopentyl. These alkyl groups may have substituents. Examples of the substituents include halogen atoms, alkyl groups substituted by one or more halogen atoms, alkoxy groups, and alkylthio groups. Preferred are alkyl groups substituted by one or more fluorine atoms.

Other examples of the non-nucleophilic anion include phosphorus fluoride, boron fluoride, and antimony fluoride.

The non-nucleophilic anion represented by $X^-$ preferably is an aliphatic sulfonic acid anion in which the sulfonic acid has been substituted in the α-position by one or more fluorine atoms, an aromatic sulfonic acid anion substituted by one or more fluorine atoms or fluorinated groups, a bis(alkylsulfonyl)imide anion in which the alkyl groups have been substituted by one or more fluorine atoms, or a tris(alkylsulfonyl) methide anion in which the alkyl groups have been substituted by one or more fluorine atoms. The non-nucleophilic anion especially preferably is a perfluoroalkanesulfonic acid anion having 4-8 carbon atoms or a benzenesulfonic acid anion having one or more fluorine atoms. Most preferred is a nonafluorobutanesulfonic acid anion, perfluorooctanesulfonic acid anion, pentafluorobenzenesulfonic acid anion, or 3,5-bis(trifluoromethyl)benzenesulfonic acid anion.

The organic groups represented by $R_{201}$, $R_{202}$, and $R_{203}$ each have generally 1-30, preferably 1-20 carbon atoms.

Two of $R_{201}$ to $R_{203}$ may be bonded to each other to form a ring structure, which may contain an oxygen atom, sulfur atom, ester bond, amide bond, or carbonyl group therein.

Examples of the group formed by the bonding of two of $R_{201}$ to $R_{203}$ include alkylene groups (e.g., butylene and pentylene).

Specific examples of the organic groups represented by $R_{201}$, $R_{202}$, and $R_{203}$ include the corresponding groups in the compounds (ZI-1), (ZI-2), and (ZI-3) which will be described later.

A compound having two or more structures represented by general formula (ZI) may also be used. For example, use may be made of a compound having a structure in which at least one of the $R_{201}$ to $R_{203}$ of a compound represented by general formula (ZI) is bonded to at least one of the $R_{201}$ to $R_{203}$ of another compound represented by general formula (ZI).

More preferred examples of the compounds represented by (ZI) include the compounds (ZI-1), (ZI-2), and (ZI-3) which will be explained below.

Compound (ZI-1) is an arylsulfonium compound represented by general formula (ZI) wherein at least one of $R_{201}$ to $R_{203}$ is an aryl group, i.e., a compound including an arylsulfonium as a cation.

The arylsulfonium compound may be one in which all of $R_{201}$ to $R_{203}$ are aryl groups, or may be one in which part of $R_{201}$ to $R_{203}$ is an aryl group and the remainder is an alkyl or cycloalkyl group.

Examples of the arylsulfonium compound include triarylsulfonium compounds, diarylalkylsulfonium compounds, aryldialkylsulfonium compounds, diarylcycloalkylsulfonium compounds, and aryldicycloalkylsulfonium compounds.

The aryl group of the arylsulfonium compound preferably is phenyl or naphthyl, and more preferably is phenyl. In the case where the arylsulfonium compound has two or more aryl groups, these aryl groups may be the same or different.

The alkyl group which is optionally possessed by the arylsulfonium compound preferably is a linear or branched alkyl group having 1-15 carbon atoms. Examples thereof include methyl, ethyl, propyl, n-butyl, sec-butyl, and t-butyl.

The cycloalkyl group which is optionally possessed by the arylsulfonium compound preferably is a cycloalkyl group having 3-15 carbon atoms. Examples thereof include cyclopropyl, cyclobutyl, and cyclohexyl.

The aryl, alkyl, and cycloalkyl groups represented by $R_{201}$ to $R_{203}$ may have substituents selected from alkyl groups (e.g., ones having 1-15 carbon atoms), cycloalkyl groups (e.g., ones having 3-15 carbon atoms), aryl groups (e.g., ones having 6-14 carbon atoms), alkoxy groups (e.g., ones having 1-15 carbon atoms), halogen atoms, hydroxy, and phenylthio. Preferred examples of the substituents are linear or branched alkyl groups having 1-12 carbon atoms, cycloalkyl groups having 3-12 carbon atoms, and linear, branched, or cyclic alkoxy groups having 1-12 carbon atoms. Most preferred are alkyl groups having 1-4 carbon atoms and alkoxy groups having 1-4 carbon atoms. Any one of $R_{201}$ to $R_{203}$ may have such a substituent or each of $R_{201}$ to $R_{203}$ may have such a substituent. In the case where $R_{201}$ to $R_{203}$ are aryl groups, it is preferred that a substituent be bonded to the p-position in each aryl group.

Next, compound (ZI-2) will be explained.

Compound (ZI-2) is a compound represented by formula (ZI) wherein $R_{201}$ to $R_{203}$ each independently represents an organic group containing no aromatic ring. The term aromatic ring herein implies any of aromatic rings including ones containing one or more heteroatoms.

The organic groups containing no aromatic ring which are represented by $R_{201}$ to $R_{203}$ each have generally 1 to 30, preferably 1 to 20 carbon atoms.

Preferably, $R_{201}$ to $R_{203}$ each independently is an alkyl, cycloalkyl, 2-oxoalkyl, 2-oxocycloalkyl, alkoxycarbonylmethyl, allyl, or vinyl group. $R_{201}$ to $R_{203}$ each more preferably are a linear or branched 2-oxoalkyl, 2-oxocycloalkyl, or alkoxycarbonylmethyl group, and most preferably are a linear or branched 2-oxoalkyl group.

The alkyl groups represented by $R_{201}$ to $R_{203}$ preferably are linear or branched alkyl groups having 1-10 carbon atoms. Examples thereof include methyl, ethyl, propyl, butyl, and pentyl.

The cycloalkyl groups represented by $R_{201}$ to $R_{203}$ preferably are cycloalkyl groups having 3-10 carbon atoms. Examples thereof include cyclopentyl, cyclohexyl, and norbornyl.

Preferred examples of the 2-oxoalkyl groups and 2-oxocycloalkyl groups represented by $R_{201}$ to $R_{203}$ include the alkyl and cycloalkyl groups enumerated above which each have >C=O in the 2-position.

Examples of the alkoxy groups in the alkoxycarbonylmethyl groups represented by $R_{201}$ to $R_{203}$ include alkoxy groups preferably having 1-5 carbon atoms (methoxy, ethoxy, propoxy, butoxy, and pentoxy).

$R_{201}$ to $R_{203}$ may have been further substituted by substituents selected from halogen atoms, alkoxy groups (e.g., ones having 1-5 carbon atoms), hydroxy, cyano, and nitro.

Compound (ZI-3) is a compound represented by the following general formula (ZI-3). Namely, it is a compound having a phenacylsulfonium salt structure.

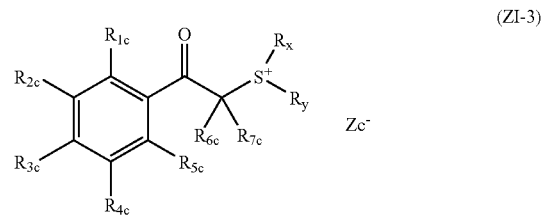

(ZI-3)

In general formula (ZI-3), $R_{1C}$ to $R_{5C}$ each independently represents a hydrogen atom, alkyl, cycloalkyl, or alkoxy group, or halogen atom.

$R_{6C}$ and $R_{7C}$ each represent a hydrogen atom or an alkyl or cycloalkyl group.

$R_x$ and $R_y$ each independently represents an alkyl, cycloalkyl, allyl, or vinyl group.

Two or more of $R_{1C}$ to $R_{5C}$ may be bonded to each other to form a ring structure, and $R_x$ and $R_y$ may be bonded to each other to form a ring structure. These ring structures may contain an oxygen atom, sulfur atom, ester bond, or amide bond.

$Zc^-$ represents a non-nucleophilic anion. Examples thereof include the same anions as those enumerated above as examples of the non-nucleophilic anion $X^-$ in general formula (ZI).

The alkyl groups represented by $R_{1C}$ to $R_{7C}$ preferably are linear or branched alkyl groups having 1-20 carbon atoms. Examples thereof include methyl, ethyl, linear or branched propyl, linear or branched butyl, and linear or branched pentyl.

The cycloalkyl groups represented by $R_{1C}$ to $R_{7C}$ preferably are cycloalkyl groups having 3-8 carbon atoms. Examples thereof include cyclopentyl and cyclohexyl.

The alkoxy groups represented by $R_{1C}$ to $R_{5C}$ may be either linear or branched or cyclic. Examples thereof include alkoxy groups having 1-10 carbon atoms. Preferred examples thereof include linear or branched alkoxy groups having 1-5 carbon atoms (e.g., methoxy, ethoxy, linear or branched propoxy, linear or branched butoxy, and linear or branched pentoxy) and cyclic alkoxy groups having 3-8 carbon atoms (e.g., cyclopentyloxy and cyclohexyloxy).

It is preferred that any of $R_{1C}$ to $R_{5C}$ be a linear or branched alkyl group, cycloalkyl group, or linear, branched, or cyclic alkoxy group. It is more preferred that the total number of carbon atoms in $R_{1C}$ to $R_{5C}$ be from 2 to 15. This compound has further improved solubility in solvents and is inhibited from generating particles during storage.

Examples of the alkyl groups represented by $R_x$ and $R_y$ include the same groups as those enumerated above as examples of the alkyl groups represented by $R_{1C}$ to $R_{7C}$. More preferred are 2-oxoalkyl groups and alkoxycarbonylmethyl groups.

Examples of the 2-oxoalkyl groups include those alkyl groups represented by $R_{1C}$ to $R_{7C}$ which each have >C=O in the 2-position.

Examples of the alkoxy groups in the alkoxycarbonylmethyl groups include the same groups as those enumerated above as examples of the alkoxy groups represented by $R_{1C}$ to $R_{5C}$.

Examples of the cycloalkyl groups represented by $R_x$ and $R_y$ include the same groups as those enumerated above as examples of the cycloalkyl groups represented by $R_{1c}$ to $R_{7c}$.

Preferred are 2-oxocycloalkyl groups.

Examples of the 2-oxocycloalkyl groups include those cycloalkyl groups represented by $R_{1c}$ to $R_{7c}$ which each have >C=O in the 2-position.

$R_x$ and $R_y$ each preferably are an alkyl group having 4 or more carbon atoms or a cycloalkyl group, and more preferably are an alkyl group having 6 or more, especially preferably 8 or more carbon atoms or a cycloalkyl group.

Examples of the groups respectively formed by the bonding of two or more of $R_{1c}$ to $R_{5c}$ and bonding of $R_x$ and $R_y$ include butylene and pentylene.

In general formulae (ZII) and (ZIII), $R_{204}$ to $R_{207}$ each independently represents an aryl, alkyl, or cycloalkyl group.

The aryl groups represented by $R_{204}$ to $R_{207}$ preferably are phenyl or naphthyl, and more preferably are phenyl.

The alkyl groups represented by $R_{204}$ to $R_{207}$ preferably are linear or branched alkyl groups having 1-10 carbon atoms. Examples thereof include methyl, ethyl, propyl, butyl, and pentyl.

The cycloalkyl groups represented by $R_{204}$ to $R_{207}$ preferably are cycloalkyl groups having 3-10 carbon atoms. Examples thereof include cyclopentyl, cyclohexyl, and norbornyl.

$R_{204}$ to $R_{207}$ may have substituents. Examples of the substituents which may be possessed by $R_{204}$ to $R_{207}$ include alkyl groups (e.g., ones having 1-15 carbon atoms), cycloalkyl groups (e.g., ones having 3-15 carbon atoms), aryl groups (e.g., ones having 6-15 carbon atoms), alkoxy groups (e.g., ones having 1-15 carbon atoms), halogen atoms, hydroxy, and phenylthio.

$X^-$ represents a non-nucleophilic anion, and examples thereof include the same anions as those enumerated above as examples of the non-nucleophilic anion $X^-$ in general formula (ZI).

Other examples of the optionally usable compounds which decompose upon irradiation with an actinic ray or a radiation to generate an acid include compounds represented by the following general formulae (ZIV), (ZV), and (ZVI).

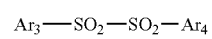

ZIV

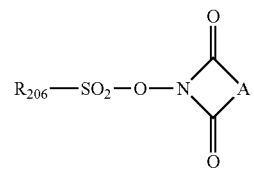

ZV

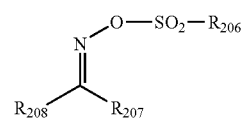

ZVI

In general formulae (ZIV) to (ZVI), $Ar_3$ and $Ar_4$ each independently represents an aryl group.

$R_{206}$, $R_{207}$, and $R_{208}$ each represent an alkyl, cycloalkyl, or aryl group.

Symbol A represents an alkylene, alkenylene, or arylene group.

$Ar_3$, $Ar_4$, $R_{206}$, $R_{207}$, $R_{208}$, A, $Ar_3$, and $Ar_4$ may have substituents.

Even, more preferred of the optionally usable compounds which decompose upon irradiation with an actinic ray or a radiation to generate an acid are the compounds represented by general formulae (ZI) to (ZIII).

Examples of especially preferred compounds among the optionally usable compounds which decompose upon irradiation with an actinic ray or a radiation to generate an acid are shown below.

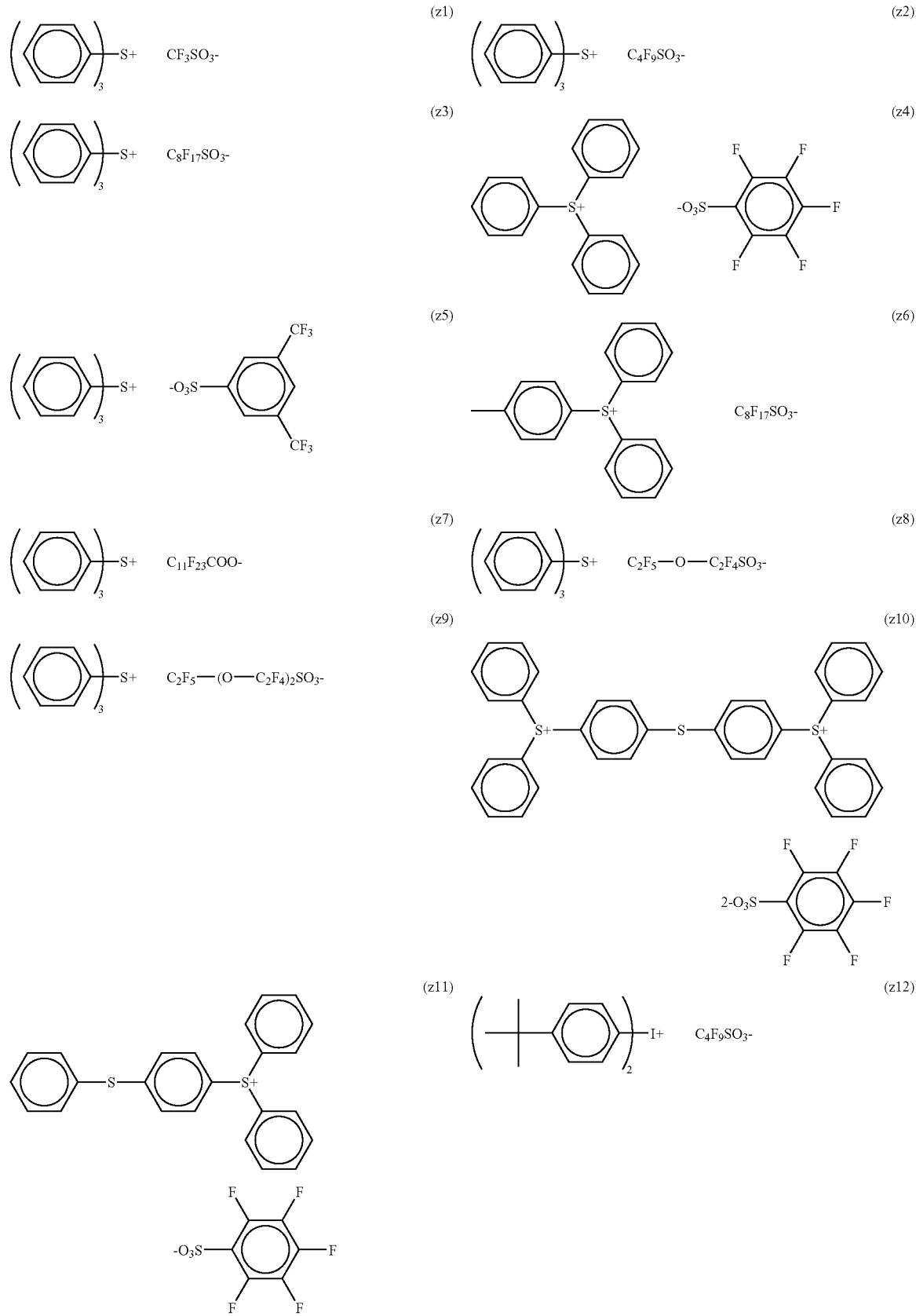

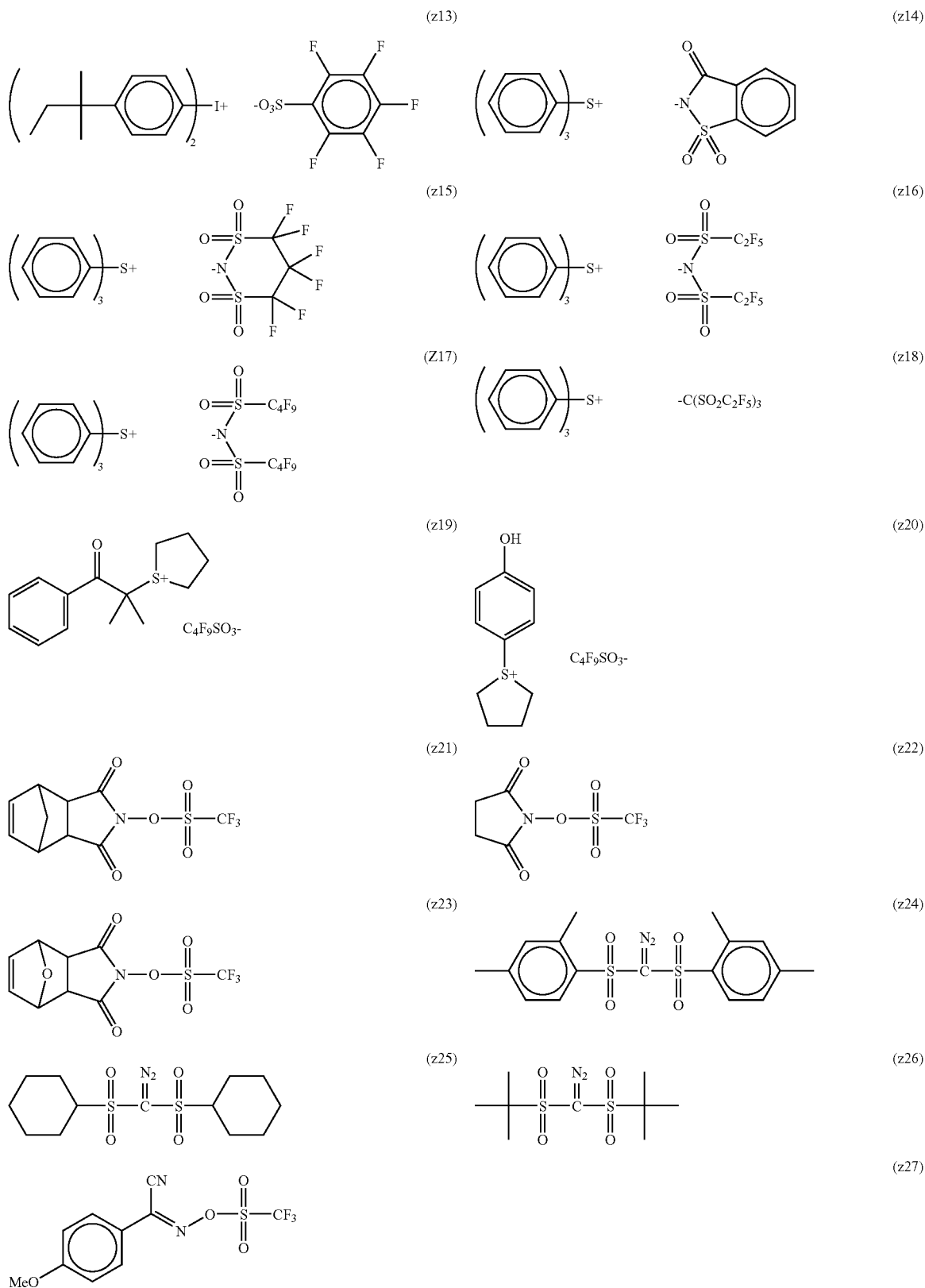

-continued

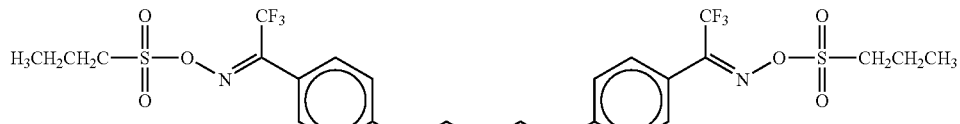
(z28)

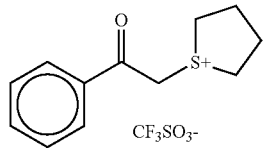
(z29)

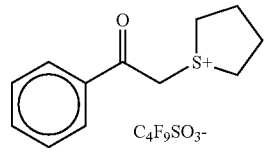
(z30)

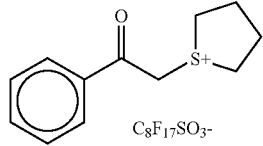
(z31)

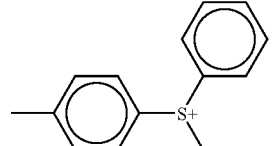
(z32)

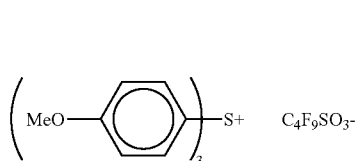
(z33)

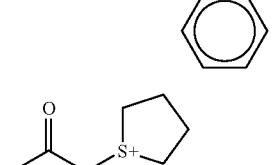
(z34)

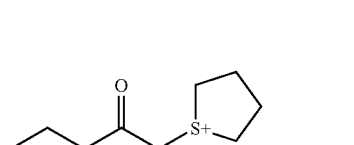
(z35)

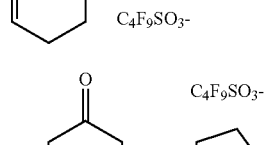
(z36)

The content of the compound as ingredient (B) in the positive resist composition for immersion exposure of the invention is preferably 0.1-20% by mass, more preferably 0.5-10% by mass, even more preferably 1-7% by mass, based on all solid components of the composition.

(C) Basic Compound

The positive resist composition for immersion exposure of the invention preferably further contains a basic compound. As the basic compound is used, for example, a nitrogen-containing basic compound, basic ammonium salt, basic sulfonium salt, basic iodonium salt, or the like. Any of such compounds may be used as long as it neither sublimes nor deteriorates resist performance.

The basic compound is an ingredient which functions to prevent the acid generated by the acid generator upon exposure from diffusing in the resist film and thereby inhibit undesirable chemical reactions from occurring in the unexposed areas. By incorporating such a basic compound, not only the acid generated by the acid generator upon exposure is prevented from diffusing in the resist film but also the positive resist composition for immersion exposure obtained has improved storage stability and gives a resist having further improved resolution. In addition, resist patterns can be inhibited from fluctuating in line width with fluctuations of time delay between exposure and development (PED). Consequently, a composition having highly excellent process stability can be obtained.

Examples of the nitrogen-containing basic compound include primary, secondary, and tertiary aliphatic amines, aromatic amines, heterocyclic amines, nitrogen-containing compounds having one or more carboxy groups, nitrogen-containing compounds having one or more sulfonyl groups, nitrogen-containing compounds having one or more hydroxy groups, nitrogen-containing compounds having one or more hydroxyphenyl groups, alcoholic nitrogen-containing compounds, amides and derivatives thereof, imides and derivatives thereof, and nitrogen-containing compounds having one or more cyano groups.

Examples of the aliphatic amines include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamino, nonylamine, decylamine, dodecylamine, cetylamine, methylenediamine, ethylenediamine, tetraethylenepentamine, dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, N,N-dimethyltetraethylenepentamine, trimethylamine, triethylamine, tri-n-propylamine, triisopropylamine, tri-n-butylamine, triisobutylamine, tri-sec-butylamine, triphenylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, N,N,N',N'-tetramethyltetraethylenepentamine, dimethylethylamine, methylethylpropylamine, benzylamine, phenethylamine, and benzyldimethylamine.

Examples of the aromatic amines and heterocyclic amines include aniline and derivatives thereof (e.g., N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole and derivatives thereof (e.g., 2H-pyrrole, 1-methylpyrrole, 2,4-dimethylpyrrole, 2,5-dimethylpyrrole, and N-methylpyrrole), oxazole and derivatives thereof (e.g., isoxazole), thiazole and derivatives thereof (e.g., isothiazole), imidazole and derivatives thereof (e.g., 4-methylimidazole and 4-methyl-2-phenylimidazole), pyrazole and derivatives thereof, furazane and derivatives thereof, pyrroline and derivatives thereof (e.g., 2-methyl-1-pyrroline), pyrrolidine and derivatives thereof (e.g., N-methylpyrrolidine, pyrrolidinone, and N-methylpyrrolidone), imidazoline and derivatives thereof, imidazolidine and derivatives thereof, pyridine and derivatives thereof (e.g., methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine and derivatives thereof, pyrimidine and derivatives thereof, pyrazine and derivatives thereof, pyrazoline and derivatives thereof, pyrazolidine and derivatives thereof, piperidine and derivatives thereof, piperazine and derivatives thereof, morpholine and derivatives thereof, indole and derivatives thereof, isoindole and derivatives thereof, 1H-indazole and derivatives thereof, indoline and derivatives thereof, quinoline and derivatives thereof (e.g., 3-quinolinecarbonitrile), isoqinoline and derivatives thereof, cinnoline and derivatives thereof, quinazoline and derivatives thereof, quinoxaline and derivatives thereof, phthalazine and derivatives thereof, purine and derivatives thereof, pteridine and derivatives thereof, carbazole and derivatives thereof, phenanthridine and derivatives thereof, acridine and derivatives thereof, phenazine and derivatives thereof, 1,10-phenanthroline and derivatives thereof, adenine and derivatives thereof, adenosine and derivatives thereof, guanine and derivatives thereof, guanosine and derivatives thereof, uracil and derivatives thereof, and urazine and derivatives thereof.

Examples of the nitrogen-containing compounds having one or more carboxy groups include aminobenzoic acid, indolecarboxylic acid, and amino acids and derivatives thereof (e.g., nicotinic acid, alanine, arginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of the nitrogen-containing compounds having one or more sulfonyl groups include 3-pyridinesulfonic acid and pyridinium p-toluenesulfonate.

Examples of the nitrogen-containing compounds having one or more hydroxy groups include 2-hydroxypyridine, aminocresol, 2,4-quinolinediol, 3-indole-methanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine-ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidineethanol, 1-aziridine-ethanol, N-(2-hyrdoxyethyl)phthalimide, and N-(2-hydroxyethyl)isonicotinamide.

Examples of the amides and derivatives include formamide, N-methylformamide, N,N-dimethylformamide, acetamide, N-methylacetamide, N,N-dimethylacetamide, propionamide, and benzamide.

Examples of the imides and derivatives include phthalimide, succinimide, and maleimide.

Examples of the nitrogen-containing compounds having one or more cyano groups include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxy-ethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyano-ethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyano-ethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidylpropiononitrile, 1-piperidinopropiononitrile, 4-morpholinopropiononitrile, 1-pyrrolidylacetonitrile, 1-piperidinoacetonitrile, 4-morpholinoacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N'-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidylpropionate, cyanomethyl 1-piperidinopropionate, cyanomethyl 4-morpholinopropionate, 2-cyanoethyl 1-pyrrolidylpropionate, 2-cyanoethyl 1-piperidinopropionate, and 2-cyanoethyl 4-morpholinopropionate.

Preferred examples of the nitrogen-containing basic compound include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine and analogues thereof, hexamethylenetetramine, imidazole and analogues thereof, hydroxypyridine and analogues thereof, pyridine and analogues thereof, aniline and analogues thereof, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, triisooctylamine, tris(ethylhexyl)amine, tridecylamine, tridodecylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, N,N,N',N'-tetrakis(2-hydroxypropyl)ethylenediamine, tri(cyclo)alkylamines such as tricyclohexylamine, aromatic amines such as aniline, N-methylaniline, N,N-dimethylaniline, 2-methylaniline, 3-methylaniline, 4-methylaniline, 4-nitroaniline, diphenylamine, triphenylamine, naphthylamine, and 2,6-diisopropylaniline, polyethyleneimine, polyallylamine, polymers of 2-dimethylaminoethylacrylamide, N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-N-methyl-1-adamantylamine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, formamide, N-methylformamide, N,N-dimethylformamide, acetamide, N-methylacetamide, N,N-dimethylacetamide, propionamide, benzamide, pyrrolidone, N-methylpyrrolidone, urea, methylurea, 1,1-dimethylurea, 1,3-dimethylurea, 1,1,3,3-tetramethylurea, 1,3-diphenylurea, tri-n-butylthiourea, imidazole and analogues thereof such as 4-methylimidazole, 4-methyl-2-phenylimidazole, benzimidazole, and 2-phenylbenzimidazole, pyridine and analogues thereof such as 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroquinoline, 8-hydroxyquinoline, and acridine, piperazine and analogues thereof such as 1-(2-hydroxyethyl)piperazine, pyrazine, pyrazole, pyridazine, quinazoline, purine, pyrrolidine, piperidine, 3-piperidino-1,2-propanediole, morpholine, 4-methylmorpholine, and 1,4-dimethylpiperazine.

Especially preferred of those are nitrogen-containing basic compounds such as 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazole and its analogues, hydroxypyridines, pyridine and its analogues, 4,4'-diaminodiphenyl ether, triethylamine, tributylamine, tripentylamine, tri-n-octylamine, tris(ethylhexyl)amine, tridodecylamine, N,N-dihydroxyethylaniline, and N-hydroxyethyl-N-ethylaniline.

A basic ammonium salt also can be used as the basic compound in the positive resist composition for immersion exposure of the invention. Although examples of the basic ammonium salt include the following compounds, the salt should not be construed as being limited to these.

Examples of the basic ammonium salt include ammonium hydroxides, ammonium triflates, ammonium pentaflates, ammonium heptaflates, ammonium nonaflates, ammonium undecaflates, ammonium tridecaflates, ammonium pentadecaflates, ammonium methylcarboxylate, ammonium ethylcarboxylate, ammonium propylcarboxylate, ammonium butylcarboxylate, ammonium heptylcarboxylate, ammonium hexylcarboxylate, ammonium octylcarboxylate, ammonium nonylcarboxylate, ammonium decylcarboxylate, ammonium undecylcarboxylate, ammonium dodecadecylcarboxylate, ammonium tridecylcarboxylate, ammonium tetradecylcarboxylate, ammonium pentadecylcarboxylate, ammonium hexadecylcarboxylate, ammonium heptadecylcarboxylate, and ammonium octadecylcarboxylate.

Examples of the ammonium hydroxides include tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraheptylammonium hydroxide, methyltrioctylammonium hydroxide, tetraoctylammonium hydroxide, didecyldimethylammonium hydroxide, tetrakisdecylammonium hydroxide, dodecyltrimethylammonium hydroxide, dodecylethyldimethylammonium hydroxide, didodecyldimethylammonium hydroxide, tridodecylmethylammonium hydroxide, myristylmethylammonium hydroxide, dimethylditetradecylammonium hydroxide, hexadecyltrimethylammonium hydroxide, octadecyltrimethylammonium hydroxide, dimethyldioctadecylammonium hydroxide, tetraoctadecylammonium hydroxide, diallyldimethylammonium hydroxide, (2-chloroethyl)trimethylammonium hydroxide, (2-bromoethyl)trimethylammonium hydroxide, (3-bromopropyl)trimethylammonium hydroxide, (3-bromopropyl)triethylammonium hydroxide, glycidyltrimethylammonium hydroxide, choline hydroxide, (R)-(+)-(3-chloro-2-hydroxypropyl)trimethylammonium hydroxide, (S)-(−)-(3-chloro-2-hydroxypropyl)

trimethylammonium hydroxide, (3-chloro-2-hydroxypropyl)trimethylammonium hydroxide, (2-aminoethyl)trimethylammonium hydroxide, hexamethonium hydroxide, decamethonium hydroxide, 1-azoniapropellane hydroxide, petronium hydroxide, 2-chloro-1,3-dimethyl-2-imidazolinium hydroxide, and 3-ethyl-2-methyl-2-thiazolinium hydroxide.

The positive resist composition for liquid immersion exposure according to the present invention preferably contains a nitrogen-containing compound free of oxygen atom (Ca) as the basic compound (C). As the nitrogen-containing compound free of oxygen atom (Ca), aliphatic amines, aromatic amines, heterocyclic amines, and nitrogen-containing compounds having a cyano group may be mentioned.

As the aliphatic amine, tri(cyclo)alkylamine compounds are exemplified such as diisobutylamine, di-sec-butylamine, dipentylamine, dicylcopentylamine, dihexylamine, dicyclohexylamine, diheptylamine, N,N-dimethylmethylendiamine, N,N-dimethylethylenediamine, N,N-dimethyltetraethylenepentamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylendiamine, N,N,N',N'-tetramethyltetraethylenepentamine, dimethylethylamine, methylethylpropylamine, benzylamine, phenethylamine, benzyldimethylamine, 1,5-diazabicyclo[4.3.0]-5-nonen, 1,8-diazabicyclo[5.4.0]-7-undecene, 1,4-diazabicyclo[2.2.2]octane, hexamethylenetetramine, 4,4'-diaminodiphenylmethane, 4,4'-diaminodiphenylamine, 2,2-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene bis(2-dimethylaminoethyl)ether, bis(2-diethylaminoethyl)ether, and tricyclohexylamine.

As the aromatic amine or heterocyclic amine compounds, for example, aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, N,N-dimethyltoluidine, etc.), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole, etc.), thiazole derivatives (e.g., thiazole, isothiazole, etc.), imidazole derivatives (e.g., imidazole, 4-methylimidazole, 4-methyl-2-phenylimidazole, etc.), pyrazole derivatives, furazane derivatives, pyrroline derivatives (e.g., pyrroline, 2-methyl-1-pyrroline, etc.), pyrrolidine derivatives (e.g., pyrrolidine, N-methylpyrrolidine, pyrrolidinone, N-methylpyrrolidone, etc.) imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrolidinopyridine, 1-methyl-4-phenylpyridine, 2-(1-ethylpropyl)pyridine, aminopyridine, dimethylaminopyridine, etc.), pyridazine derivatives, pyrimidine derivatives, pyrazine derivatives, pyrazoline derivatives, pyazolidine derivatives, piperidine derivatives, piperazine derivatives, indole derivatives, isoindole derivatives, 1H-indazole derivatives, indoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, diphenylamine, triphenylamine, naphthylamine, 2,6-diisopropylaniline, etc. piperazine compounds such as piperazine, pyrazine, pyrazole, pyridazine, quinazoline, purine, pyrrolidine, piperidine, 1,4-dimethylpiperazine, N,N,N',N'-tetrabutylbenzidine, and tris[4-(dimethylamino)phenyl]methane-4,4'-methylenebis(2,6-diisopropylaniline) can be mentioned.

As the nitrogen-containing compound having a cyano group, specifically 3-(diethylamino)propiononitrile, N-(2-cyanoethyl)-N-ethyl-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(cyanomethyl)aminoacetonitrile, 1-pyrrolidinepropiononitrile, 1-piperidinepropiononitrile, 1-pyrrolidineacetonitrile, and 1-piperidineacetonitrile can be mentioned.

Among those, 1,5-diazabicyclo[4.3.0]-5-nonene, 1,8-diazoabicyclo[5.4.0]-7-undecene, 1,4-diazabicyclo[2.2.2]octane, 4-dimethylaminopyridine, 1-naphthylamine, piperidine, hexamethylenetetramine, imidazole compounds, pyridine compounds, aniline compounds, tripentylamine, tri-n-octylamine, tris(ethylhexyl)amine and tridodecylamine are specifically preferred.

Basic compounds can be used alone or in combination of two or more thereof. It is more preferred to use a combination of two or more thereof The total amount of the basic compound(s) to be used is generally 0.001-10% by mass, preferably 0.01-5% by mass, based on the solid components of the positive resist composition for immersion exposure.

(D) Surfactant

The positive resist composition for immersion exposure of the invention preferably further contains one or more surfactants. It is preferred that the composition should contain any one of or two or more of fluorochemical and/or silicone surfactants (fluorochemical surfactants, silicone surfactants, and surfactants containing both fluorine atoms and silicon atoms).

When the positive resist composition for immersion exposure of the invention contains such a surfactant, it can show satisfactory sensitivity and resolution when irradiated with an exposure light having a wavelength of 250 nm or shorter, especially 220 nm or shorter, and give a resist pattern having satisfactory adhesion and reduced in development defects.

Examples of the fluorochemical and/or silicone surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511, and 5,824,451. It is also possible to use the following commercial surfactants as they are.

Examples of usable commercial surfactants include fluorochemical or silicone surfactants such as F-Top EF301 and EF303 (manufactured by New Akita Chemical Company), Fluorad FC430 and 431 (manufactured by Sumitomo 3M Ltd.), Megafac F171, F173, F176, F189, and R08 (manufactured by Dainippon Ink & Chemicals, Inc.), Surflon S-382 and SC101, 102, 103, 104, 105, and 106 (manufactured by Asahi Glass Co., Ltd.), and Troysol S-366 (manufactured by Troy Chemical Co., Ltd.). Polysiloxane polymer IU-341 (manufactured by Shin-Etsu Chemical Co., Ltd.) can also be used as a silicone surfactant.

Also usable besides the known surfactants shown above is a surfactant comprising a polymer having a fluoroaliphatic group and derived from a fluoroaliphatic compound produced by the telomerization method (also called telomer method) or oligomerization method (also called oligomer method). The fluoroaliphatic compound can be synthesized by the method described in JP-A-2002-90991.

The polymer having a fluoroaliphatic group preferably is a copolymer of a monomer having a fluoroaliphatic group with a poly(oxyalkylene) acrylate and/or a poly(oxyalkylene) methacrylate. This copolymer may be one in which the monomer units are randomly distributed or be a block copolymer. Examples of the poly(oxyalkylene) group include poly(oxyethylene), poly(oxypropylene), and poly(oxybutylene). The poly(oxyalkylene) group may be a unit having, in the same chain, alkylenes having different chain lengths, such as a poly(blocks of oxyethylene, oxypropylene, and oxyethylene) or poly(blocks of oxyethylene and oxypropylene) group. The copolymer of a monomer having a fluoroaliphatic group with a poly(oxyalkylene) acrylate (or methacrylate) is not limited to binary copolymers, and may be a copolymer of three or more monomers which is obtained by copolymerization in which two or more different monomers each having a fluoroaliphatic group, two or more different poly(oxyalkylene) acrylates (or methacrylates), etc. are simultaneously copolymerized.

Examples of commercial surfactants include Megafac F178, F-470, F-473, F-475, F-476, and F-472 (manufactured by Dainippon Ink & Chemicals, Inc.). Examples of the polymer having a fluoroaliphatic group further include a copolymer of an acrylate (or methacrylate) having a $C_6F_{13}$ group with a poly(oxyalkylene) acrylate (or methacrylate), a copolymer of an acrylate (or methacrylate) having a $C_6F_{13}$ group with poly(oxyethylene) acrylate (or methacrylate) and poly(oxypropylene) acrylate (or methacrylate), a copolymer of an acrylate (or methacrylate) having a $C_8F_{17}$ group with a poly(oxyalkylene) acrylate (or methacrylate), and a copolymer of an acrylate (or methacrylate) having a $C_8F_{17}$ group with poly(oxyethylene) acrylate (or methacrylate) and poly(oxypropylene) acrylate (or methacrylate).

The positive resist composition for liquid immersion exposure of the present invention preferably contains a fluorochemical nonionic surfactant (Da) as a surfactant (D).

As commercially available products of the fluorochemical nonionic surfactant (Da), PF 636, PF 656, PF 6320 and PF 6520 (products of OMNOVA), FTX-204d, 208G 218G 230G, 204G, 204D, 208D, 212D, 218, 222d, 720C and 740C (products of Neos, Inc.), and Eftop EF-121, 122a, 122B, 122C, 125M, 135M, 802 and 601 (products of JEMCO), Surflon S-393 (a product of Seimi Chemical Co., Ltd.), Megafac F-177, R-08 and F142D (products of Dainippon Ink and Chemicals, Inc.) can be mentioned wherein PF 636, PF 656, PF 6320 and PF 6520 (products of OMNOVA) are more preferred.

A fluorochemical nonionic surfactant (Da) can be synthesized by radical polymerization or ring-opening polymerization. As the fluorochemical nonionic surfactant (Da) that can be synthesized by polymerization reaction, (meth)acrylate derivatives, poly(vinyl alcohol) derivatives, hexafluoropropene derivatives, polymerized products by ring opening of ethyleneoxy-containing oligomers, epoxides and oxetane compounds, silane-coupling derivatives, and saccharide derivatives can be mentioned.

The weight-average molecular weight of the fluorochemical nonionic surfactant (Da) is preferably 1000 or more, and more preferably from 1000 to 10000.

Surfactants other than the fluorochemical and/or silicone surfactants and the fluorochemical nonionic surfactant (Da) may be used in the invention. Examples thereof include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene/polyoxypropylene block copolymers, sorbitan/fatty acid esters such as sorbitan monolaurate, sorbitan monopalmitate, sorbitan monostearate, sorbitan monooleate, sorbitan trioleate, and sorbitan tristearate, and polyoxyethylene-sorbitan/fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

Those surfactants may be used alone or in combination of two or more thereof.

The amount of the surfactant to be used is preferably 0.0001-2% by mass, more preferably 0.001-1% by mass, based on the total amount of the positive resist composition for immersion exposure (excluding the solvent).

(E) Organic Solvent

The positive resist composition for immersion exposure of the invention to be used is prepared by dissolving the ingredients in a given organic solvent.

Examples of usable organic solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, methoxybutanol, and tetrahydrofuran.

In the invention, a mixed solvent prepared by mixing at least one solvent containing one or more hydroxy groups in the structure with at least one solvent containing no hydroxy group may be used as the organic solvent.

Examples of the solvent containing one or more hydroxy groups include ethylene glycol, ethylene glycol monomethyl ether, ethylene glycol monoethyl ether, propylene glycol, propylene glycol monomethyl ether, propylene glycol monoethyl ether, and ethyl lactate. Preferred of these are propylene glycol monomethyl ether and ethyl lactate.

Examples of the solvent containing no hydroxy group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Preferred of these are propylene glycol monomethyl ether acetate, ethyl ethoxypropionate, 2-heptanone, γ-butyrolactone, cyclohexanone, and butyl acetate. More preferred are propylene glycol monomethyl ether acetate, ethyl ethoxypropionate, and 2-heptanone.

The proportion (by weight) of the solvent containing one or more hydroxy groups to the solvent containing no hydroxy group is preferably from 1/99 to 99/1, more preferably from 10/90 to 90/10, even more preferably from 20/80 to 60/40. A mixed solvent in which the content of the (F) Dissolution Inhibitive Compound Having Molecular Weight of 3,000 or Lower and Decomposing by Action of Acid to Show Enhanced Solubility in Alkaline developer The positive resist composition for immersion exposure of the invention preferably contains a dissolution inhibitive compound which has a molecular weight of 3,000 or lower and decomposes by the action of an acid to show enhanced solubility in an alkaline developer (hereinafter referred to also as "dissolution inhibitive compound").

The dissolution inhibitive compound preferably is an alicycilc or aliphatic compound having an acid-dissociable group, such as the cholic acid derivatives containing an acid-dissociable group which are described in *Proceeding of SPIE*, 2724, 355(1996), so as not to reduce transmission at wavelengths of 220 nm and shorter. Examples of the acid-dissociable group and alicyclic structure are the same as those described above with regard to the resin as ingredient (A).

The dissolution inhibitive compound in the invention has a molecular weight of 3,000 or lower, preferably 300-3,000, more preferably 500-2,500.

The amount of the dissolution inhibitive compound to be added is preferably 1-30% by mass, more preferably 2-20% by mass, based on all solid components of the positive resist composition for immersion exposure.

Examples of the dissolution inhibitive compound are shown below, but the compound should not be construed as being limited to the following examples.

solvent containing no hydroxy group is 50% by mass or higher is especially preferred from the standpoint of evenness of application.

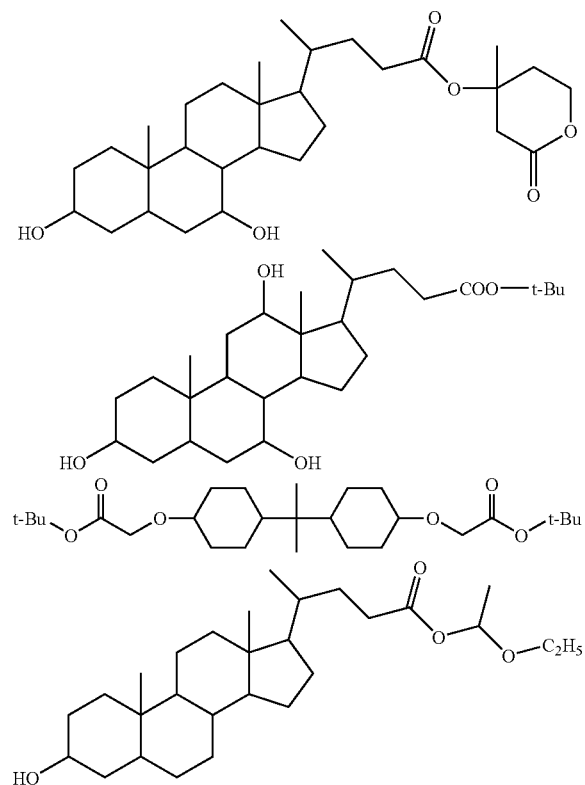

-continued

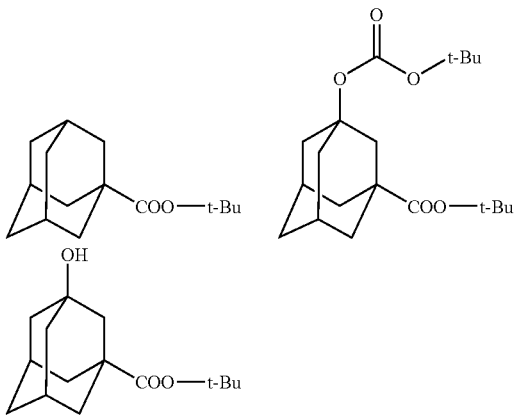

(G) Alkali-Soluble Resin

The positive resist composition for immersion exposure of the invention can further contain a resin soluble in an alkaline developer. Incorporation of this resin improves sensitivity.

A novolak resin having a molecular weight of about 1,000-20,000 or a polyhydroxystyrene derivative having a molecular weight of about 3,000-50,000 can be used as the resin in the invention. However, since these polymers considerably absorb light having a wavelength of 250 nm or shorter, it is preferred to use the polymers in a partly hydrogenated form or in an amount up to 30% by mass based on all resins.

A resin having carboxyl groups as alkali-soluble groups can also be used. The resin having carboxyl groups preferably has a mono- or polycyclic aliphatic hydrocarbon group so as to improve dry etching resistance. Examples thereof include copolymers of (meth)acrylic acid and a methacrylic ester having an alicyclic hydrocarbon structure which is not acid-decomposable and resins of a (meth)acrylic ester having an alicyclic hydrocarbon group having a carboxyl group at the end.

The amount of such an alkali-soluble resin to be added is generally 30% by mass or smaller based on the total amount of the resins including the acid-decomposable resin.

(H) Carboxylic Acid Onium Salt

The positive resist composition for immersion exposure of the invention may contain a carboxylic acid onium salt.

Examples of the carboxylic acid onium salt in the invention include carboxylic acid sulfonium salts, carboxylic acid iodonium salts, and carboxylic acid ammonium salts. Especially preferred carboxylic acid onium salts of these are iodonium salts and sulfonium salts. The carboxylic acid onium salt to be used in the invention preferably is one in which the carboxylate residue contains neither an aromatic group nor a carbon-carbon double bond. An especially preferred anion part is an alkanecarboxylic acid anion in which the alkyl group is a linear, branched, monocyclic, or polycyclic alkyl having 1-30 carbon atoms. More preferred is such carboxylic acid anion in which the alkyl group has been partly or wholly substituted by fluorine. The alkyl chain may contain an oxygen atom therein. Incorporation of the carboxylic acid onium salt not only improves sensitivity and resolution while securing transparency to light having a wavelength of 220 nm or shorter but also attains improvements in resolution independence from the degree of line density and in exposure margin.

Examples of the fluorine-substituted carboxylic acid anion include the anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid.

Those carboxylic acid onium salts can be synthesized by reacting a sulfonium hydroxide, iodonium hydroxide, or ammonium hydroxide with carboxylic acids in an appropriate solvent with the acid of silver oxide.

The content of the carboxylic acid onium salt in the composition is desirably 0.1-20% by mass, preferably 0.5-10% by mass, more preferably 1-7% by mass, based on all solid components of the composition.

Other Additives

A dye, plasticizer, photosensitizer, compound enhancing solubility in developing solutions (e.g., a phenolic compound having a molecular weight of 1,000 or lower or an alicyclic or aliphatic compound having one or more carboxyl groups), and other additives may be further incorporated according to need into the positive resist composition for immersion exposure of the invention.

The phenolic compound having a molecular weight of 1,000 or lower can be easily synthesized by persons skilled in the art while referring to methods described in, e.g., JP-A-4-122938, JP-A-2-28531, U.S. Pat. No. 4,916,210, and European Patent 219,294.

Examples of the alicyclic or aliphatic compound having one or more carboxyl groups include carboxylic acid derivatives having a steroid structure, such as cholic acid, deoxycholic acid, and lithocholic acid, adamantanecarboxylic acid derivatives, adamantanedicarboxylic acid, cyclohexanecarboxylic acid, and cyclohexanedicarboxylic acid. However, the alicyclic or aliphatic compound should not be construed as being limited to these.

(Method of Use)

When the positive resist composition for immersion exposure of the invention is used, the ingredients are dissolved in a given organic solvent, preferably the mixed solvent described above, and the resultant solution is applied to a given substrate in the following manner.

Namely, the positive resist composition for immersion exposure is applied to a base such as one for use in producing precision integrated-circuit elements (e.g., a silicon base coated with silicon oxide) by an appropriate coating technique using a spinner, coater, or the like in a desired thickness (generally 50-500 nm).

After the application, the resist composition applied is dried by spinning or baking to form a resist film. Thereafter, this resist film is exposed to light through an immersion liquid (immersion exposure) using a technique for pattern formation, e.g., irradiation through a mask. For example, the resist film is exposed to light, with the space between the film and an optical lens filled with an immersion liquid. Although the exposure amount may be suitably determined, it is generally 1-100 mJ/cm$^2$. After the exposure, the resist film is preferably subjected to spinning and/or baking and is then developed and rinsed to give a satisfactory pattern. The baking temperature is generally 30-300° C. The shorter the time period from the exposure to the baking step, the better.

Examples of the exposure light to be used here include far ultraviolet rays having a wavelength of preferably 250 nm or shorter, more preferably 220 nm or shorter. Specific examples thereof include KrF excimer laser light (248 nm), ArF excimer laser light (193 nm), F$_2$ excimer laser light (157 nm), and X-rays. More preferred is ArF excimer laser light (193 nm).

Incidentally, the changes in performance which are observed in resist application to immersion exposure are thought to be attributable to the fact that the resist surface is in contact with the immersion liquid.

The immersion liquid to be used in the immersion exposure will be explained below.

The immersion liquid preferably is a liquid which is transparent to the exposure light wavelength to be used and in which the temperature coefficient of refractive index is as small as possible so as to minimize the deformation of an optical image to be projected on the resist. However, especially when the exposure light source is an ArF excimer laser (wavelength: 193 nm), it is preferred to use water from the standpoints of availability and handleability besides the standpoints shown above.

In the case where water is used as the immersion liquid, an additive (liquid) in which the resist layer on the wafer does not dissolve and the influence of which on the optical coat on the lower side of the lens element is negligible may be added in a slight proportion in order to reduce the surface tension of the water and enhance surface activity. This additive preferably is an aliphatic alcohol almost equal to water in refractive index. Examples thereof include methyl alcohol, ethyl alcohol, and isopropyl alcohol. The addition of an alcohol almost equal to water in refractive index brings about an advantage that even when the alcohol ingredient contained in the water vaporizes to cause a change in alcohol concentration, the change in refractive index of the liquid as a whole can be kept exceedingly slight. On the other hand, in case where a substance which is not transparent to 193-nm light or an impurity considerably differing from water in refractive index has come into the water, this leads to the deformation of an optical image to be projected on the resist. It is therefore preferred that the water to be used should be distilled water. Pure water which has undergone filtration through an ion-exchange filter or the like may be used.

The electrical resistance of the water desirably is 18.3 MΩ·cm or higher, and the TOC (organic concentration) therein is desirably 20 ppb or lower. Furthermore, it is desirable that the water should have been degassed.

By heightening the refractive index of the immersion liquid, lithographic performance can be enhanced.

From this standpoint, an additive serving to heighten the refractive index may be added to the water, or heavy water (D$_2$O) may be used in place of the water.

A film sparingly soluble in the immersion liquid (hereinafter the film is referred to also as "top coat") may be formed between the immersion liquid and the resist film formed from the positive resist for immersion exposure of the invention in order to prevent the resist film from coming into direct contact with the immersion liquid. The functions required of the top coat include applicability to the resist surface, transparency to radiations, in particular, one having a wavelength of 193 nm, and poor solubility in the immersion liquid. The top coat preferably is one which does not intermix with the resist and is evenly applicable to the resist surface.

From the standpoint of transparency at 193 nm, the top coat preferably is a polymer containing no aromatic. Examples thereof include hydrocarbon polymers, acrylic ester polymers, poly(methacrylic acid), poly(acrylic acid), poly(vinyl ether)s, silicon-containing polymers, and fluorine-containing polymers.

For removing the top coat, a developing solution may be used. Alternatively, the top coat may be removed by separately using a remover. The remover preferably is a solvent which is less apt to infiltrate into the resist. It is preferred that the top coat be removed with an alkaline developer because a removal step can be conducted simultaneously with a development step. The top coat preferably is acidic from the standpoint of removal with an alkaline developer. However, the top coat may be either neutral or alkaline from the standpoint of the property of not intermixing with the resist.

The smaller the difference in refractive index between the top coat and the immersion liquid, the more the resolution improves. In the case where the exposure light source is an ArF excimer laser (wavelength: 193 nm), the top coat for ArF immersion exposure preferably has a refractive index close to that of water (1.44) because water is preferably used as the immersion liquid in this case. From the standpoints of transparency and refractive index, the top coat preferably is thin.

In a development step, a developing solution is used in the following manner. As a developing solution for the positive resist composition for immersion exposure can be used an alkaline aqueous solution of, e.g., an inorganic alkali such as sodium hydroxide, potassium hydroxide, sodium carbonate, sodium silicate, sodium metasilicate, or ammonia water, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, or a cyclic amine such as pyrrole or piperidine.

It is also possible to add an alcohol or a surfactant in an appropriate amount to the alkaline aqueous solution to be used.

Pure water containing an appropriate amount of a surfactant may be used as a rinse.

The alkali concentration of the alkaline developer is generally 0.1-20% by mass.

The pH of the alkaline developer is generally 10.0-15.0.

After the development or rinsing, a treatment can be conducted in which the developing solution or rinse adherent to the pattern is removed with a supercritical fluid.

EXAMPLES

The invention will be explained below in more detail by reference to Examples, but the contents of the invention should not be construed as being limited by the following Examples.

Synthesis Example 1

Synthesis of Acid Generator (Ba-1)

4-Cyclohexylphenyldiphenylsulfonium bromide was dissolved in acetonitrile. Thereto was added a solution prepared by dissolving an equimolar amount of potassium nonafluorobutanesulfonate in acetonitrile/water=2/1. The resultant reaction mixture was concentrated, and chloroform was added thereto. This mixture was washed with water and the organic layer was concentrated. As a result, the target acid generator (Ba-1) was obtained.

Synthesis Example 2

Synthesis of Acid Generator (Bb-1)

To a mixture of 36 g of 2,6-xylenol and 60 g of diphenyl sulfoxide was added 300 mL of a solution consisting of diphosphorous pentoxide/methanesulfonic acid=1/10. The resultant reaction mixture was reacted at 40° C. for 4 hours and then poured on ice. This aqueous solution was washed with ethyl acetate. To the aqueous phase was added a solution prepared by dissolving 200 g of potassium iodide in water. The particles precipitated were taken out by filtration and washed with acetone. As a result, 3,5-dimethyl-4-hydroxyphenyldiphenylsulfonium iodide was obtained in an amount of 80 g. To 7.1 g of the 3,5-dimethyl-4-hydroxyphenyldiphenylsulfonium iodide obtained were added 300 mL of chloroform and 2.0 g of triethylamine. To this solution was dropwise added 10 g of nonafluorobutanesulfonic anhydride over 30 minutes with cooling with ice. After the resultant reaction mixture was reacted at room temperature for 1 hour, water was added thereto. The organic phase was washed with 5% aqueous NaOH solution and subsequently with water and then concentrated to obtain a crude reaction product, which was recrystallized from ethyl acetate/diisopropyl ether. As a result, acid generator (Bb-1) was obtained in an amount of 10.0 g.

300 MHz $^1$H-NMR

δ 3.46 (s. 6H), δ 7.57 (s. 2H), δ 7.70-7.80 (m, 10H)

300 MHz $^{19}$F-NMR

−126.2 (2F), −126.0 (2F), −121.84 (2F), −121.80 (2F), −114.90 (2F), −108.77 (2F), −81.19 (3F), −80.84 (3F)

Synthesis Example 3

Synthesis of Acid Generator (Bc-1)

A mixture of 4.0 g (12.65 mmol) of 1,1,2,2,3,3-hexafluoropropane-1,3-disulfonyl difluoride, 2.56 g (25.3 mmol) of triethylamine, and 30 mL of diisopropyl ether was cooled with ice in a nitrogen stream. A solution prepared by mixing 1.08 g (12.6 mmol) of piperidine with 15 mL of diisopropyl ether was added dropwise thereto over 30 minutes. The resultant mixture was stirred for 1 hour with cooling with ice and further stirred at room temperature for 1 hour. The organic layer was washed successively with water, saturated aqueous ammonium chloride solution, and water and then dried with sodium sulfate. The solvent was removed. To the residue were added 20 mL of ethanol and 200 mg of sodium hydroxide. This reaction mixture was stirred at room temperature for 2 hours and then neutralized with dilute hydrochloric acid. Thus, an ethanol solution of the sulfonic acid represented by the following formula was obtained.

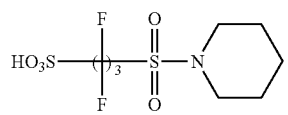

A triphenylsulfonium acetate solution was added to the sulfonic acid solution, and this mixture was stirred at room temperature for 2 hours. Thereto was added 300 mL of chloroform. The organic layer was washed successively with water, saturated aqueous ammonium chloride solution, and water and then purified by column chromatography (SiO$_2$;

chloroform/methanol=5/1). As a result, acid generator (Bc-1) in a white solid form was obtained in an amount of 3.0 g (4.68 mmol).
$^{1}$H-NMR (300 MHz, CDCl$_3$) δ 1.64 (bs, 6H), 3.29 (bs, 2H), 3.64 (bs, 2H), 7.70 (m, 15H)
$^{19}$F-NMR (300 MHz, CDCl$_3$) δ −111.1 (t, 2F), −114.3 (t, 2F), −119.4 (m, 2F)
The structures, weight-average molecular weights, and molecular-weight dispersity ratios of resins (1) to (25) are shown below.
(1)
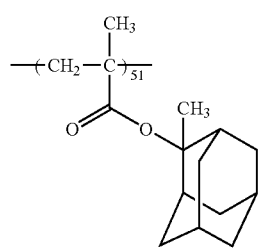
Mw = 9700
Mw/Mn = 1.97
(2)
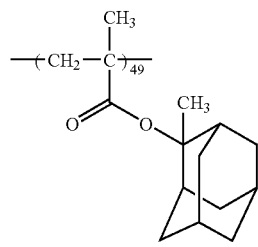
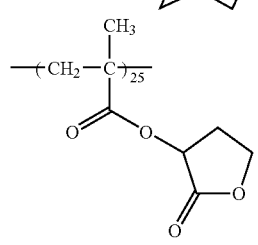
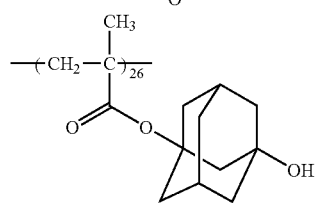
Mw = 9900
Mw/Mn = 1.99
-continued
(3)
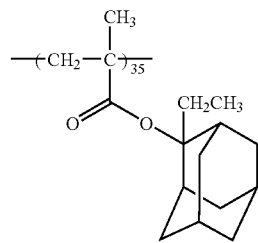
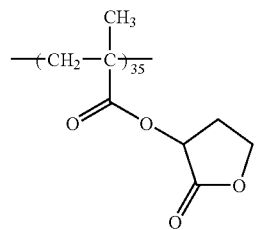
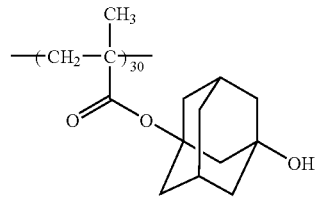
Mw = 9200
Mw/Mn = 2.04
(4)
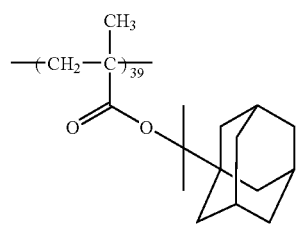
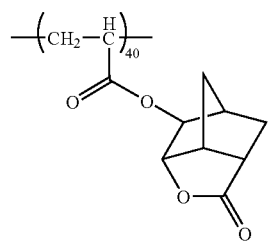
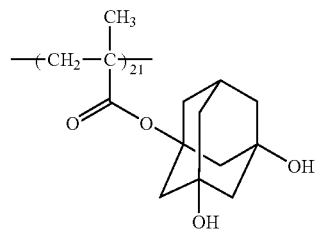
Mw = 9700
Mw/Mn = 2.01

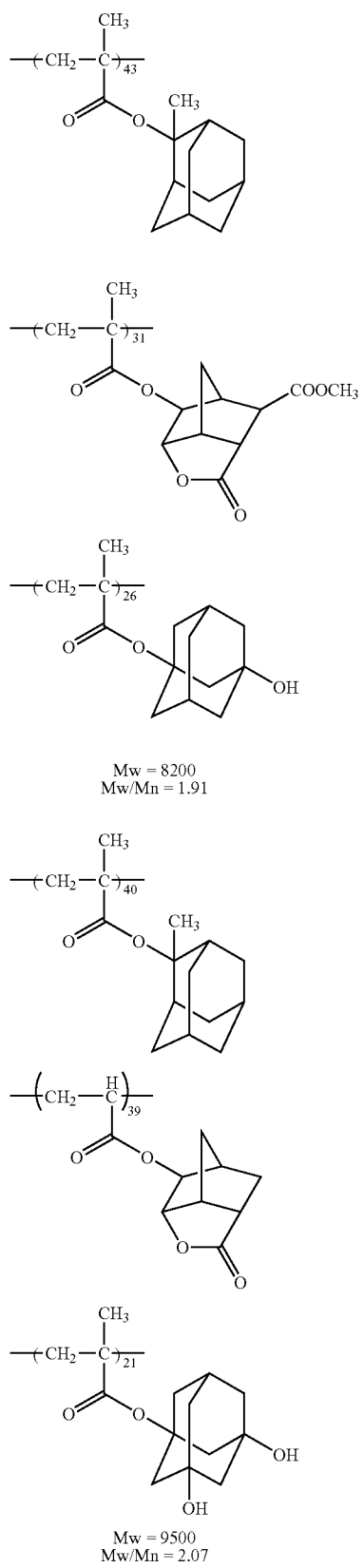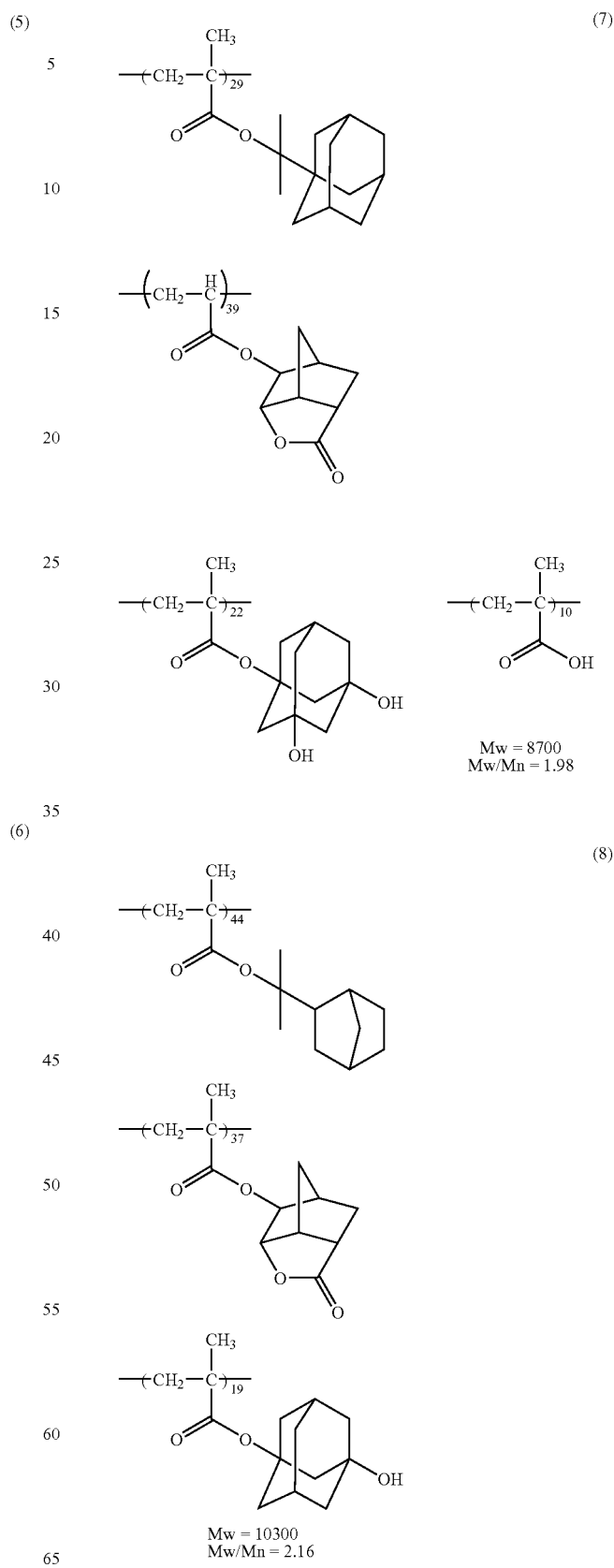

(9)
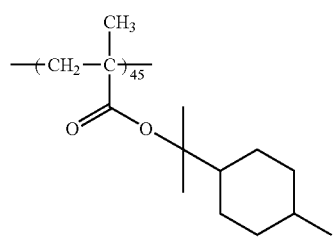
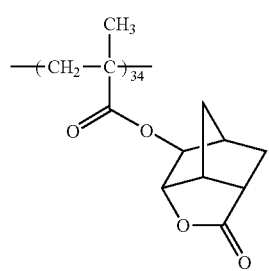
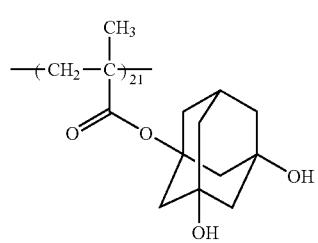
Mw = 11300
Mw/Mn = 2.21
(10)
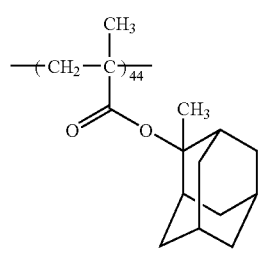
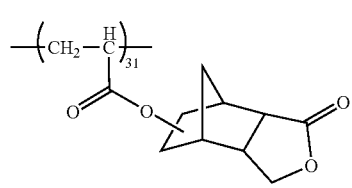
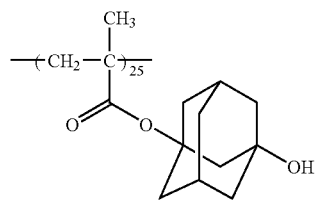
Mw = 8300
Mw/Mn = 1.97
(11)
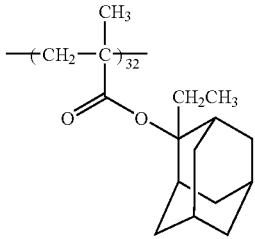
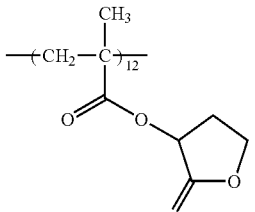
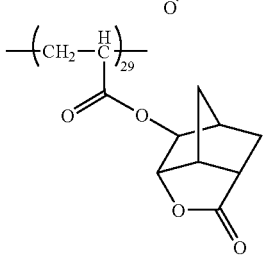
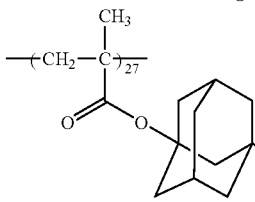
Mw = 10200
Mw/Mn = 2.31
(12)
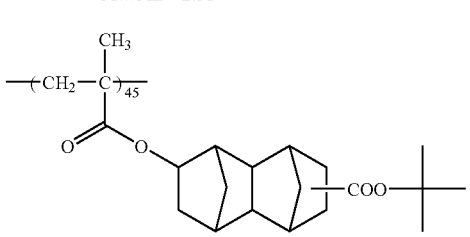
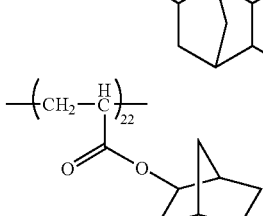
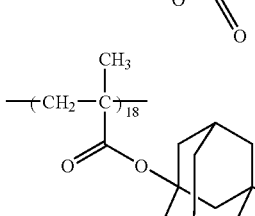 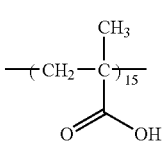
Mw = 8700
Mw/Mn = 2.23

-continued
(13)
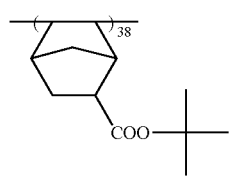 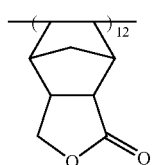
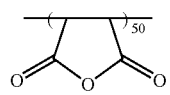
Mw = 7100
Mw/Mn = 2.42
(14)
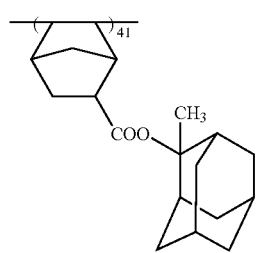 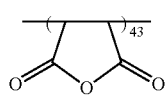
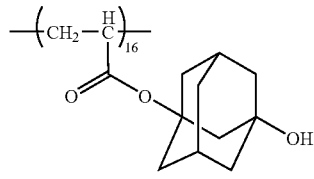
Mw = 8900
Mw/Mn = 2.19
(15)
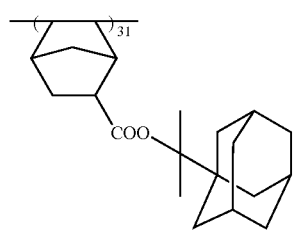 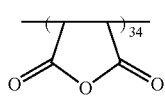
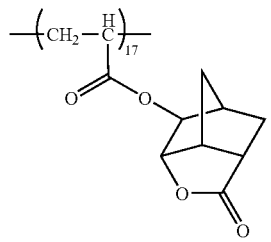
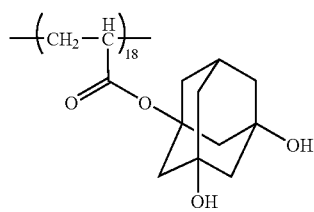
Mw = 11100
Mw/Mn = 2.37
-continued
(16)
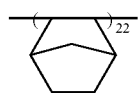 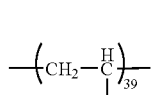
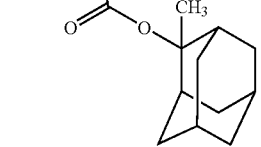
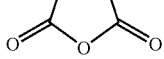
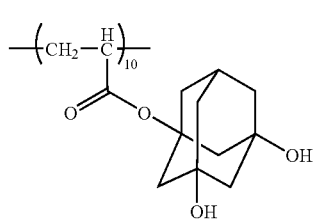
Mw = 10400
Mw/Mn = 2.51
(17)
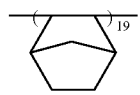
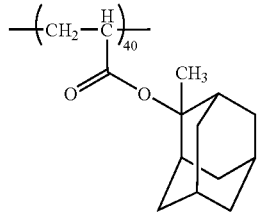
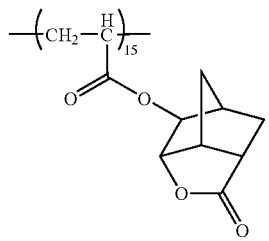
Mw = 10200
Mw/Mn = 2.51
(18)
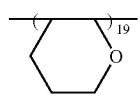 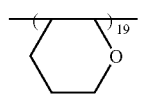
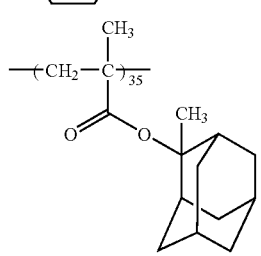

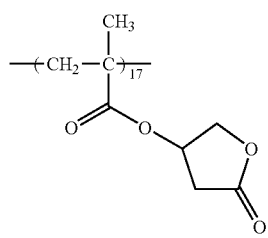
Mw = 7900
Mw/Mn = 2.33
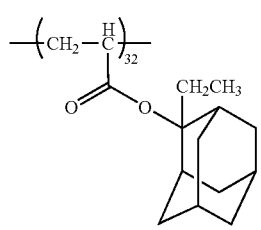
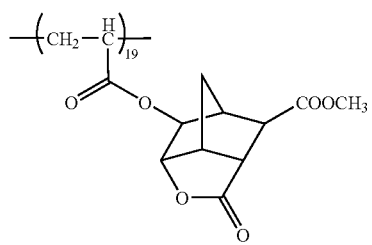
Mw = 9300
Mw/Mn = 2.26
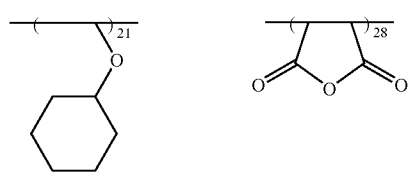
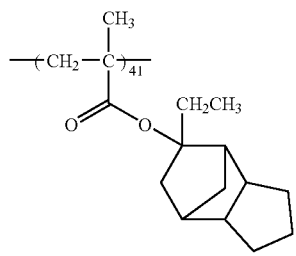
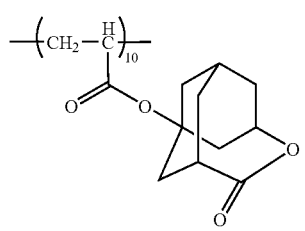
Mw = 9200
Mw/Mn = 2.49
(19)
(20)
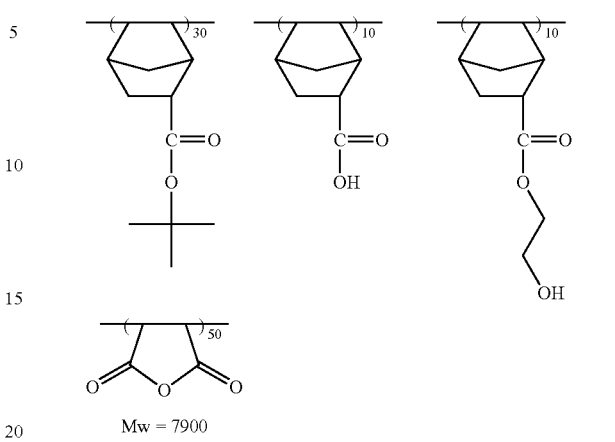
Mw = 7900
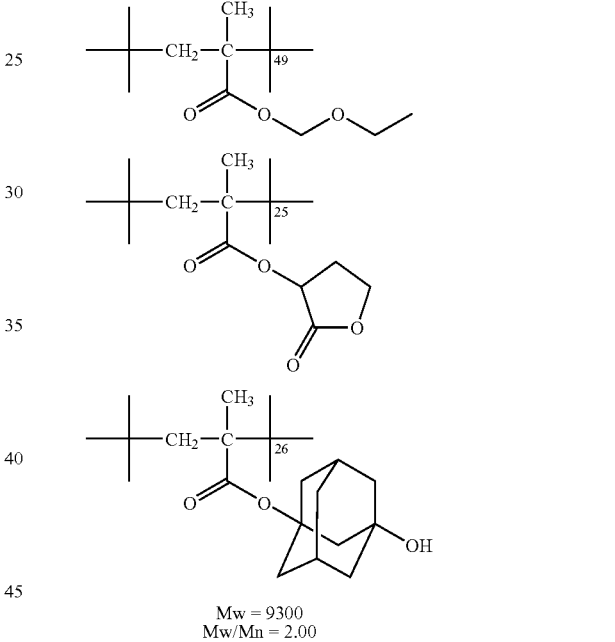
Mw = 9300
Mw/Mn = 2.00
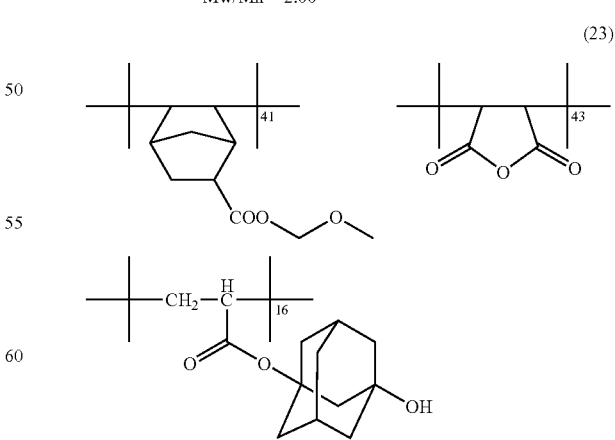
Mw = 8900
Mw/Mn = 2.21
(21)
(22)
(23)

-continued

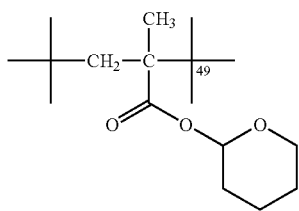

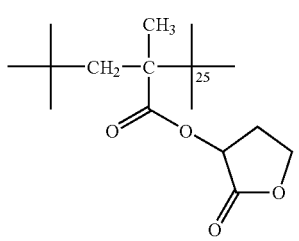

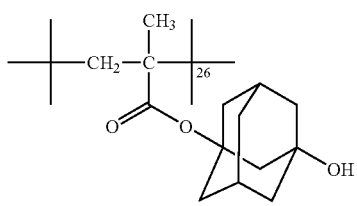

Mw = 10100
Mw/Mn = 2.04

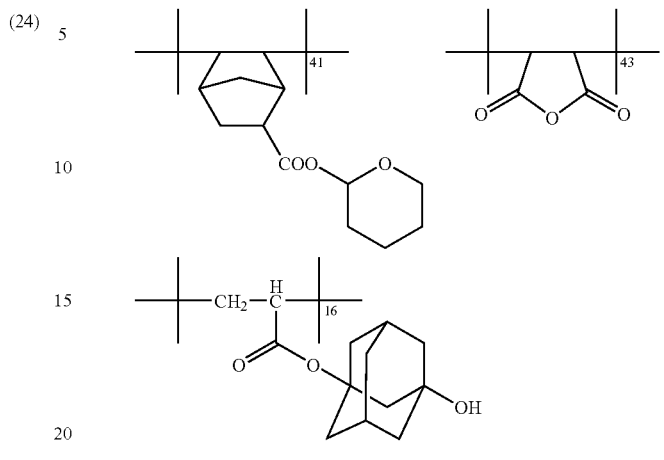

Mw = 8800
Mw/Mn = 1.98

Examples 1-24 and Comparative Examples 1-4

<Resist Preparation>

Each set of ingredients shown in Tables 1 to 3 was dissolved in the solvent to prepare a solution having a solid concentration of 10% by mass. This solution was filtered through a 0.1-μm polyethylene filter. Thus, positive resist compositions for immersion exposure were prepared. The positive resist compositions for immersion exposure prepared were evaluated by the methods shown below. The results obtained are shown in Tables 1 to 3. In the case of each ingredient consisting of two or more compounds, the proportions of these are shown in terms of ratio by mass.

TABLE 1

| | | | | | | | Wet exposure | | | | Dry exposure | | | |
|---|---|---|---|---|---|---|---|---|---|---|---|---|---|---|
| | | | | | | | Heating just after exposure | | Heating at 30 minutes after exposure | | Heating just after exposure | | Heating at 30 minutes after exposure | |
| | Resin (2 g) | Acid generator (g) | Solvent | Basic compound (10 mg) | Surfactant (5 mg) | Dissolution inhibitive compound (0.1 g) | Pattern falling | Profile | Pattern falling | Profile | Pattern falling | Profile | Pattern falling | Profile |
| Ex. 1 | 1 | Ba-1 (0.1) | SL-2/4 = 50/50 | N-1 | W-1 | — | A | rectangular | A | rectangular | A | rectangular | A | rectangular |
| Ex. 2 | 2 | Ba-9 (0.1) | SL-2/4 = 50/50 | N-2 | W-2 | — | A | rectangular | A | rectangular | A | rectangular | A | rectangular |
| Ex. 3 | 3 | Ba-14 (0.15) | SL-4/6/9 = 40/58/2 | N-3 | W-3 | — | A | rectangular | A | rectangular | A | rectangular | A | rectangular |
| Ex. 4 | 4 | Bc-5 (0.1) | SL-2/4 = 40/60 | N-3/6 = 1/1 | W-4 | — | A | rectangular | A | rectangular | A | rectangular | A | rectangular |
| Ex. 5 | 5 | BaBc-1 (0.07) z2 (0.03) | SL-2/4 = 40/60 | N-2 | W-4 | — | A | rectangular | A | rectangular | A | rectangular | A | rectangular |
| Ex. 6 | 6 | BbBc-1 (0.1) | SL-2/4/9 = 40/59/1 | N-1/3 = 1/1 | W-4 | — | A | rectangular | A | rectangular | A | rectangular | A | rectangular |
| Ex. 7 | 7 | Ba-20 (0.1) | SL-2/4 = 50/50 | N-1 | W-1 | — | A | rectangular | A | rectangular | A | rectangular | A | rectangular |

TABLE 1-continued

| | | Acid | | | | Dis-solution | Wet exposure | | | | Dry exposure | | | |
|---|---|---|---|---|---|---|---|---|---|---|---|---|---|---|
| | | | | | | | Heating just after exposure | | Heating at 30 minutes after exposure | | Heating just after exposure | | Heating at 30 minutes after exposure | |
| | | | | Basic com- | | inhibitive | | | | | | | | |
| | Resin (2 g) | generator (g) | Solvent | pound (10 mg) | Surfactant (5 mg) | compound (0.1 g) | Pattern falling | Profile | Pattern falling | Profile | Pattern falling | Profile | Pattern falling | Profile |
| Ex. 8 | 8 | Ba-1 (0.08) Bb-8 (0.01) | SL-2/6 = 70/30 | N-3/6 = 1/1 | W-1 | — | A | rectangular | A | rectangular | A | rectangular | A | rectangular |
| Ex. 9 | 9 | Bc-12 (0.08) | SL-2/4/9 = 40/59/1 | N-2 | W-1 | — | A | rectangular | A | rectangular | A | rectangular | A | rectangular |
| Ex. 10 | 10 | BaBc-13 (0.15) | SL-2/4 = 40/60 | N-3 | W-2 | — | A | rectangular | A | rectangular | A | rectangular | A | rectangular |

TABLE 2

| | | Acid | | | | Dis-solution | Wet exposure | | | | Dry exposure | | | |
|---|---|---|---|---|---|---|---|---|---|---|---|---|---|---|
| | | | | | | | Heating just after exposure | | Heating at 30 minutes after exposure | | Heating just after exposure | | Heating at 30 minutes after exposure | |
| | | | | Basic com- | | inhibitive | | | | | | | | |
| | Resin (2 g) | generator (g) | Solvent | pound (10 mg) | Surfactant (5 mg) | compound (0.1 g) | Pattern falling | Profile | Pattern falling | Profile | Pattern falling | Profile | Pattern falling | Profile |
| Ex. 11 | 11 | Bc-4 (0.1) | SL-3/4 = 40/60 | N-1 | W-3 | — | A | rectangular | A | rectangular | A | rectangular | A | rectangular |
| Ex. 12 | 12 | Bc-11 (0.1) | SL-2/4 = 40/60 | N-1 | W-4 | — | A | rectangular | A | rectangular | A | rectangular | A | rectangular |
| Ex. 13 | 13 | BaBc-8 (0.1) BbBc-9 (0.01) | SL-1/7 = 40/60 | N-6 | W-4 | SI-1 | A | rectangular | A | rectangular | A | rectangular | A | rectangular |
| Ex. 14 | 14 | Ba-7 (0.1) | SL-4/6 = 60/40 | N-1 | W-1 | — | A | rectangular | A | rectangular | A | rectangular | A | rectangular |
| Ex. 15 | 15 | Ba-13 (0.1) | SL-3/7 = 60/40 | N-4/6 = 1/1 | W-3 | — | A | rectangular | A | rectangular | A | rectangular | A | rectangular |
| Ex. 16 | 16 | Ba-20 (0.1) | SL-2/5 = 60/40 | N-3 | W-2 | — | A | rectangular | A | rectangular | A | rectangular | A | rectangular |
| Ex. 17 | 17 | Ba-1 (0.05) Ba-13 (0.05) | SL-2/7 = 60/40 | N-3 | W-2 | SI-2 | A | rectangular | A | rectangular | A | rectangular | A | rectangular |
| Ex. 18 | 18 | Bc-15 (0.15) | SL-2/7 = 60/40 | N-4/6 = 1/1 | W-1 | — | A | rectangular | A | rectangular | A | rectangular | A | rectangular |
| Ex. 19 | 19 | Ba-1 (0.1) Bc-14 (0.03) | SL-2/7 = 60/40 | — | W-1 | — | A | rectangular | A | rectangular | A | rectangular | A | rectangular |
| Ex. 20 | 20 | Ba-1 (0.05) Bc-3 (0.05) | SL-2/4 = 40/60 | N-3 | W-4 | — | A | rectangular | A | rectangular | A | rectangular | A | rectangular |

TABLE 3

| | | Acid gen- | | | | Dis-solution | Wet exposure | | | | Dry exposure | | | |
|---|---|---|---|---|---|---|---|---|---|---|---|---|---|---|
| | | | | | | | Heating just after exposure | | Heating at 30 minutes after exposure | | Heating just after exposure | | Heating at 30 minutes after exposure | |
| | | | | Basic com- | | inhibitive | | | | | | | | |
| | Resin (2 g) | erator (g) | Solvent | pound (10 mg) | Surfactant (5 mg) | compound (0.1 g) | Pattern falling | Profile | Pattern falling | Profile | Pattern falling | Profile | Pattern falling | Profile |
| Ex. 21 | 22 | Ba-9 (0.12) | SL-2 | N-6 | W-4 | — | A | rectangular | A | rectangular | A | rectangular | A | rectangular |

TABLE 3-continued

| | | Acid generator (g) | Solvent | Basic compound (10 mg) | Surfactant (5 mg) | Dissolution inhibitive compound (0.1 g) | Wet exposure | | | | Dry exposure | | | |
|---|---|---|---|---|---|---|---|---|---|---|---|---|---|---|
| | | | | | | | Heating just after exposure | | Heating at 30 minutes after exposure | | Heating just after exposure | | Heating at 30 minutes after exposure | |
| | Resin (2 g) | | | | | | Pattern falling | Profile | Pattern falling | Profile | Pattern falling | Profile | Pattern falling | Profile |
| Ex. 22 | 7 | Ba-1 (0.06) z4 (0.02) | SL-4/6/9 = 40/58/2 | N-3/6 = 1/1 | — | — | A | rectangular | A | rectangular | A | rectangular | A | rectangular |
| Ex. 23 | 9 | Bc-13 (0.1) | SL-4/6/9 = 40/58/2 | N-3/6 = 1/1 | — | — | A | rectangular | A | rectangular | A | rectangular | A | rectangular |
| Ex. 24 | 11 | BaBc-1 (0.1) | SL-4/6/9 = 40/58/2 | N-3/6 = 1/1 | — | — | A | rectangular | A | rectangular | A | rectangular | A | rectangular |
| Comp. Ex. 1 | 1 | PAG-A (0.1) | SL-2/4 = 50/50 | N-1 | W-1 | — | A | rectangular | B | T-top | A | rectangular | A | rectangular |
| Comp. Ex. 2 | 2 | PAG-B (0.1) | SL-2/4 = 50/50 | N-2 | W-2 | — | A | rectangular | B | T-top | A | rectangular | A | rectangular |
| Comp. Ex. 3 | 3 | PAG-C (0.15) | SL-4/6/9 = 40/58/2 | N-3 | W-3 | — | A | rectangular | C | * | A | rectangular | A | rectangular |
| Comp. Ex. 4 | 4 | PAG-B (0.15) | SL-2/4 = 40/60 | N-3/6 = 1/1 | W-4 | — | A | rectangular | B | T-top | A | rectangular | A | rectangular |

* The pattern wholly fell and profile examination was impossible.

The symbols given in Tables 1 to 3 have the following meanings.

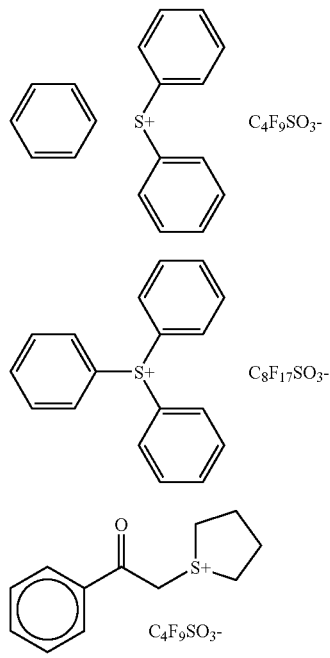

N-1: N,N-dibutylaniline
N-2: N,N-dipropylaniline
N-3: N,N-dihydroxyethylaniline
N-4: 2,4,5-triphenylimidazole
N-5: 2,6-diisopropylaniline
N-6: hydroxyantipyrine
N-7: tris-2-(2-methoxy(ethoxy))ethylamine
W-1: Megafac F176 (manufactured by Dainippon Ink & Chemicals, Inc.) (fluorochemical)
W-2: Megafac R08 (manufactured by Dainippon Ink & Chemicals, Inc.) (fluorochemical and silicone)
W-3: polysiloxane polymer KP-341 (manufactured by Shin-Etsu Chemical Co., Ltd.) (silicone)
W-4: Troysol S-366 (manufactured by Troy Chemical Co., Ltd.)
W-5: PF 636 (a product of OMNOVA)
W-6: PF 6520 (a product of OMNOVA)
SL-1: cyclopentanone
SL-2: cyclohexanone
SL-3: 2-methylcyclohexanone
SL-4: propylene glycol monomethyl ether acetate
SL-5: ethyl lactate
SL-6: propylene glycol monomethyl ether
SL-7: 2-heptanone
SL-8: γ-butyrolactone
SL-9: propylene carbonate
SI-1: t-butyl lithocholate
SI-2: t-butyl adamantanecarboxylate

[PED Evaluation]

Organic antireflection film ARC29A (manufactured by Nissan Chemical Industries, Ltd.) was applied to a silicon wafer and baked at 205° C. for 60 seconds to form a 78-nm antireflection film. Each of the positive resist compositions for immersion exposure prepared was applied on the film and baked at 115° C. for 60 seconds to form a 150-nm resist film. The wafer thus obtained was subjected to two-beam interference exposure with the apparatus shown in FIG. 1 using pure water as an immersion liquid (wet exposure). A laser emitting a light having a wavelength of 193 nm was used, and a prism for forming a 90-nm line-and-space pattern was used. Immediately after the exposure, the resist film was heated at 115° C. for 90 seconds, subsequently developed with an aqueous solution of tetramethylammonium hydroxide (2.38% by mass) for 60 seconds, rinsed with pure water, and then dried with spinning to obtain a resist pattern. On the other hand, the same resist film was allowed to stand for 30 minutes after the exposure and then processed in the same manner as described above to obtain a resist pattern. These two resist patterns were examined with a scanning electron microscope (S-9260, manufactured by Hitachi Ltd.) for unsusceptibility to pattern falling and pattern profile.

Furthermore, exposure was conducted without using any immersion liquid (dry exposure) and subsequent processing was conducted in the same manner as described above. The resist patterns thus obtained were evaluated in the same manner.

With respect to pattern falling, the case in which the 90-nm line-and-space pattern formed was free from falling, that in which the pattern had partly fallen, and that in which the pattern had wholly fallen are indicated by A, B, and C, respectively.

In the apparatus shown in FIG. 1, numeral 1 denotes a laser, 2 a diaphragm, 3 a shutter, 4, 5, and 6 a reflecting mirror, 7 a condensing lens, 8 a prism, 9 an immersion liquid, 10 a wafer coated with an antireflection film and a resist film, and 11 a wafer stage.

It can be clearly seen from Tables 1 to 3 that the positive resist compositions for immersion exposure of the invention have been improved in unsusceptibility to the resist pattern falling and profile deterioration caused by a time delay between exposure and PEB in the immersion exposure method. Examples 25 to 53 and Comparative Examples 5 to 8

<Resist Preparation>

The ingredients shown in Tables 4 to 6 below were dissolved in a solvent to provide a 5% by mass solid content solution, which was filtered through an 0.1 μm pore size polyethylene filter to give a positive resist composition for the liquid immersion exposure process. The positive resist composition for the liquid immersion exposure process thus prepared was evaluated by the method to be described below, and the results are shown in Tables 4 to 6. The ratio for cases where plural kinds are used for each ingredient is based on mass.

TABLE 4

| | | Acid generator (g) | Solvent | Basic compound (10 mg) | Surfactant (5 mg) | Dissolution inhibitive compound (0.1 g) | Wet exposure | | | | Dry exposure | | | |
| | | | | | | | Heating just after exposure | | Heating 3 hr after exposure | | Heating just after exposure | | Heating 3 hr after exposure | |
| | Resin (2 g) | | | | | | Pattern falling | Profile | Pattern falling | Profile | Pattern falling | Profile | Pattern falling | Profile |
|---|---|---|---|---|---|---|---|---|---|---|---|---|---|---|
| Ex. 25 | 1 | Ba-1 (0.1) | SL-2/4 = 50/50 | N-1 | W-5 | — | A | Rectangular | A | Rectangular | A | Rectangular | A | Rectangular |
| Ex. 26 | 2 | Ba-9 (0.1) | SL-2/4 = 50/50 | N-2 | W-6 | — | A | Rectangular | A | Rectangular | A | Rectangular | A | Rectangular |
| Ex. 27 | 4 | Bc-5 (0.1) | SL-2/4 = 40/60 | N-3/6 = 1/1 | W-6 | — | A | Rectangular | A | Rectangular | A | Rectangular | A | Rectangular |
| Ex. 28 | 1 | Ba-1 (0.1) | SL-2/4 = 50/50 | N-1 | W-1 | — | A | Rectangular | B | Rectangular | A | Rectangular | A | Rectangular |
| Ex. 29 | 2 | Ba-9 (0.1) | SL-2/4 = 50/50 | N-2 | W-2 | — | A | Rectangular | B | Rectangular | A | Rectangular | A | Rectangular |
| Ex. 30 | 3 | Ba-14 (0.15) | SL-4/6/9 = 40/58/2 | N-1 | W-3 | — | A | Rectangular | B | Rectangular | A | Rectangular | A | Rectangular |
| Ex. 31 | 4 | Bc-5 (0.1) | SL-2/4 = 40/60 | N-3/6 = 1/1 | W-4 | — | A | Rectangular | A | Slightly tapered | A | Rectangular | A | Rectangular |
| Ex. 32 | 5 | BaBc-1 (0.07) z2 (0.03) | SL-2/4 = 40/60 | N-2 | W-4 | — | A | Rectangular | A | Rectangular | A | Rectangular | A | Rectangular |
| Ex. 33 | 6 | BbBc-1 (0.1) | SL-2/4/9 = 40/59/1 | N-1/3 = 1/1 | W-4 | — | A | Rectangular | A | Rectangular | A | Rectangular | A | Rectangular |
| Ex. 34 | 7 | Ba-20 (0.1) | SL-2/4 = 50/50 | N-2 | W-1 | — | A | Rectangular | A | Rectangular | A | Rectangular | A | Rectangular |
| Ex. 35 | 8 | Ba-1 (0.08) Bb-8 (0.01) | SL-2/6 = 70/30 | N-2/6 = 1/1 | W-1 | — | A | Rectangular | B | Rectangular | A | Rectangular | A | Rectangular |
| Ex. 36 | 9 | Bc-12 (0.08) | SL-2/4/9 = 40/59/1 | N-2 | W-1 | — | A | Rectangular | A | Rectangular | A | Rectangular | A | Rectangular |

TABLE 5

| | Resin (2 g) | Acid generator (g) | Solvent | Basic compound (10 mg) | Surfactant (5 mg) | Dissolution inhibitive compound (0.1 g) | Wet exposure | | | | Dry exposure | | | |
|---|---|---|---|---|---|---|---|---|---|---|---|---|---|---|
| | | | | | | | Heating just after exposure | | Heating 3 hr after exposure | | Heating just after exposure | | Heating 3 hr after exposure | |
| | | | | | | | Pattern falling | Profile | Pattern falling | Profile | Pattern falling | Profile | Pattern falling | Profile |
| Ex. 37 | 10 | BaBc-13 (0.15) | SL-24 = 40/60 | N-4 | W-2 | — | A | Rectangular | A | Rectangular | A | Rectangular | A | Rectangular |
| Ex. 38 | 11 | Bc-4 (0.1) | SL-3/4 = 40/60 | N-1 | W-3 | — | A | Rectangular | A | Rectangular | A | Rectangular | A | Rectangular |
| Ex. 39 | 12 | Bc-11 (0.1) | SL-2/4 = 40/60 | N-1 | W-4 | — | A | Rectangular | A | Rectangular | A | Rectangular | A | Rectangular |
| Ex. 40 | 13 | BaBc-8 0.1) BbBc-9 (0.01) | SL-1/7 = 40/60 | N-4 | W-4 | SI-1 | A | Rectangular | A | Rectangular | A | Rectangular | A | Rectangular |
| Ex. 41 | 14 | Ba-7 (0.1) | SL-4/6 = 60/40 | N-1 | W-1 | — | A | Rectangular | B | Rectangular | A | Rectangular | A | Rectangular |
| Ex. 42 | 15 | Ba-13 (0.1) | SL-3/7 = 60/40 | N-4/6 = 1/1 | W-3 | — | A | Rectangular | B | Rectangular | A | Rectangular | A | Rectangular |
| Ex. 43 | 16 | Ba-20 (0.1) | SL-2/5 = 60/40 | N-3 | W-2 | — | A | Rectangular | A | Rectangular | A | Rectangular | A | Rectangular |
| Ex. 44 | 17 | Ba-1 (0.05) Ba-13 (0.05) | SL-2/7 = 60/40 | N-3 | W-2 | SI-2 | A | Rectangular | B | Rectangular | A | Rectangular | A | Rectangular |
| Ex. 45 | 18 | Bc-15 (0.15) | SL-2/7 = 60/40 | N-4/6 = 1/1 | W-1 | — | A | Rectangular | A | Rectangular | A | Rectangular | A | Rectangular |
| Ex. 46 | 19 | Ba-1 (0.1) Bc-14 (0.03) | SL-2/7 = 60/40 | — | W-1 | — | A | Rectangular | A | Rectangular | A | Rectangular | A | Rectangular |
| Ex. 47 | 20 | Ba-1 (0.05) Bc-3 (0.4) | SL-2/4 = 40/60 | N-3 | W-4 | — | A | Rectangular | A | Tapered | A | Rectangular | A | Rectangular |
| Ex. 48 | 22 | Ba-9 (0.12) | SL-2 | N-1 | W-4 | — | A | Rectangular | B | Rectangular | A | Rectangular | A | Rectangular |

TABLE 6

| | Resin (2 g) | Acid generator (g) | Solvent | Basic compound (10 mg) | Surfactant (5 mg) | Dissolution inhibitive compound (0.1 g) | Wet exposure | | | | Dry exposure | | | |
|---|---|---|---|---|---|---|---|---|---|---|---|---|---|---|
| | | | | | | | Heating just after exposure | | Heating 3 hr after exposure | | Heating just after exposure | | Heating 3 hr after exposure | |
| | | | | | | | Pattern falling | Profile | Pattern falling | Profile | Pattern falling | Profile | Pattern falling | Profile |
| Ex. 49 | 7 | Ba-1 (0.06) z4 (0.02) | SL-4/6/9 = 40/58/2 | N-3/4 = 1/1 | — | — | A | Rectangular | B | Rectangular | A | Rectangular | A | Rectangular |
| Ex. 50 | 9 | Bc-13 (0.1) | SL-4/6/9 = 40/58/2 | N-3/6 = 1/1 | — | — | A | Rectangular | A | Rectangular | A | Rectangular | A | Rectangular |
| Ex. 51 | 11 | BaBc-1 (0.1) | SL-4/6/9 = 40/58/2 | N-3/7 = 1/1 | — | — | A | Rectangular | A | Rectangular | A | Rectangular | A | Rectangular |
| Ex. 52 | 4 | Bc-19 (0.15) | SL-4/6 = 60/40 | N-1 | W-5 | — | A | Rectangular | A | Rectangular | A | Rectangular | A | Rectangular |
| Ex. 53 | 2 | Bc-17 (0.05) Bc-20 (0.08) | SL-4/6 = 60/40 | N-1 | W-6 | — | A | Rectangular | A | Rectangular | A | Rectangular | A | Rectangular |
| Comp. Ex. 51 | 1 | PAG-A (0.1) | SL-2/4 = 50/50 | N-1 | W-1 | — | A | Rectangular | C | * | A | Rectangular | A | Rectangular |
| Comp. Ex. 5 | 2 | PAG-B (0.1) | SL-2/4 = 50/50 | N-2 | W-2 | — | A | Rectangular | C | * | A | Rectangular | A | Rectangular |
| Comp. Ex. 6 | 3 | PAG-C (0.15) | SL-4/6/9 = 40/58/2 | N-3 | W-3 | — | A | Rectangular | C | * | A | Rectangular | A | Rectangular |

TABLE 6-continued

| | | Acid generator (g) | Solvent | Basic compound (10 mg) | Surfactant (5 mg) | Dissolution inhibitive compound (0.1 g) | Wet exposure | | | | Dry exposure | | | |
| | | | | | | | Heating just after exposure | | Heating 3 hr after exposure | | Heating just after exposure | | Heating 3 hr after exposure | |
| | Resin (2 g) | | | | | | Pattern falling | Profile | Pattern falling | Profile | Pattern falling | Profile | Pattern falling | Profile |
|---|---|---|---|---|---|---|---|---|---|---|---|---|---|---|
| Comp. Ex. 7 | 4 | PAG-B (0.15) | SL-2/4 = 40/60 | N-3/6 = 1/1 | W-4 | — | A | Rectangular | C | * | A | Rectangular | A | Rectangular |

The pattern wholly fell and profile examination was impossible.

[PED Evaluation]
Organic antireflection film ARC29A (manufactured by Nissan Chemical Industries, Ltd.) was applied to a silicon wafer and baked at 205° C. for 60 seconds to form a 78-nm antireflection film. Each of the positive resist compositions for immersion exposure prepared was applied on the film and baked at 115° C. for 60 seconds to form a 100-nm resist film. The wafer thus obtained was subjected to two-beam interference exposure with the apparatus shown in FIG. 1 using pure water as an immersion liquid (wet exposure). A laser emitting a light having a wavelength of 193 nm was used, and a prism for forming a 65-nm line-and-space pattern was used. Immediately after the exposure, the resist film was heated at 115° C. for 90 seconds, subsequently developed with an aqueous solution of tetramethylammonium hydroxide (2.38% by mass) for 60 seconds, rinsed with pure water, and then dried with spinning to obtain a resist pattern. On the other hand, the same resist film was allowed to stand for 30 minutes after the exposure and then processed in the same manner as described above to obtain a resist pattern. These two resist patterns were examined with a scanning electron microscope (S-9260, manufactured by Hitachi Ltd.) for unsusceptibility to pattern falling and pattern profile.

Furthermore, exposure was conducted without using any immersion liquid (dry exposure) and subsequent processing was conducted in the same manner as described above. The resist patterns thus obtained were evaluated in the same manner.

With respect to pattern falling, the case in which the 65-nm line-and-space pattern formed was free from falling, that in which the pattern had partly fallen, and that in which the pattern had wholly fallen are indicated by A, B, and C, respectively.

In the apparatus shown in FIG. 1, numeral 1 denotes a laser, 2 a diaphragm, 3 a shutter, 4, 5, and 6 a reflecting mirror, 7 a condensing lens, 8 a prism, 9 an immersion liquid, 10 a wafer coated with an antireflection film and a resist film, and 11 a wafer stage.

It can be clearly seen from Tables 4 to 6 that the positive resist compositions for immersion exposure of the invention have been improved in unsusceptibility to the resist pattern falling and profile deterioration caused by a time delay between exposure and PEB in the immersion exposure method.

The invention can provide: a positive resist composition suitable for immersion exposure and improved in the resist pattern falling and profile deterioration caused by a time delay between exposure and PEB in the immersion exposure method; and a method of pattern formation with the composition.

The entire disclosure of each and every foreign patent application from which the benefit of foreign priority has been claimed in the present application is incorporated herein by reference, as if fully set forth.

What is claimed is:

1. A positive resist composition for immersion exposure comprising:
   (A) a resin which enhances a solubility of the resin in an alkaline developer by an action of an acid; and
   (B) at least one compound which generates an acid upon irradiation with one of an actinic ray and a radiation, the compound (B) being selected from (Bb) and (Bc):
   (Bb) a sulfonium salt compound having in its cation part a fluorine-substituted alkyl or cycloalkyl residue having 1 or more carbon atoms, and
   (Bc) a sulfonium salt compound having in its anion part an alkyl or cycloalkyl residue which has 2 or more carbon atoms and has not been substituted by fluorine,
   wherein the sulfonium salt compound (Bc) comprises an anion represented by general formula (B-2a) or (B2b):

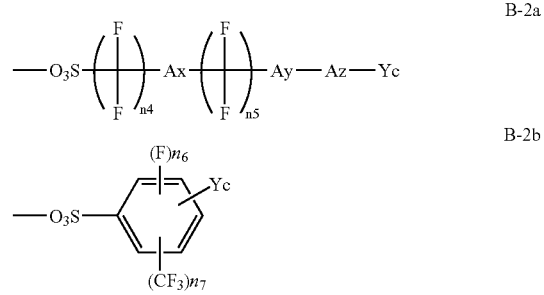

wherein Ax represents a single bond or an oxygen atom;
Ay represents a single bond, —SO$_2$—, —SO$_3$—, —SO$_2$N(R$_4$)—, —CO$_2$—, an oxygen atom, —C(=O)—, —C(=O)N(R$_4$)—, or an alkylene group;
R$_4$ represents a hydrogen atom or an alkyl group;
Az represents a single bond or an aryl group;
Yc represents an alkyl or cycloalkyl residue which has 2 or more carbon atoms and has not been substituted by fluorine,
provided that Yc may be bonded to R$_4$ to form a ring;
n4 represents an integer of 1-4; n5 represents an integer of 1-4; n6 represents an integer of 0-4; and n7 represents an integer of 0-4, provided that n6+n7 represents an integer of 1-4.

2. The positive resist composition for immersion exposure of claim 1,
wherein the compound (B) satisfies either the requirements for both (Ba) and (Bc), or the requirements for both (Bb) and (Bc), where the compound (Ba) is:
(Ba) a sulfonium salt compound having in its cation part an alkyl or cycloalkyl residue which has 2 or more carbon atoms and has not been substituted by fluorine.

3. A positive resist composition for immersion exposure comprising:
(A) a resin which enhances a solubility of the resin in an alkaline developer by an action of an acid;
(B) at least one compound which generates an acid upon irradiation with one of an actinic ray and a radiation, the compound (B) being selected from (Ba) to (Bc); and
(B') a sulfonium salt compound which generates an acid upon irradiation with one of an actinic ray and a radiation;
(Ba) a sulfonium salt compound having in its cation part an alkyl or cycloalkyl residue which has 2 or more carbon atoms and has not been substituted by fluorine,
(Bb) a sulfonium salt compound having in its cation part a fluorine-substituted alkyl or cycloalkyl residue having 1 or more carbon atoms, and
(Bc) a sulfonium salt compound having in its anion part an alkyl or cycloalkyl residue which has 2 or more carbon atoms and has not been substituted by fluorine.

4. The positive resist composition for immersion exposure of claim 3, wherein the sulfonium salt compound (B') is selected from the compound (Ba), the compound (Bb) and the compound (Bc).

5. A positive resist composition for immersion exposure comprising:
(A) a resin which enhances a solubility of the resin in an alkaline developer by an action of an acid; and
(B) at least one compound which generates an acid upon irradiation with one of an actinic ray and a radiation, the compound (B) being at least one compound selected from a compound (Ba-2) and a compound (Ba-3):

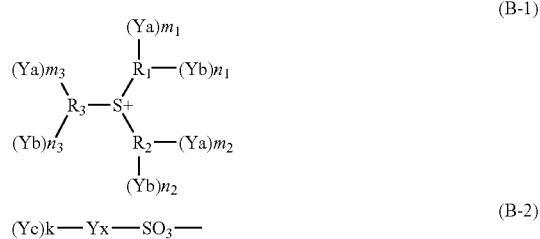

wherein, Yx represents an alkyl, cycloalkyl, or aryl group; Ya represents an alkyl or cycloalkyl residue which has 2 or more carbon atoms and has not been substituted by fluorine; Yb represents a fluorine-substituted alkyl or cycloalkyl residue having 1 or more carbon atoms; Yc represents an alkyl or cylcoalkyl reside which has 2 or more carbon atoms and has not been substituted by fluorine; $m_1$ to $m_3$ each independently represents an integer of 0-2; $n_1$ to $n_3$ each independently represents an integer of 0-2; and k represents an integer of 0-2, provided that $m_1+m_2+m_3+n_1+n_2+n_3+k =1$ to 6:
(Ba-2) a sulfonium salt of a sulfonium cation represented by formula (B-1) and a sulfonic acid anion represented by the formula (B-2) in which $R_1$ in the formula (B-1) is an optionally substituted arylcarbonylmethyl group, and $R_2$ and $R_3$ each are an alkyl, cycloalkyl, or aryl group, and $R_2$ and $R_3$ may be bonded to each other to form a ring; and
(Ba-3) a sulfonium salt of a sulfonium cation represented by formula (B-1) and a sulfonic acid anion represented by the formula (B-2) in which $R_1$ in the formula (B-1) is an optionally substituted aryl group and $R_2$ and $R_3$ each are an alkyl or cycloalkyl group, and $R_2$ and $R_3$ may be bonded to each other to form a ring.

6. The positive resist composition for immersion exposure of any one of claims 1-2 and 3-5, wherein the resin (A) has a repeating unit having a group which is dissociable with an acid and is represented by general formula (I):

wherein
$R_1$ to $R_3$ each independently represents an alkyl group, a cycloalkyl group, or an alkenyl group, and at least two of $R_1$ to $R_3$ may be bonded to each other to form a ring.

7. The positive resist composition for immersion exposure of claim 3 or 4, wherein the compound (Ba) is a triphenylsulfonium salt compound substituted by an alkyl or cycloalkyl group which has 2 or more carbon atoms and has not been substituted by fluorine.

8. The positive resist composition for immersion exposure of claim 1, wherein the anion part of the compound (Bc) is an alkanesulfonic acid anion in which an α-position of a sulfonic acid is substituted by fluorine, the alkanesulfonic acid anion comprising at its end an alkyl or cycloalkyl residue which has 2 or more carbon atoms and has not been substituted by fluorine.

9. The positive resist composition for liquid immersion exposure of any one of claims 1-2 and 3-5, wherein a content of the compound (B) is from 1 to 7% by mass in a total solid content of the positive resist composition.

10. A method of pattern formation comprising:
forming a resist film with a positive resist composition for immersion exposure;
exposing the resist film to light through an immersion liquid, so as to form an exposed resist film; and
developing the exposed resist film,
wherein the positive resist composition for immersion exposure comprises:
(A) a resin which enhances a solubility of the resin in an alkaline developer by an action of an acid; and
(B) at least one compound which generates an acid upon irradiation with one of an actinic ray and a radiation, the compound (B) being selected from (Ba) to (Bc),
(Ba) a sulfonium salt compound having in its cation part an alkyl or cycloalkyl residue which has 2 or more carbon atoms and has not been substituted by fluorine,
(Bb) a sulfonium salt compound having in its cation part a fluorine-substituted alkyl or cycloalkyl residue having 1 or more carbon atoms, and
(Bc) a sulfonium salt compound having in its anion part an alkyl or cycloalkyl residue which has 2 or more carbon atoms and has not been substituted by fluorine.

11. The positive resist composition for liquid immersion exposure of either claim 1 or claim 8, which comprises at least one kind of the sulfonium salt compound (Bc).

12. The positive resist composition for liquid immersion exposure of any one of claims 1-2 and 3-5, further comprising a nitrogen-containing compound (Ca) which has no oxygen atom.

13. The positive resist composition for liquid immersion exposure of any one of claims 1-2 and 3-5, further comprising a fluorochemical nonionic surfactant (Da).

14. A positive resist composition for immersion exposure comprising:
(A) a resin which enhances a solubility of the resin in an alkaline developer by an action of an acid; and
(Ba-4) a compound which generates an acid upon irradiation with one of an actinic ray and a radiation, the compound being a triphenylsulfonium salt compound substituted by an alkyl or cycloalkyl group which has 2 or more carbon atoms and has not been substituted by fluorine.

15. A positive resist composition for immersion exposure comprising:
(A) a resin which enhances a solubility of the resin in an alkaline developer by an action of an acid; and
(B) at least one compound which generates an acid upon irradiation with one of an actinic ray and a radiation, the compound (B) being (Bc) a sulfonium salt compound having in its anion part an alkyl or cycloalkyl residue which has 2 or more carbon atoms and has not been substituted by fluorine,
wherein the sulfonium salt compound (Bc) comprises an anion represented by general formula (B-3):

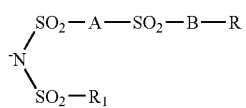
(B-3)

wherein A represents a divalent connecting group;
B represents a single bond, an oxygen atom or —N(Rx)—;
Rx represents a hydrogen atom, an aryl group, an alkyl group or a cycloalkyl group;
R represents a monovalent organic group;
when B is —N(Rx)—, R and Rx may be bonded to each other to form a ring; and
$R_1$ represents a monovalent organic group.

16. The positive resist composition for immersion exposure of claim 15,
wherein the compound (B) satisfies either the requirements for both (Ba) and (Bc), or the requirements for both (Bb) and (Bc), where the compound (Ba) is:
(Ba) a sulfonium salt compound having in its cation part an alkyl or cycloalkyl residue which has 2 or more carbon atoms and has not been substituted by fluorine, and the compound (Bb) is:
(Bb) a sulfonium salt compound having in its cation part a fluorine-substituted alkyl or cycloalkyl residue having 1 or more carbon atoms.

17. The positive resist composition for immersion exposure of claim 15, wherein the resin (A) has a repeating unit having a group which is dissociable with an acid and is represented by general formula (I):

(I)

wherein
$R_1$ to $R_3$ each independently represents an alkyl group, a cycloalkyl group, or an alkenyl group, and at least two of $R_1$ to $R_3$ may be bonded to each other to form a ring.

18. The positive resist composition for liquid immersion exposure of claim 15, wherein a content of the compound (B) is from 1 to 7% by mass in a total solid content of the positive resist composition.

19. The positive resist composition for liquid immersion exposure of claim 15, further comprising a nitrogen-containing compound (Ca) which has no oxygen atom.

20. The positive resist composition for liquid immersion exposure of claim 15, further comprising a fluorochemical nonionic surfactant (Da).

* * * * *